(12) United States Patent
Honda

(10) Patent No.: US 12,068,722 B2
(45) Date of Patent: Aug. 20, 2024

(54) POWER AMPLIFICATION CIRCUIT AND SEMICONDUCTOR DEVICE

(71) Applicant: Murata Manufacturing Co., Ltd., Kyoto (JP)

(72) Inventor: Yuri Honda, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 635 days.

(21) Appl. No.: 17/377,710

(22) Filed: Jul. 16, 2021

(65) Prior Publication Data
US 2022/0021352 A1 Jan. 20, 2022

(30) Foreign Application Priority Data

Jul. 17, 2020 (JP) .................................. 2020-123198
Jan. 28, 2021 (JP) .................................. 2021-012213

(51) Int. Cl.
*H03F 1/02* (2006.01)
*H03F 1/56* (2006.01)
*H03F 3/45* (2006.01)

(52) U.S. Cl.
CPC ........... *H03F 1/565* (2013.01); *H03F 1/0205* (2013.01); *H03F 3/45475* (2013.01); *H03F 2200/222* (2013.01); *H03F 2200/387* (2013.01)

(58) Field of Classification Search
CPC ........................................................ H03F 1/565
USPC ........................................................ 330/252
See application file for complete search history.

(56) References Cited

U.S. PATENT DOCUMENTS 10,411,660 B1 9/2019 Ortiz et al.

*Primary Examiner* — Andrea Lindgren Baltzell
*Assistant Examiner* — Jose E Pinero
(74) *Attorney, Agent, or Firm* — Pearne & Gordon LLP

(57) ABSTRACT

A power amplification circuit includes a first amplifier that amplifies a signal split from an input signal, a second amplifier that amplifies a signal having a different phase from the aforementioned signal, third and fourth amplifiers, and a matching network. The matching network includes a first wiring having a first end connected to an output terminal of the first amplifier and a second end connected to an input terminal of the third amplifier, a second wiring having a first end connected to the input terminal of the third amplifier, and electromagnetically coupled to the first wiring, a third wiring having a first end connected to an output terminal of the second amplifier and a second end connected to an input terminal of the fourth amplifier, and a fourth wiring having a first end connected to the input terminal of the fourth amplifier, and electromagnetically coupled to the third wiring.

17 Claims, 31 Drawing Sheets

POWER AMPLIFICATION CIRCUIT AND SEMICONDUCTOR DEVICE

CROSS REFERENCE TO RELATED APPLICATION

This application claims priority from Japanese Patent Application No. 2020-123198 filed on Jul. 17, 2020 and Japanese Patent Application No. 2021-012213 filed on Jan. 28, 2021. The contents of these applications are incorporated herein by reference in its entirety.

BACKGROUND OF THE DISCLOSURE

1. Field of the Disclosure

The present disclosure relates to a power amplification circuit and a semiconductor device.

2. Description of the Related Art

There are differential amplification circuits in which a single-ended signal (unbalanced signal) is converted into a pair of differential signals (balanced signals) by a transformer, and the differential signals are amplified by two amplifiers (for example, see U.S. patent Ser. No. 10/411,660). FIG. 31 illustrates the general configuration of a differential amplification circuit, which is disclosed as a technology of the related art in U.S. patent Ser. No. 10/411,660. In a differential amplification circuit 72 illustrated in FIG. 31, capacitors 58, 98, and 102 and an input transformer T2 are provided between an input amplifier 60 and a positive-side amplifier 20 and a negative-side amplifier 26.

The input transformer T2 includes a primary winding 46 and a secondary winding 48. The primary winding 46 has a first end 54 that is connected to a power supply node VCC1 and a second end 56 that is connected to a signal output terminal 62 of the input amplifier 60. The capacitor 58 is connected between the first end 54 and the second end 56 of the primary winding 46. The capacitor 102 is connected between the first end 54 of the primary winding 46 and ground.

The secondary winding 48 has a first end 50 that is connected to a first signal input terminal 22 of the positive-side amplifier 20 and a second end 52 that is connected to a second signal input terminal 28 of the negative-side amplifier 26. The capacitor 98, the capacitance of which is adjusted by a controller, is connected between the first signal input terminal 22 and the second signal input terminal 28.

In the differential amplification circuit 72 disclosed in U.S. patent Ser. No. 10/411,660, the circuit located between the input amplifier 60, the positive-side amplifier 20, and the negative-side amplifier 26 is an interstage matching network that matches the impedance between the input amplifier 60 and the positive-side amplifier 20 and negative-side amplifier 26.

The interstage matching network disclosed in U.S. patent Ser. No. 10/411,660 transmits a signal outputted from the input amplifier 60 to the positive-side amplifier 20 and the negative-side amplifier 26 while suppressing the power loss. However, the interstage matching network disclosed in U.S. patent Ser. No. 10/411,660 may cause the frequency band across which the impedance between the input amplifier 60 and the positive-side amplifier 20 and negative-side amplifier 26 can be well matched to become narrower. In this case, when a signal is transmitted from the input amplifier 60 to the positive-side amplifier 20 and the negative-side amplifier 26, the power loss of the signal will increase depending on the frequency of the signal.

BRIEF SUMMARY OF THE DISCLOSURE

The present disclosure was made in light of the above-described circumstances and it is an object of the present disclosure to provide a power amplification circuit and a semiconductor device that amplify signals across a wide frequency range while suppressing the power loss in a configuration in which a matching network is provided between input-side amplifiers and output-side amplifiers.

A power amplification circuit according to an aspect of the present disclosure includes: a first amplifier that is inputted with a first signal, which is split from an input signal, and that has an output terminal that outputs a first amplified signal obtained by amplifying the first signal; a second amplifier that is inputted with a second signal, which is split from the input signal and has a different phase from the first signal, and that has an output terminal that outputs a second amplified signal obtained by amplifying the second signal; a third amplifier that has an input terminal to which the first amplified signal is inputted and that amplifies the first amplified signal and outputs a third amplified signal; a fourth amplifier that has an input terminal to which the second amplified signal is inputted and that amplifies the second amplified signal and outputs a fourth amplified signal; and a matching network that allows the first amplified signal and the second amplified signal to pass between the first amplifier and the second amplifier and the third amplifier and the fourth amplifier. The matching network includes a first wiring that has a first end that is connected to the output terminal of the first amplifier and a second end that is connected to the input terminal of the third amplifier, a second wiring that has a first end that is connected to the output terminal of the second amplifier and a second end that is connected to the input terminal of the fourth amplifier, and a current-induction wiring section. The current-induction wiring section includes a low impedance node, a third wiring that is connected to the low impedance node and is electromagnetically coupled to the first wiring, and a fourth wiring that is connected to the low impedance node and is electromagnetically coupled to the second wiring, and the current-induction wiring section is connected between the second end of the first wiring and the second end of the second wiring.

According to the present disclosure, there can be provided a power amplification circuit and a semiconductor device that amplify signals over a wide frequency range while suppressing the power loss in a configuration in which a matching network is provided between input-side amplifiers and output-side amplifiers. Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
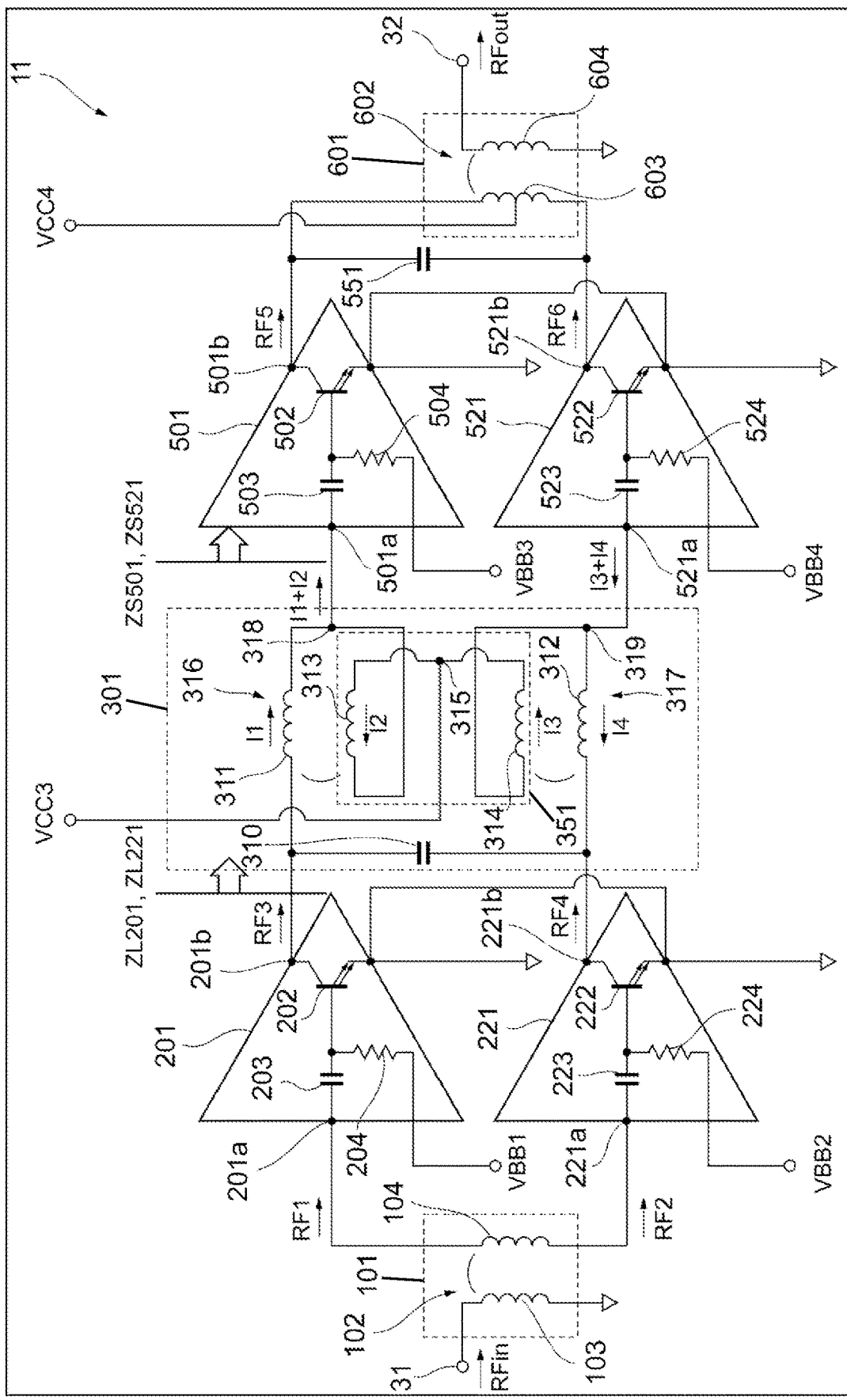
FIG. 1 is a circuit diagram of a power amplification circuit according to a First Embodiment of the present disclosure.

Hereafter, embodiments of the present disclosure will be described in detail while referring to the drawings. In addition, identical elements will be denoted by identical symbols and repeated description thereof will be omitted as much as possible.

First Embodiment

A semiconductor device 1 and a power amplification circuit 11 according to a First Embodiment will be described. FIG. 1 is a circuit diagram of the power amplification circuit 11 according to the First Embodiment of the present disclosure. The semiconductor device 1 includes the power amplification circuit 11. The semiconductor device 1 is, for example, a semiconductor chip in which the power amplification circuit 11 is formed. The power amplification circuit 11 is a circuit that amplifies an input signal (radio-frequency signal) RFin and outputs an output signal (amplified signal) RFout. The power amplification circuit 11 includes a power splitter 101, an amplifier 201 (first amplifier) and an amplifier 221 (second amplifier), an interstage matching network 301, an amplifier 501 (third amplifier) and an amplifier 521 (fourth amplifier), a capacitor 551, and a power combiner 601. The amplifiers 201 and 221 form a first stage (driver stage) differential pair. The amplifiers 501 and 521 form an output stage (power stage) differential pair. The amplifier 221 has substantially the same input/output characteristics as the amplifier 201. The amplifier 521 has substantially the same input/output characteristics as the amplifier 501.

In this embodiment, the amplifiers 201, 221, 501, and 521 are described as being formed of bipolar transistors such as heterojunction bipolar transistors (HBTs), for example. However, the amplifiers 201, 221, 501, and 521 may instead be formed of another type of transistor such as metal-oxide-semiconductor field-effect transistors (MOSFETs). In this case, the "base", the "collector", and the "emitter" should be respectively read as the "gate", the "drain", and the "source".

The power splitter 101 is inputted with the input signal RFin via an input terminal 31 and splits the input signal RFin into a signal RF1 (first signal) and a signal RF2 (second signal), which have different phases from each other. In this embodiment, the phase of the signal RF1 and the phase of the signal RF2 differ by 180°. The power splitter 101 supplies the signals RF1 and RF2 to the amplifiers 201 and 221, respectively.

Specifically, the power splitter 101 includes a transformer 102 that has a primary-side winding (inductor) 103 and a secondary-side winding (inductor) 104. The primary-side winding 103 has a first end that is connected to the input terminal 31 and a second end that is grounded. The secondary-side winding 104 has a first end that is connected to the amplifier 201 and a second end that is connected to the amplifier 221, and the secondary-side winding 104 is electromagnetically coupled to the primary-side winding 103.

The input signal RFin is inputted to the first end of the primary-side winding 103 from the input terminal 31, and the signals RF1 and RF2 are respectively generated at the first end and the second end of the secondary-side winding 104, which is electromagnetically coupled to the primary-side winding 103. The phase difference between the signal RF1 and the signal RF2 is 180°. Note that the phase difference may be shifted from 180° due to unequal wiring lengths in the circuit and so forth.

The amplifier 201 has an input terminal 201a that is connected to the first end of the secondary-side winding 104 and to which the signal RF1 is inputted, and an output terminal 201b from which an amplified signal RF3 (first amplified signal), which is generated by the signal RF1 being amplified by the amplifier 201, is outputted.

In more detail, the amplifier 201 further includes a transistor 202, a capacitor 203, and a resistance element 204. The capacitor 203 has a first end that is connected to the input terminal 201a and a second end. The resistance element 204 has a first end to which a bias voltage VBB1 is supplied and a second end that is connected to the second end of the capacitor 203. The transistor 202 has a collector that is connected to the output terminal 201b, a base that is connected to the second end of the capacitor 203 and the second end of the resistance element 204, and a common emitter.

The amplifier 221 has an input terminal 221a that is connected to the second end of the secondary-side winding 104 and to which the signal RF2 is inputted and an output terminal 221b from which an amplified signal RF4 (second amplified signal), which is generated by the signal RF2 being amplified by the amplifier 221, is outputted.

In more detail, the amplifier 221 further includes a transistor 222, a capacitor 223, and a resistance element 224. The capacitor 223 has a first end that is connected to the input terminal 221a and a second end. The resistance element 224 has a first end to which a bias voltage VBB2 is supplied and a second end that is connected to the second end of the capacitor 223. The transistor 222 has a collector that is connected to the output terminal 221b, a base that is connected to the second end of the capacitor 223 and the second end of the resistance element 224, and a common emitter.

In this embodiment, the emitter of the transistor 202 of the amplifier 201 and the emitter of the transistor 222 of the amplifier 221 are connected to each other. As a result, an imaginary short is generated between the emitter of the transistor 202 and the emitter of the transistor 222, and this enables the gain of the first-stage differential pair to be increased.

The interstage matching network 301 is a circuit that matches the impedance between the amplifiers 201 and 221 and the amplifiers 501 and 521 (hereafter, also referred to as between the differential pairs) and allows the amplified signals RF3 and RF4 to pass between the differential pairs. In more detail, the interstage matching network 301 includes a capacitor 310, transformers 316 and 317, and a power supply node 315 (low impedance node). The power supply node 315 is a node that appears as a virtual ground when differential operation is performed. Therefore, the power supply node 315 is a node that appears to have a low impedance at frequencies that are odd-numbered multiples of the frequencies of the amplified signals RF3 and RF4.

The capacitor 310 has a first end that is connected to the output terminal 201b of the amplifier 201 and a second end that is connected to the output terminal 221b of the amplifier 221. The transformer 316 includes a winding 311 (first wiring) and a winding 313 (third wiring). The transformer 317 includes a winding 312 (second wiring) and a winding 314 (fourth wiring). A current-induction wiring section 351 includes the power supply node 315 and the windings 313 and 314. The power supply node 315 is provided between the winding 313 and the winding 314. The current-induction wiring section 351 is connected between a node 318 (first node) and a node 319 (second node).

The winding 311 of the transformer 316 has a first end that is connected to the output terminal 201b of the amplifier 201 and the first end of the capacitor 310 and a second end that is connected to the node 318.

The winding 313 has a first end that is connected to the node 318 and a second end that is connected to the power supply node 315, and the winding 313 is electromagnetically coupled to the winding 311. Here, the winding 311 has an inductance that is greater than or equal to the inductance of the winding 313. A power supply voltage VCC3 of the amplifiers 201 and 221 is supplied to the power supply node 315. The power supply node 315 is a low impedance node and is a node that is grounded for AC currents.

The winding 312 of the transformer 317 has a first end that is connected to the output terminal 221b of the amplifier 221 and the second end of the capacitor 310 and a second end that is connected to the node 319. The winding 314 has a first end that is connected to the node 319 and a second end that is connected to the power supply node 315, and the winding 314 is electromagnetically coupled to the winding 312.

Here, the winding 312 has substantially the same inductance as the winding 311. The winding 314 has substantially the same inductance as the winding 313. Furthermore, the electromagnetic coupling between the winding 312 and the winding 314 is substantially the same as the electromagnetic coupling between the winding 311 and the winding 313. In other words, the transformer 317 has substantially the same characteristics as the transformer 316.

A Ruthroff-type matching network is formed by the transformers 316 and 317.

The amplifier 501 has an input terminal 501a, which is connected to the node 318, and an output terminal 501b. The amplified signal RF3, which has passed through the interstage matching network 301, is inputted to the input terminal 501a. The output terminal 501b outputs an amplified signal RF5 (third amplified signal), which is generated by amplifying the amplified signal RF3.

In more detail, the amplifier 501 further includes a transistor 502 (amplifying element), a capacitor 503, and a resistance element 504. The capacitor 503 has a first end that is connected to the input terminal 501a and a second end. The resistance element 504 has a first end to which a bias voltage VBB3 is supplied and a second end that is connected to the second end of the capacitor 503. The transistor 502 has a collector that is connected to the output terminal 501b, a base that is connected to the second end of the capacitor 503 and the second end of the resistance element 504, and a common emitter. Note that the transistor 502 is not limited to being a bipolar transistor and may instead be a field-effect transistor. In this case, the collector would be replaced with a drain, the emitter with a source, and the base with a gate.

A configuration has been described in which the amplifier 501 includes a single transistor cell that includes the transistor 502, the capacitor 503, and the resistance element 504, but the amplifier 501 is not limited to this configuration. A configuration may be used in which the amplifier 501 includes a plurality of transistor cells and in which the plurality of transistor cells are connected in parallel with each other.

The amplifier 521 has an input terminal 521a, which is connected to the node 319, and an output terminal 521b. The amplified signal RF4, which has passed through the interstage matching network 301, is inputted to the input terminal 521a. The output terminal 521b outputs an amplified signal RF6 (fourth amplified signal), which is generated by amplifying the amplified signal RF4.

In more detail, the amplifier 521 further includes a transistor 522 (amplifying element), a capacitor 523, and a resistance element 524. The capacitor 523 has a first end that is connected to the input terminal 521a and a second end. The resistance element 524 has a first end to which a bias voltage VBB4 is supplied and a second end that is connected to the second end of the capacitor 523. The transistor 522 has a collector that is connected to the output terminal 521b, a base that is connected to the second end of the capacitor 523 and the second end of the resistance element 524, and a common emitter. Note that the transistor 522 is not limited to being a bipolar transistor and may instead be a field-effect transistor. In this case, the collector would be replaced with a drain, the emitter with a source, and the base with a gate.

A configuration has been described in which the amplifier 521 includes a single transistor cell that includes the transistor 522, the capacitor 523, and the resistance element 524, but the amplifier 521 is not limited to this configuration. A configuration may be used in which the amplifier 521 includes a plurality of transistor cells and in which the plurality of transistor cells are connected in parallel with each other.

In this embodiment, the emitter of the transistor 502 of the amplifier 501 and the emitter of the transistor 522 of the amplifier 521 are connected to each other. As a result, an imaginary short is generated between the emitter of the transistor 502 and the emitter of the transistor 522 and this enables the gain of the output-stage differential pair to be increased.

The capacitor 551 has a first end that is connected to the output terminal 501b of the amplifier 501 and a second end that is connected to the output terminal 521b of the amplifier 521. The capacitor 551 adjusts the load impedance of the amplifiers 501 and 521 together with the power combiner 601.

The power combiner 601 combines the amplified signals RF5 and RF6 and outputs the output signal RFout, which is an amplified signal of the input signal RFin.

Specifically, the power combiner 601 includes a transformer 602 that has a primary-side winding (inductor) 603 and a secondary-side winding (inductor) 604. The primary-side winding 603 has a first end that is connected to the output terminal 501b of the amplifier 501 and the first end of the capacitor 551, a neutral point to which a power supply voltage VCC4 of the amplifiers 501 and 521 is supplied, and a second end that is connected to the output terminal 521b of the amplifier 521 and the second end of the capacitor 551. The secondary-side winding 604 has a first end that is connected to an output terminal 32 and a second end that is grounded, and the secondary-side winding 604 is electromagnetically coupled to the primary-side winding 603.

Since the phase difference between the amplified signal RF5 inputted to the first end of the primary-side winding 603 and the amplified signal RF6 inputted to the second end of the primary-side winding 603 is 180°, a voltage having an amplitude that is twice that of the signal inputted to the first end of the primary-side winding 603 is applied to the primary-side winding 603. On the basis of this voltage, the output signal RFout is generated at the first end of the secondary-side winding 604, which is electromagnetically coupled to the primary-side winding 603, and power is combined.

Simulation

Next, simulation of an impedance ZL201 seen when looking the amplifier 501 from the output terminal 201b of the amplifier 201 will be described. In addition, since an impedance ZL221 seen when looking at the amplifier 521 from the output terminal 221b of the amplifier 221 is substantially the same as the impedance ZL201, the description of the impedance ZL221 will be omitted here.

The inventors simulated frequency variations of the impedance ZL201 while using the capacitance of the capacitor 310 and the inductances of the windings 311, 312, 313, and 314 included in the interstage matching network 301 as parameters. The inventors optimized the parameters so that the impedance ZL201 had a real constant value in a frequency range from 1.7 GHz to 2.7 GHz.

Figure 2:
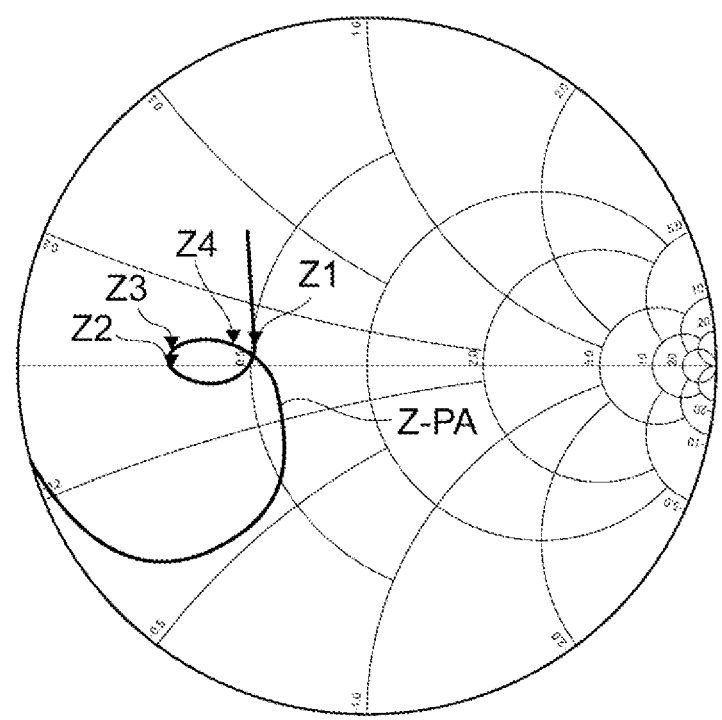
FIG. 2 is a diagram illustrating an example of frequency variations of an impedance in the power amplification circuit according to the First Embodiment of the present disclosure.

FIG. 2 is a diagram illustrating an example of the frequency variations of the impedance ZL201 in the power amplification circuit 11 according to the First Embodiment of the present disclosure. In FIG. 2, a change curve Z-PA of the impedance ZL201 calculated on the basis of the optimized parameters when the frequency was varied from 1.5 GHz to 6.7 GHz is illustrated on a Smith chart. The change curve Z-PA is a curve obtained when the impedance ZL201 is divided by a characteristic impedance Z0 of 6Ω.

The symbols Z1, Z2, Z3, and Z4 located along the change curve Z-PA indicate the values of the impedance ZL201 when the frequency is 1.7 GHz, 2.1 GHz, 2.3 GHz, and 2.7 GHz, respectively. Thus, the symbols Z1, Z2, Z3, and Z4 are gathered at a single point on the real number axis, and therefore the frequency variations of the impedance ZL201 are well suppressed.

Figure 3:
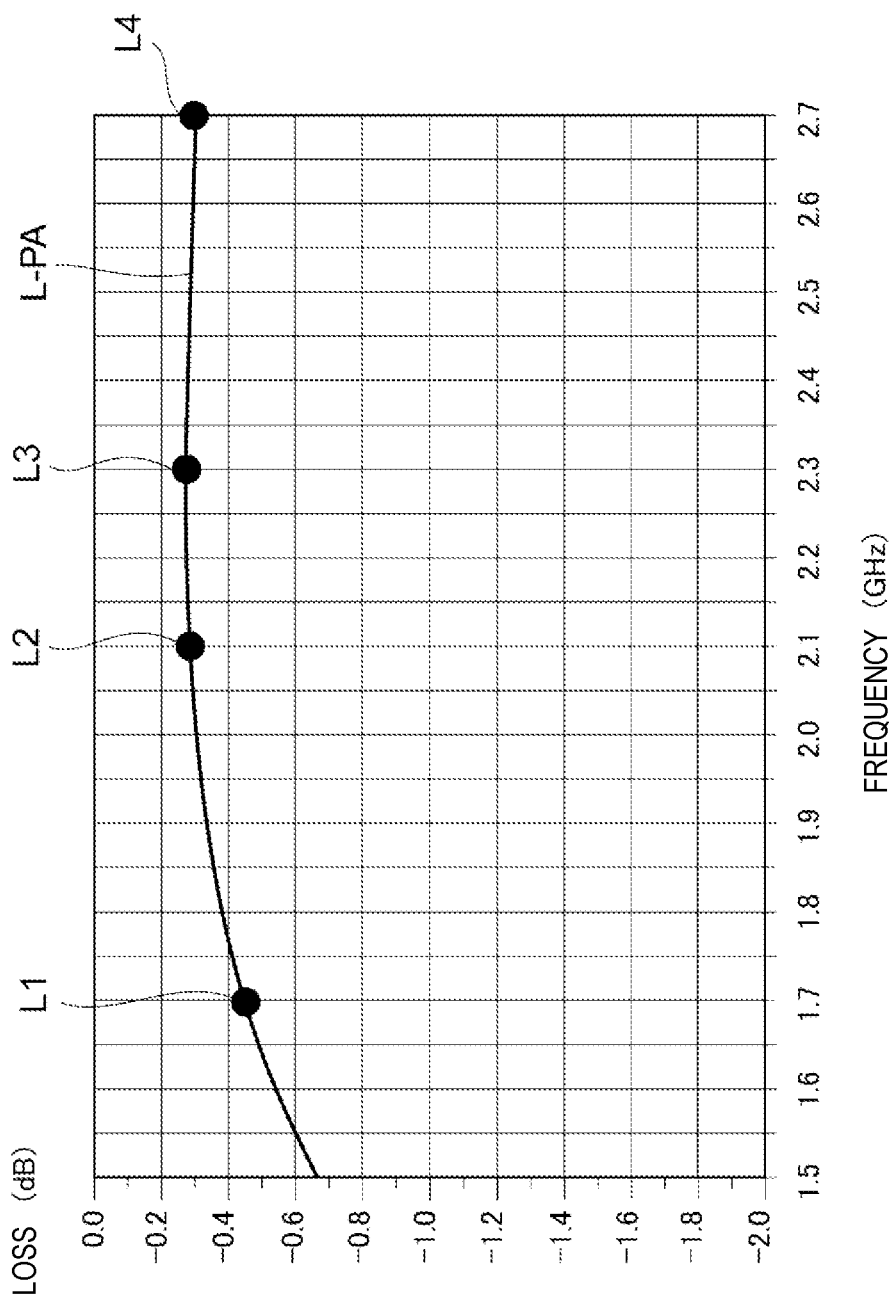
FIG. 3 is a diagram illustrating an example of frequency variations of loss in the power amplification circuit according to the First Embodiment of the present disclosure.

The inventors also simulated loss that occurs from the output terminal 201b of the amplifier 201 to the input terminal 501a of the amplifier 501 in the power amplification circuit 11. FIG. 3 is a diagram illustrating an example of frequency variations of loss in the power amplification circuit 11 according to the First Embodiment of the present disclosure. In FIG. 3, the horizontal axis represents frequency in units of "GHz" and the vertical axis represents loss in units of "dB".

FIG. 3 illustrates a loss curve L-PA calculated on the basis of the optimized parameters when the frequency is varied from 1.5 GHz to 2.7 GHz. Losses L1, L2, L3, and L4 along the loss curve L-PA are losses obtained when the frequency is 1.7 GHz, 2.1 GHz, 2.3 GHz, and 2.7 GHz, respectively.

Thus, in the power amplification circuit 11, the loss lies in a range from −0.43 dB to −0.27 dB in the frequency range from 1.7 GHz to 2.7 GHz, and loss in the interstage matching network 301 can be well suppressed.

Operational Effects

To simplify the description of the operational effects, it is assumed that the interstage matching network 301 does not include the capacitor 310. In other words, it is assumed that the interstage matching network 301 includes only the transformers 316 and 317. As illustrated in FIG. 1, for example, when a current I1 flowing in the winding 311 in a direction from the first end to the second end of the winding 311 increases, a current I2 is induced in the winding 313 in a direction from the second end to the first end of the winding 313 due to the electromagnetic coupling between the winding 313 and the winding 311. The currents I1 and I2 flow into the node 318, and therefore a current (I1+I2) flows in a direction from the node 318 to amplifier 501 according to Kirchhoff's First Law (law of current continuity).

On the other hand, since the phase difference between the signal RF1 and the signal RF2 is 180°, for example, a current I4 flowing in the winding 312 in the direction from the second end to the first end of the winding 312 increases. At this time, a current I3 is induced in the winding 314 in the direction from the first end to the second end of the winding 314 due to the electromagnetic coupling between the winding 314 and the winding 312. The currents I3 and I4 flow out from the node 319, and therefore a current (I3+I4) flows in a direction from the amplifier 521 to the node 319 according to Kirchhoff's First Law (law of current continuity).

Here, the size of the current I4 is substantially identical to that of the current I1. The size of the current I3 is substantially identical to that of the current I2. In this case, the current I3 flowing into the power supply node 315 becomes the current I2.

For example, if there is no loss in the interstage matching network 301, the power at the output terminal 201b of the amplifier 201 and the power at the input terminal 501a of the amplifier 501 are identical, and therefore the following Formula (1) holds true.

$$ZL201 \times I1^2 = ZS501 \times (I1 + I2)^2 \quad (1)$$
$$ZL201 = ZS501 \times \left(\frac{I1 + I2}{I1}\right)^2$$

Here, an impedance ZS501 is the impedance seen when looking at the output terminal 32 from the input terminal 501a of the amplifier 501.

Generally, the input impedance of the amplifier 501 of the output stage (power stage) will be smaller than the output load impedance of the amplifier 201 of the first stage (driver stage). Therefore, the impedance ZL201 can be adjusted to be an impedance corresponding to the output load impedance by appropriately setting the mutual inductance between the winding 311 and the winding 313 on the basis of the number of turns of the winding 311 and the number of turns of the winding 313 and so forth and by changing the ratio between the size of the current I1 and the size of the current I2. For the windings 312 and 314 as well, the impedance ZL221 can be adjusted to an impedance corresponding to the output load impedance by changing the ratio between the size of the current I4 and the size of the current I3 as with the windings 311 and 313. This enables the impedance between the differential pairs to be matched.

In addition, in the case where the inductances of the windings 311, 312, 313, and 314 are large, Formula (1) holds true regardless of the frequency. In other words, when the inductances of the windings 311, 312, 313, and 314 are large, the transformers 316 and 317 are able to match the impedances between the differential pairs over a wide range of frequencies even when the capacitor 310 is not included in the interstage matching network 301.

However, for example, when the power amplification circuit 11 is formed on a semiconductor chip, the size of each of the windings 311, 312, 313, and 314 is reduced and therefore the inductance of each winding becomes smaller. Therefore, the frequency range over which the impedances between the differential pairs are well matched by the transformers 316 and 317 may become narrower. Regarding this situation, the frequency range over which the impedances between the differential pairs is well matched by the interstage matching network 301 can be increased even when the inductance of each winding is small by connecting the capacitor 310 between the amplifiers 201 and 221 and the transformers 316 and 317.

Layout

Next, an example of the layout of the transformers 316 and 317 in the semiconductor device 1 according to the First Embodiment will be described. An x axis, a y axis, and a z axis may be illustrated in the drawings. The x axis, the y axis, and the z axis form a right-handed three-dimensional orthogonal coordinate system. Hereafter, the direction indicated by the z-axis arrow is referred to as a positive z-axis side and the direction opposite to that arrow is referred to as a negative z-axis side, and the same applies to the other axes. In addition, the positive z-axis side and the negative z-axis side may also be referred to as "upper side" or "above" and "lower side" or "below" and so forth. Here, when looking from the above to below, a clockwise direction of rotation is defined as a clockwise direction cw. In addition, when looking from the above to below, a counter clockwise direction of rotation is defined as a counter clockwise direction ccw.

Figure 4:
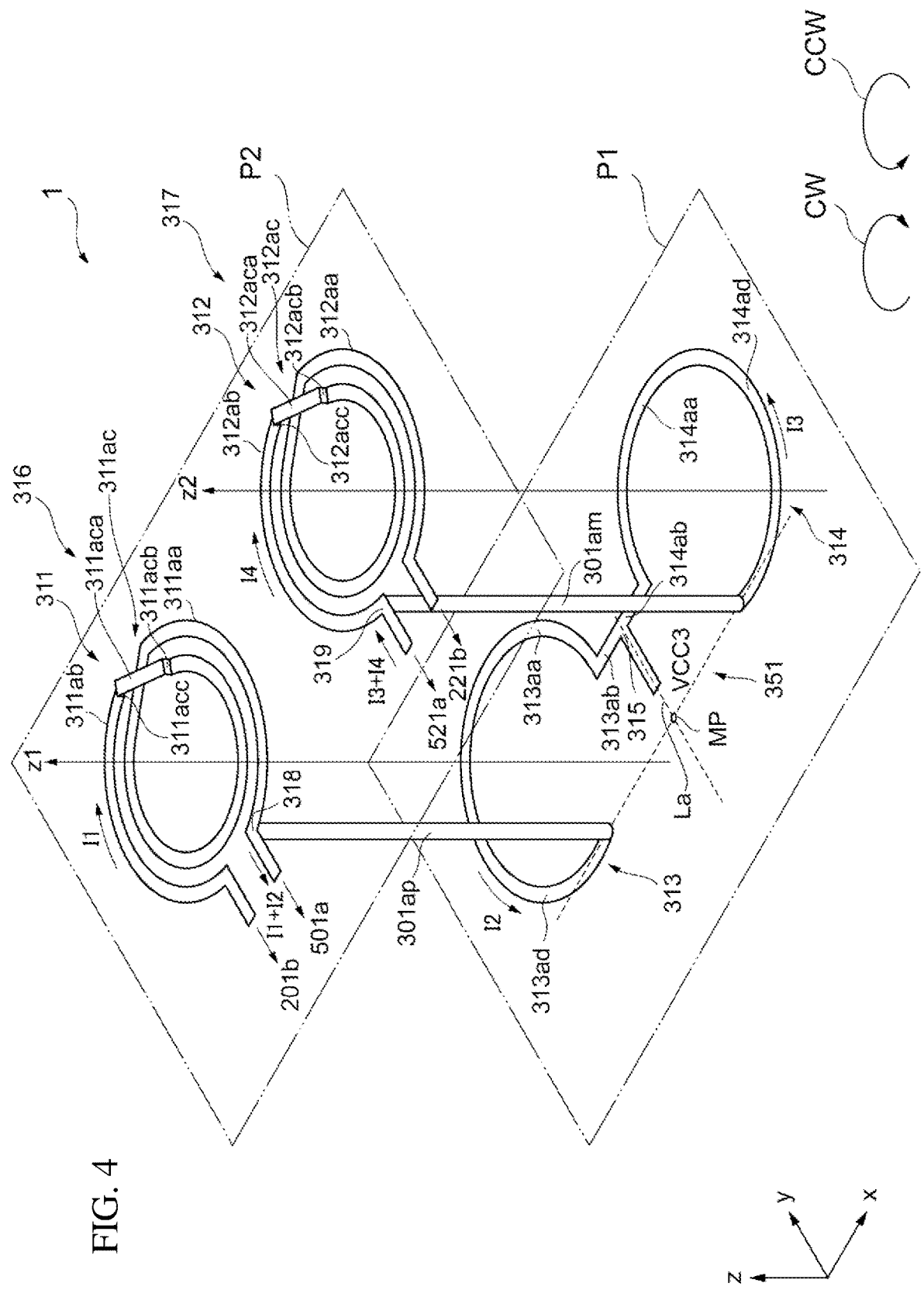
FIG. 4 is a perspective view schematically illustrating an example of the layout of transformers according to the First Embodiment of the present disclosure.

FIG. 4 is a perspective view schematically illustrating an example of the layout of the transformers 316 and 317 according to the First Embodiment of the present disclosure.

As illustrated in FIG. 4, the semiconductor device 1 has, for example, a first layer (not illustrated) having a plane P1 (first plane) that is substantially parallel to the xy plane, a second layer (not illustrated) having a plane P2 that is substantially parallel to the plane P1 and is located on the positive z-axis side (upper side) of the plane P1, and a third layer having a plane (not illustrated, hereafter may be referred to as an upper plane) that is substantially parallel to the plane P2 and located on the positive z-axis side (upper side) of the plane P2.

The windings 311 and 312 are mainly formed on the plane P2. The winding 311 is mainly wound on the plane P2 substantially twice around a z1 axis that is substantially parallel to the z axis. In this embodiment, the winding 311 includes winding portions 311aa and 311ab formed on the plane P2 and a connection portion 311ac. The connection portion 311ac includes a crossing portion 311aca formed on an upper plane (not illustrated) that is located above the plane P2 and interlayer vias 311acb and 311acc. The winding portion 311aa has a first end, which is the node 318, and a second end, and is wound around the z1 axis through substantially one and a half turns in the counter clockwise direction ccw while moving closer to the z1 axis from the first end to the second end. The winding portion 311ab has a first end, which is connected to the output terminal 201b, and a second end, and is wound around the negative x-axis side of the winding portion 311aa in the clockwise direction cw through substantially 180° from the first end to the second end. The connection portion 311ac connects the second end of the winding portion 311aa and the second end of the winding portion 311ab to each other in such a way that a short circuit does not occur at the part thereof that crosses the winding portion 311aa. In more detail, a short circuit between the crossing portion 311aca and the winding portion 311aa is prevented by forming the crossing portion 311aca on an upper plane that is different from the plane P2 on which the winding portion 311aa is formed. The two ends of the crossing portion 311aca are connected to the second end of the winding portion 311aa and the second end of the winding portion 311ab through the interlayer vias 311acb and 311acc.

The winding 312 has substantially the same shape as the winding 311 and is located on the positive x-axis of the winding 311. Specifically, the winding 312 is wound substantially twice around an x2 axis that is substantially parallel to the z axis and is located on the positive x-axis side of the z1 axis, and includes winding portions 312aa and 312ab, which are formed on the plane P2, and a connection portion 312ac. The connection portion 312ac includes a crossing portion 312aca formed on an upper plane (not illustrated) and interlayer vias 312acb and 312acc. The winding portion 312aa has a first end, which is connected to the output terminal 221b, and a second end, and is wound around the z2 axis through substantially one and a half turns in the counter clockwise direction ccw while moving closer to the z2 axis from the first end to the second end. The winding portion 312ab has a first end, which is the node 319, and a second end, and is wound around the negative x-axis side of the winding portion 312aa in the clockwise direction cw through substantially 180° from the first end to the second end. The connection portion 312ac connects the second end of the winding portion 312aa and the second end of the winding portion 312ab to each other in such a way that a short circuit does not occur at a part thereof that crosses the winding portion 312aa. In more detail, a short circuit between the crossing portion 312aca and the winding portion 312aa is prevented by forming the crossing portion 312aca on an upper plane that is different from the plane P2 on which the winding portion 312aa is formed. The two ends of the crossing portion 312aca are connected to the second end of the winding portion 312aa and the second end of the winding portion 312ab through the interlayer vias 312acb and 312acc.

Figure 5:
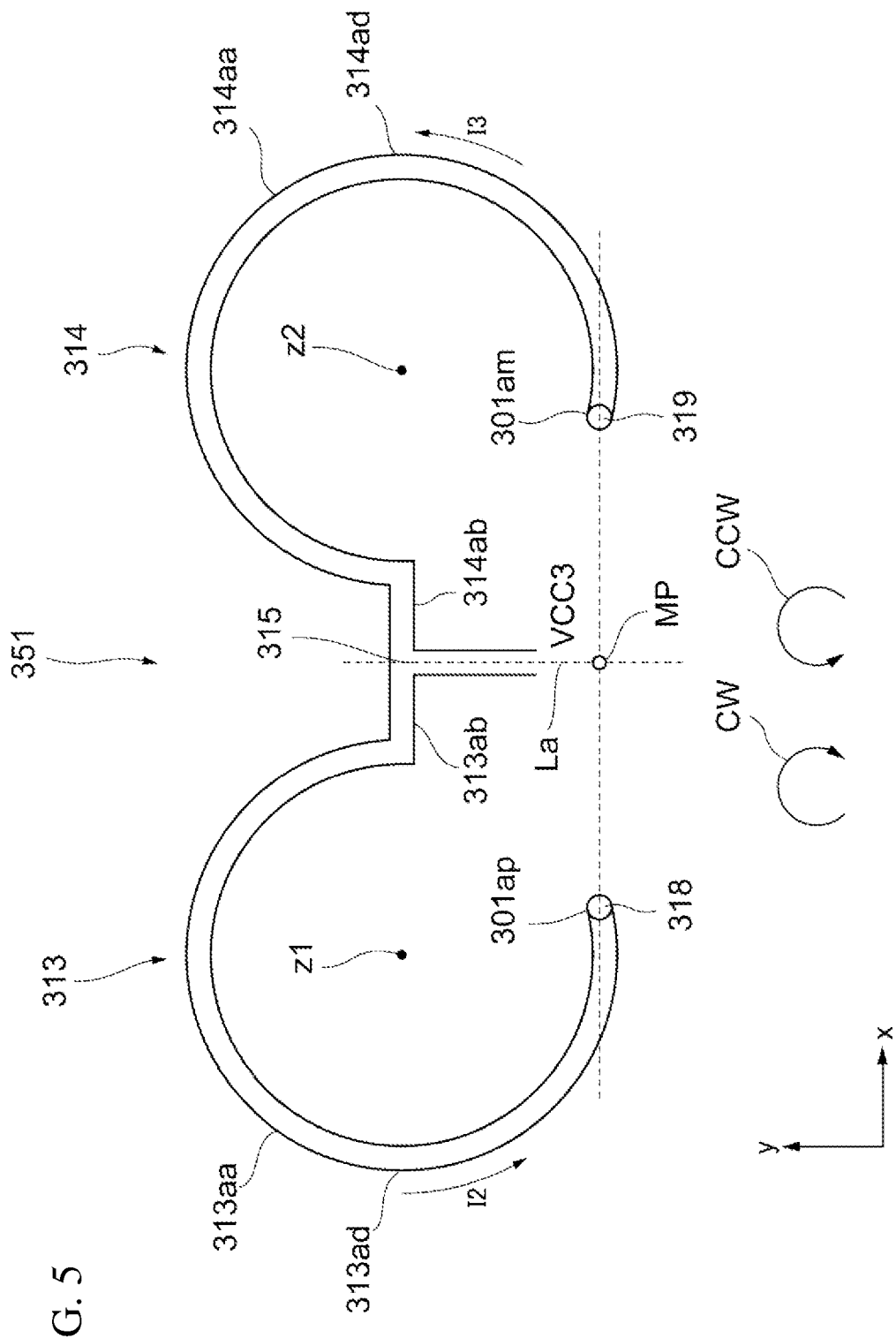
FIG. 5 is a plan view of windings illustrated in FIG. 4 from above.

FIG. 5 is a plan view of the windings 313 and 314 illustrated in FIG. 4 from seen from above. As illustrated in FIGS. 4 and 5, the current-induction wiring section 351 is formed on the plane P1. When the plane P1 is viewed in plan view, the windings 313 and 314 respectively include curved parts 313ad and 314ad that curve away from each other.

Furthermore, when the plane P1 is viewed in plan view, a line La that passes through a midpoint MP between the nodes 318 and 319 and the power supply node 315 does not intersect the winding 313 or 314 except for at the power supply node 315. In addition, when the plane P1 is viewed in plan view, the winding 313 and the winding 314 are substantially symmetrical with each other about the line La. Note that although the power supply node is connected at the midpoint MP, the power supply node is not necessarily exactly at the midpoint and may be shifted from the midpoint due to manufacturing variations. In addition, the midpoint MP does not have to be a point located equidistant from the nodes 318 and 319 along a line connecting the nodes 318 and 319. Specifically, the midpoint MP may be, for example, a point located at a distance of 30% or less the length of the winding 313 or 314 from a point that is located equidistant from the nodes 318 and 319 on the line connecting the nodes 318 and 319.

Specifically, the winding 313 includes a winding portion 313aa and a connection portion 313ab, and is located below the winding 311. In this embodiment, the winding portion 313aa has a first end, which is connected to the node 318 through an interlayer via 301ap that is substantially parallel to the z axis, and a second end. The winding portion 313aa is wound around the z1 axis in the clockwise direction cw from the first end to the second end through more than 180° and less than 360°. The winding portion 313aa includes the curved part 313ad, which curves toward the negative x-axis side. The connection portion 313ab extends substantially parallel to the x axis and connects the second end of the winding portion 313aa and the power supply node 315 to each other.

The winding 314 includes a winding portion 314aa and a connection portion 314ab, and is located below the winding 312. The winding portion 314aa is shaped so as to be substantially symmetrical with the winding portion 313aa about the line La when the plane P1 is viewed in plan view. Specifically, the winding portion 314aa has a first end, which is connected to the node 319 through an interlayer via 301am that is substantially parallel to the z axis, and a second end, and is wound around the z2 axis in the counter clockwise direction ccw through more than 180° and less than 360° from the first end to the second end. The winding portion 314aa includes the curved part 314ad, which curves toward the positive x-axis side. The connection portion 314ab is shaped so as to be substantially symmetrical with the connection portion 313ab about the line La when the plane P1 is viewed in plan view and connects the second end of the winding portion 314aa and the power supply node 315.

Operational Effects

In general, a differential amplification circuit is able to operate in an ideal state if the input/output characteristics of the path that amplifies one signal out of the differential signals and the input/output characteristics of the path that amplifies the other signal out of the differential signals are balanced with each other in the differential amplification circuit.

For example, in a configuration where an interstage matching network is provided between the driver-stage differential pair and the power-stage differential pair, if the interstage matching network has an asymmetrical structure due to manufacturing constraints such as limitations on the arrangement space, the gain or output may be degraded with respect to the ideal input/output characteristics or the distortion characteristics may be degraded due to a mismatch (imbalance) in load impedance.

In contrast, in the semiconductor device 1, since the interstage matching network 301 of the power amplification circuit 11 has a symmetrical structure (refer to FIGS. 4 and 5), the input/output characteristics when the signal RF1 is amplified to generate the amplified signal RF5 (hereafter, may also be referred to as positive-side input/output characteristics) and the input/output characteristics when the signal RF2 is amplified to generate the amplified signal RF6 (hereafter, may also be referred to as negative-side input/output characteristics) can be made more and more identical in terms of gain and phase. This makes it possible to bring the power amplification circuit 11 closer to being an ideal differential amplification circuit and suppress the degradation of the distortion characteristics. Furthermore, the impedance between the differential pairs can be matched using the ratio of impedances expressed by Formula (1).

In addition, if the output of the power amplification circuit 11 is to be increased, a plurality of transistor cells can be connected in parallel in the amplifiers 501 and 521. With this configuration, the impedances ZS501 and ZS521 become lower. Here, the impedance ZS521 is the impedance seen when looking at the output terminal 32 from the input terminal 521a of the amplifier 521.

Therefore, if the interstage matching network has an asymmetrical structure, the asymmetric structure may result in the transformed impedances ZL201 and ZL221 becoming unbalanced and in the positive and negative input/output characteristics becoming unbalanced.

In contrast, in the power amplification circuit 11, since the interstage matching network 301 has a symmetrical structure (refer to FIGS. 4 and 5), the positive-side input/output characteristics and the negative-side input/output characteristics can be balanced. Furthermore, the impedance between the differential pairs can be matched using the ratio of impedances expressed in Formula (1) while more ideally balancing the positive-side input/output characteristics and the negative-side input/output characteristics by appropriately adjusting the mutual inductance between the winding 311 and the winding 313 and the mutual inductance between the winding 312 and the winding 314.

Second Embodiment

A power amplification circuit 12 according to a Second Embodiment will be described. In the Second Embodiment and embodiments thereafter, the description of matters common to the First Embodiment will be omitted and only the differences will be described. In particular, the same operational effects resulting from the same configurations will not be repeatedly described in the individual embodiments.

Figure 6:
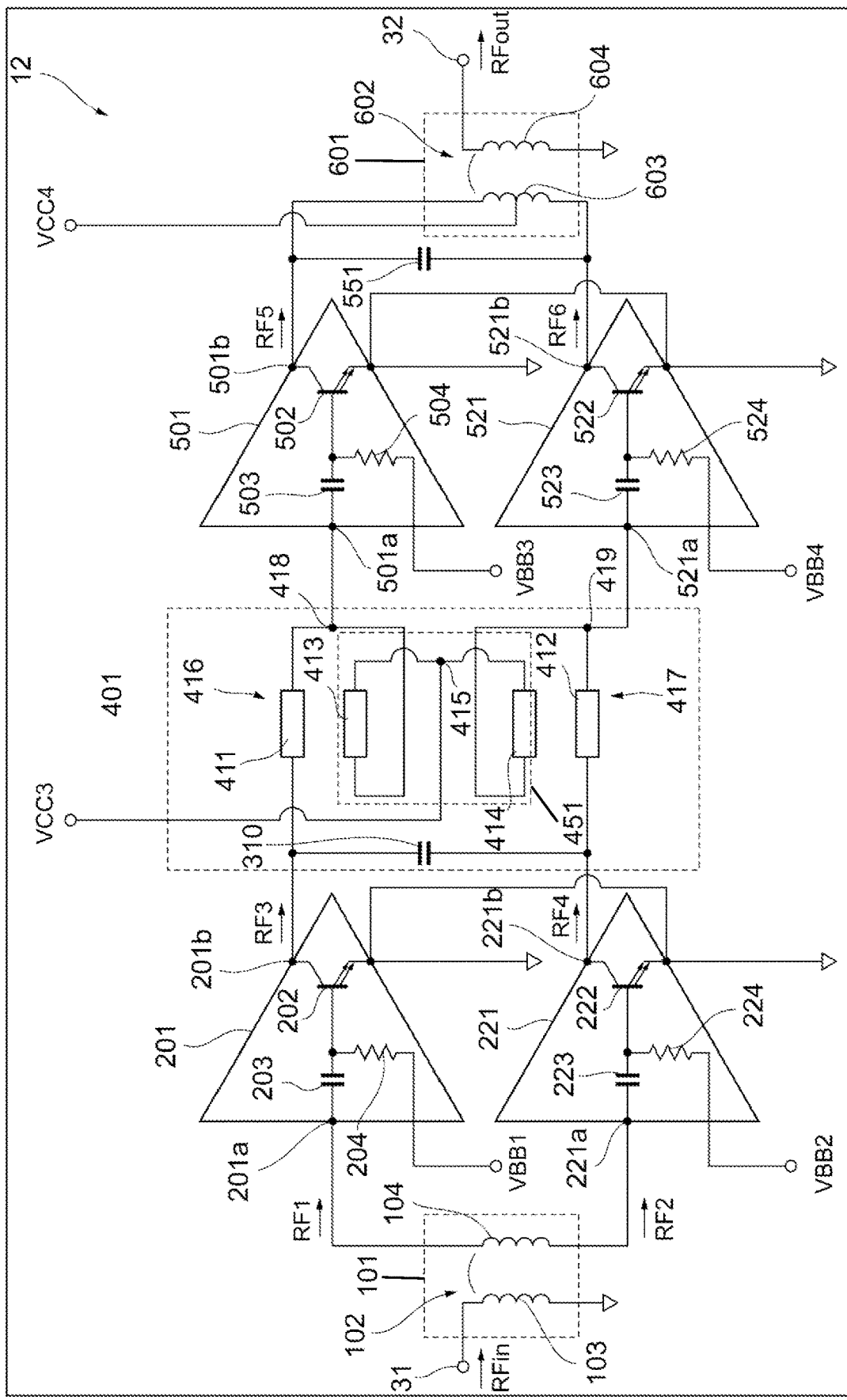
FIG. 6 is a circuit diagram of a power amplification circuit according to a Second Embodiment of the present disclosure.

FIG. 6 is a circuit diagram of the power amplification circuit 12 according to the Second Embodiment of the present disclosure. As illustrated in FIG. 6, the power amplification circuit 12 according to the Second Embodiment differs from the power amplification circuit 11 according to the First Embodiment in that the power amplification circuit 12 includes an interstage matching network 401 instead of the interstage matching network 301.

The interstage matching network 401 is a circuit that matches the impedance between the differential pairs and allows the amplified signals RF3 and RF4 to pass between the differential pairs. In more detail, the interstage matching network 401 includes the capacitor 310, coupled lines 416 and 417, and a power supply node 415 (low impedance node).

As described above, the capacitor 310 has a first end that is connected to the output terminal 201b of the amplifier 201 and a second end that is connected to the output terminal 221b of the amplifier 221. The coupled lines 416 include a transmission line 411 (first wiring) and a transmission line 413 (third wiring). The coupled lines 417 includes a transmission line 412 (second wiring) and a transmission line 414 (fourth wiring). A current-induction wiring section 451 includes the power supply node 415 and the transmission lines 413 and 414. The power supply node 415 is provided between the transmission line 413 and the transmission line 414. The current-induction wiring section 451 is connected between a node 418 (first node) and a node 419 (second node).

The transmission line 411 of the coupled lines 416 has a first end that is connected to the output terminal 201b of the amplifier 201 and the first end of the capacitor 310 and a second end that is connected to the node 418.

The transmission line 413 has a first end that is connected to the node 418 and a second end that is connected to the power supply node 415, and is electromagnetically coupled to the transmission line 411. In other words, the transmission lines 411 and 413 are line-to-line coupled with each other. The node 418 is connected to the input terminal 501a of the amplifier 501. The power supply voltage VCC3 of the amplifiers 201 and 221 is supplied to the power supply node 415.

The transmission line 412 of the coupled lines 417 has a first end that is connected to the output terminal 221b of the amplifier 221 and the second end of the capacitor 310 and a second end that is connected to the node 419. The transmission line 414 has a first end that is connected to the node 419 and a second end that is connected to the power supply node 415, and is electromagnetically coupled to the transmission line 412. In other words, the transmission lines 412 and 414 are line-to-line coupled with each other. The node 419 is connected to the input terminal 521a of the amplifier 521.

Here, the differential impedance between transmission line 413 and transmission line 411 is substantially the same as the differential impedance between transmission line 414 and transmission line 412. The electrical length of the transmission line 413 and the electrical length of the transmission line 411 are substantially the same as the electrical length of the transmission line 414 and the electrical length of the transmission line 412, respectively. In addition, the electromagnetic coupling between the transmission line 413 and the transmission line 411 is substantially the same as the electromagnetic coupling between the transmission line 414 and the transmission line 412. In other words, the coupled lines 417 have substantially the same characteristics as the coupled lines 416. The coupled lines 416 and 417 form a Ruthroff-type matching network.

Third Embodiment

Figure 7:
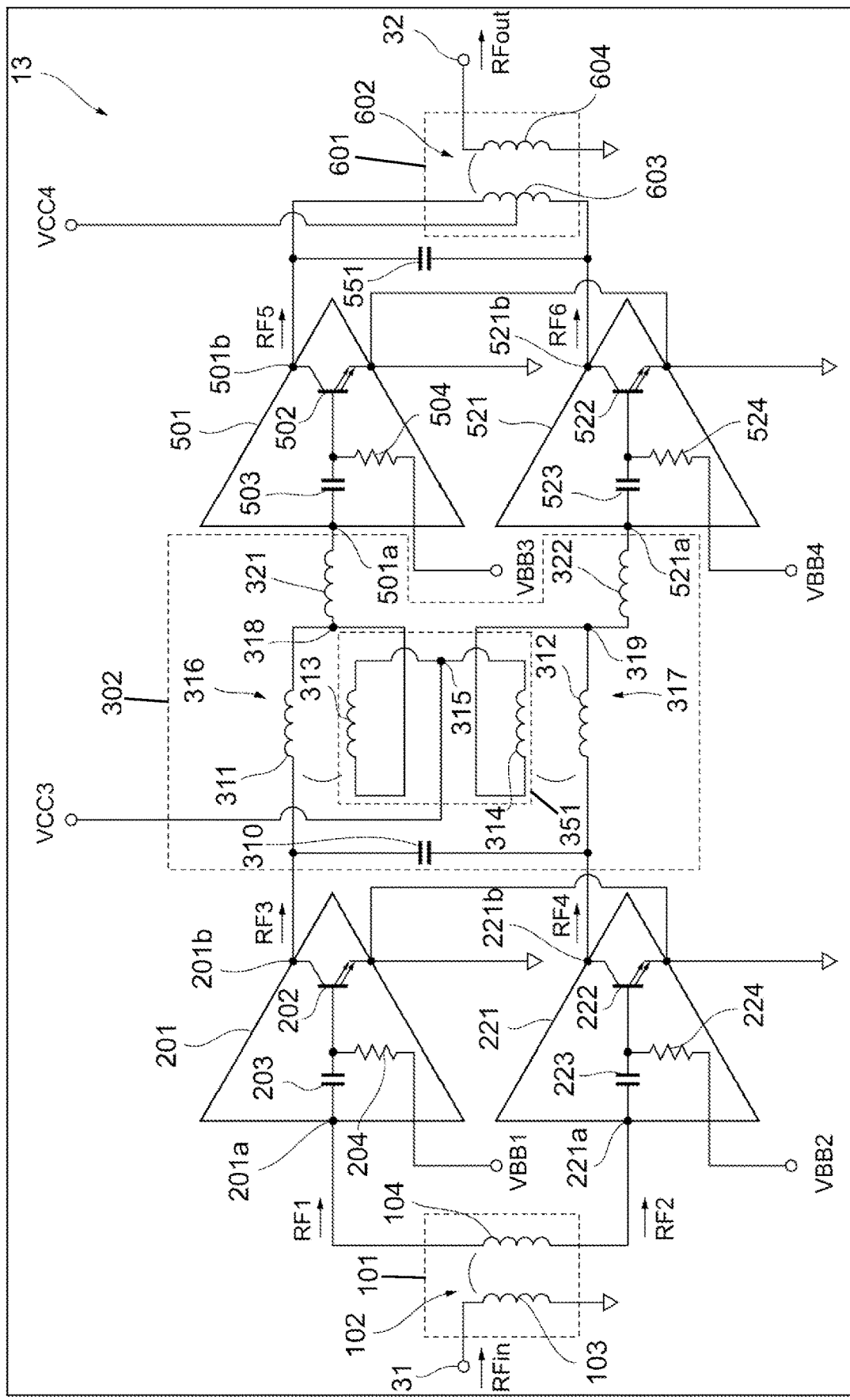
FIG. 7 is a circuit diagram of a power amplification circuit according to a Third Embodiment of the present disclosure.

A power amplification circuit 13 according to a Third Embodiment will be described. FIG. 7 is a circuit diagram of the power amplification circuit 13 according to the Third Embodiment of the present disclosure. As illustrated in FIG. 7, the power amplification circuit 13 according to the Third Embodiment differs from the power amplification circuit 11 according to the First Embodiment in that the power amplification circuit 13 includes an interstage matching network 302 instead of the interstage matching network 301. Compared to the interstage matching network 301 illustrated in FIG. 1, the interstage matching network 302 further includes a winding 321 (first inductor) and a winding 322 (second inductor).

The winding 321 has a first end that is connected to the node 318 and a second end that is connected to the input terminal 501a of the amplifier 501. The winding 322 has a first end that is connected to the node 319 and a second end that is connected to the input terminal 521a of the amplifier 521.

With the configuration in which the windings 321 and 322 are provided between the transformers 316 and 317 and the amplifiers 501 and 521 in this way, changes in impedance caused by the capacitors 503 and 523 respectively included in the amplifiers 501 and 521 can be canceled out by the windings 321 and 322. This enables frequency deviations of the load impedances of the amplifiers 201 and 221 to be reduced.

Fourth Embodiment

Figure 8:
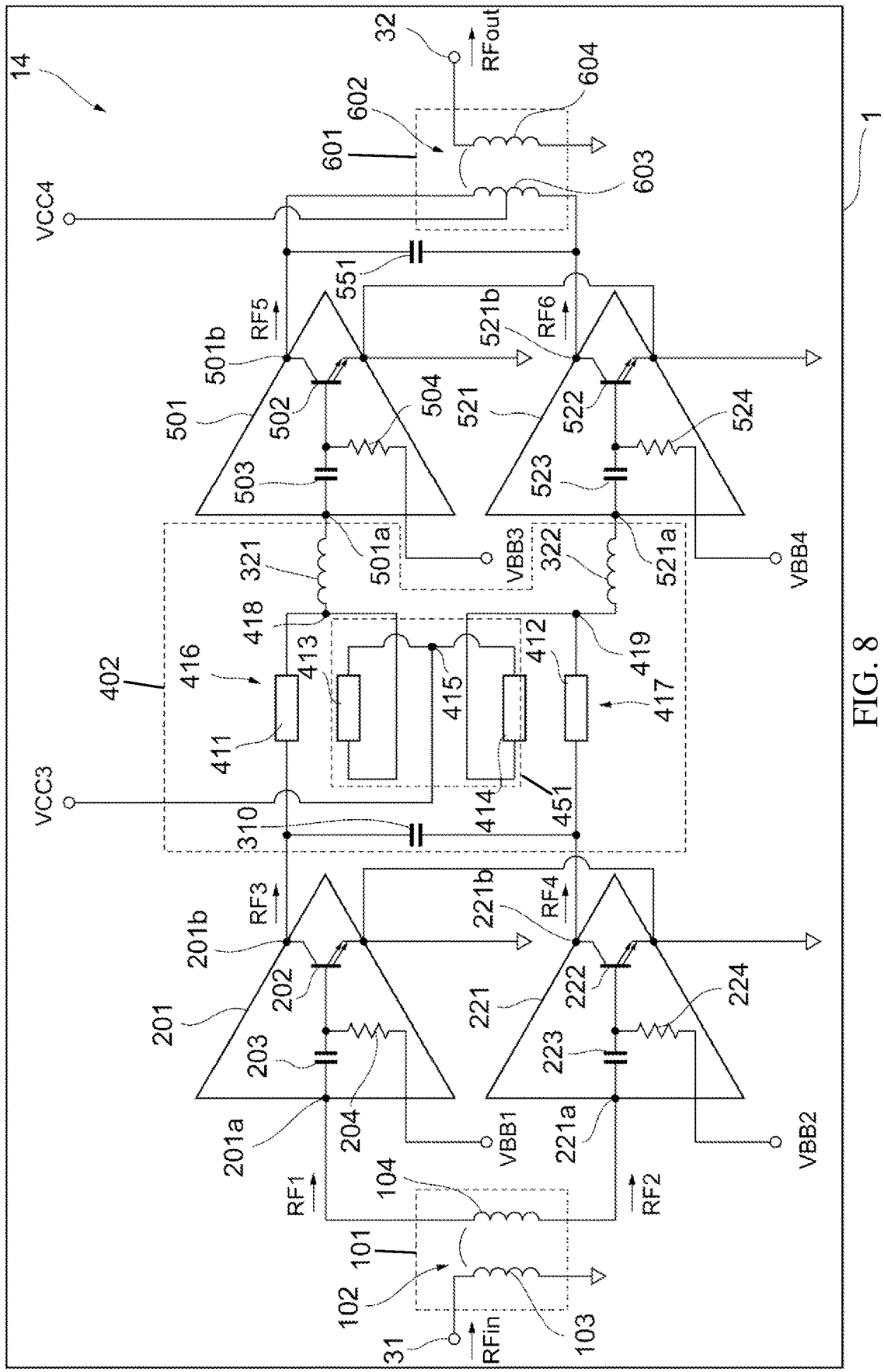
FIG. 8 is a circuit diagram of a power amplification circuit according to a Fourth Embodiment of the present disclosure.

A power amplification circuit 14 according to a Fourth Embodiment will be described. FIG. 8 is a circuit diagram of the power amplification circuit 14 according to the Fourth Embodiment of the present disclosure. As illustrated in FIG. 8, the power amplification circuit 14 according to the Fourth Embodiment differs from the power amplification circuit 12 according to the Second Embodiment in that the power amplification circuit 14 includes an interstage matching network 402 instead of the interstage matching network 401. Compared to the interstage matching network 401 illustrated in FIG. 6, the interstage matching network 402 further includes a winding 321 (first inductor) and a winding 322 (second inductor).

The winding 321 has a first end that is connected to the node 418 and a second end that is connected to the input terminal 501a of the amplifier 501. The winding 322 has a first end that is connected to the node 419 and a second end that is connected to the input terminal 521a of the amplifier 521.

With the configuration in which the windings 321 and 322 are provided between the coupled lines 416 and 417 and the amplifiers 501 and 521 in this way, changes in impedance caused by the capacitors 503 and 523 respectively included in the amplifiers 501 and 521 can be canceled out by the windings 321 and 322. This enables frequency deviations of the load impedances of the amplifiers 201 and 221 to be reduced.

Fifth Embodiment

Figure 9:
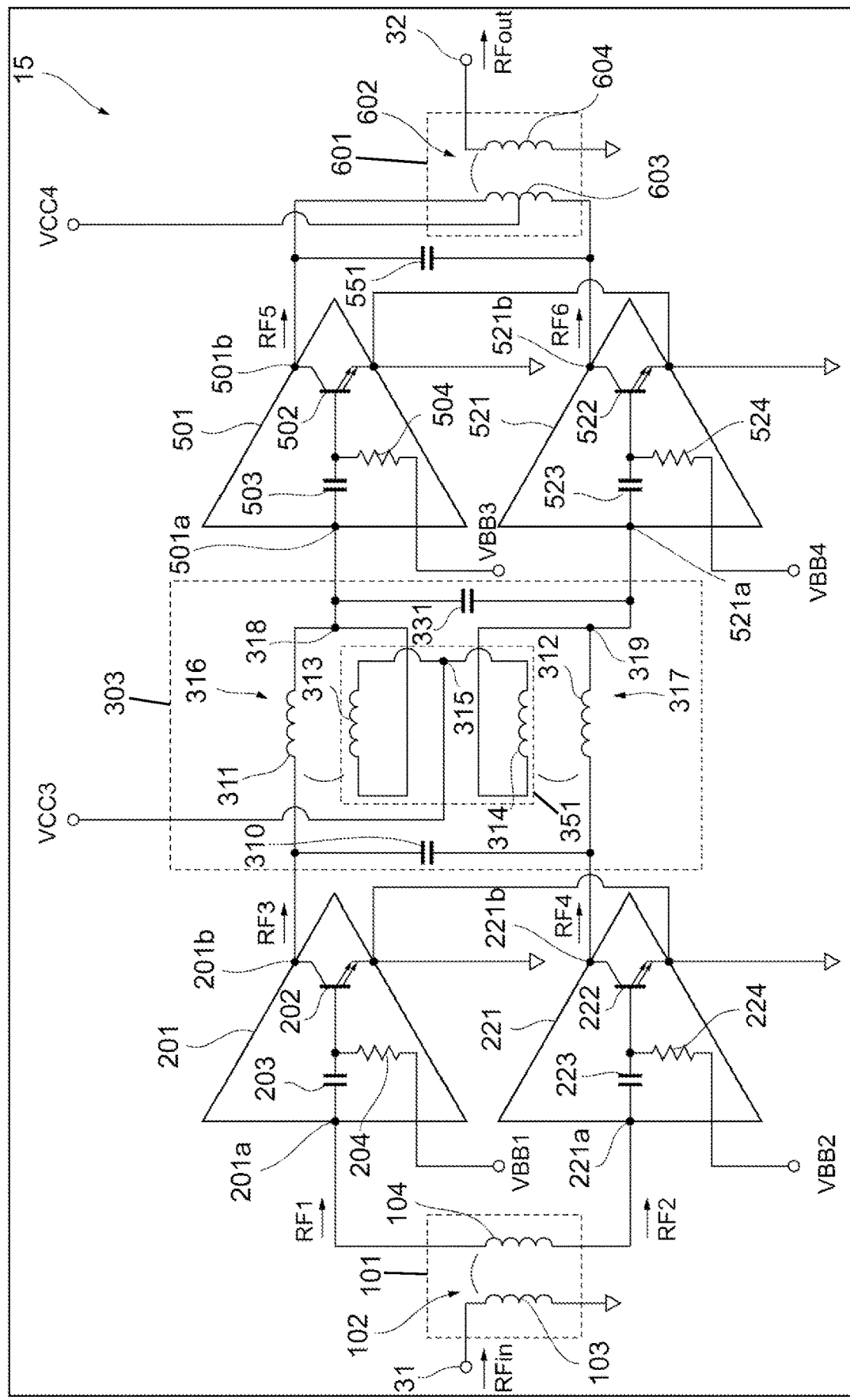
FIG. 9 is a circuit diagram of a power amplification circuit according to a Fifth Embodiment of the present disclosure.

A power amplification circuit 15 according to a Fifth Embodiment will be described. FIG. 9 is a circuit diagram of the power amplification circuit 15 according to the Fifth Embodiment of the present disclosure. As illustrated in FIG. 9, the power amplification circuit 15 according to the Fifth Embodiment differs from the power amplification circuit 11 according to the First Embodiment in that the power amplification circuit 15 includes an interstage matching network 303 instead of the interstage matching network 301. Compared to the interstage matching network 301 illustrated in FIG. 1, the interstage matching network 303 further includes a capacitor 331 (second capacitor).

The capacitor 331 has a first end that is connected to the node 318 and the input terminal 501a of the amplifier 501 and a second end that is connected to the node 319 and the input terminal 521a of the amplifier 521.

In order to adjust the load impedances of the amplifiers 201 and 221 as desired, it is necessary to change the ratio between the inductance of the winding 311 and the inductance of the winding 313 and the ratio between the inductance of the winding 312 and the inductance of the winding 314. At this time, the imaginary parts of the load impedances of amplifiers 201 and 221 can be adjusted by providing the capacitor 331 in parallel with the series circuit consisting of the windings 313 and 314.

Sixth Embodiment

Figure 10:
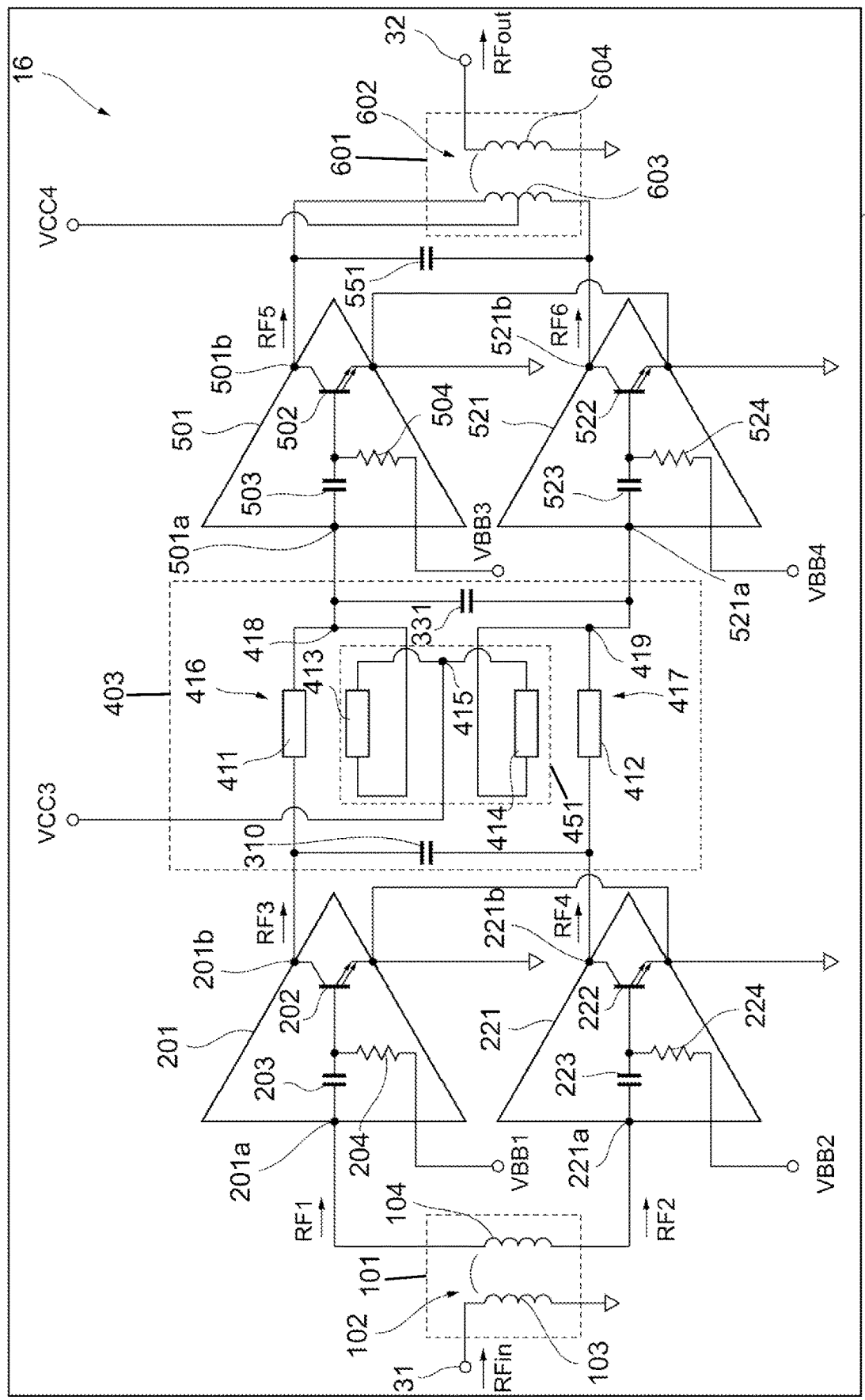
FIG. 10 is a circuit diagram of a power amplification circuit according to a Sixth Embodiment of the present disclosure.

A power amplification circuit 16 according to a Sixth Embodiment will be described. FIG. 10 is a circuit diagram of the power amplification circuit 16 according to a Sixth Embodiment of the present disclosure. As illustrated in FIG. 10, the power amplification circuit 16 according to the Sixth Embodiment differs from the power amplification circuit 12 according to the Second Embodiment in that the power amplification circuit 16 includes an interstage matching network 403 instead of the interstage matching network 401. Compared to the interstage matching network 401 illustrated in FIG. 6, the interstage matching network 403 further includes a capacitor 331 (second capacitor).

The capacitor 331 has a first end that is connected to the node 418 and the input terminal 501a of the amplifier 501 and a second end that is connected to the node 419 and the input terminal 521a of the amplifier 521.

In order to adjust the load impedances of the amplifiers 201 and 221 as desired, it is necessary to change the ratio between the inductance of the transmission line 411 and the inductance of the transmission line 412 and the ratio between the inductance of the transmission line 413 and the inductance of the transmission line 414. At this time, the imaginary parts of the load impedances of amplifiers 201 and 221 can be adjusted by providing, in addition to the series circuit consisting of the transmission lines 412 and 414, the capacitor 331 in parallel with the series circuit.

Seventh Embodiment

Figure 11:
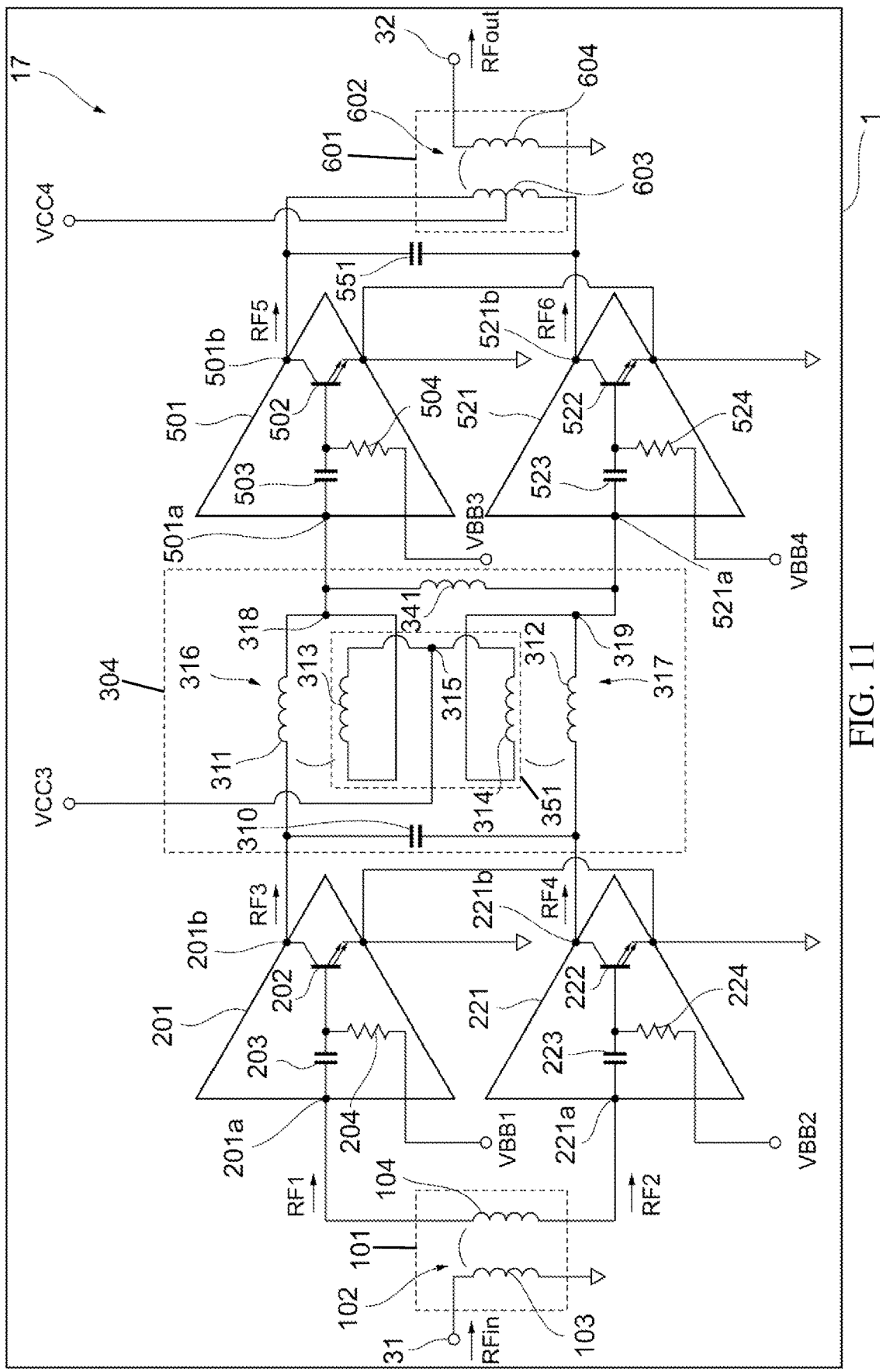
FIG. 11 is a circuit diagram of a power amplification circuit according to a Seventh Embodiment of the present disclosure.

A power amplification circuit 17 according to a Seventh Embodiment will be described. FIG. 11 is a circuit diagram of a power amplification circuit according to a Seventh Embodiment of the present disclosure. As illustrated in FIG. 11, the power amplification circuit 17 according to the Seventh Embodiment differs from the power amplification circuit 11 according to the First Embodiment in that the power amplification circuit 17 includes an interstage matching network 304 instead of the interstage matching network 301. Compared to the interstage matching network 301 illustrated in FIG. 1, the interstage matching network 304 further includes a winding 341 (third inductor).

The winding 341 has a first end that is connected to the node 318 and the input terminal 501a of the amplifier 501 and a second end that is connected to the node 319 and the input terminal 521a of the amplifier 521.

By providing the winding 341 in this way, changes in the imaginary parts of impedances caused by the capacitors 503 and 523 respectively included in the amplifiers 501 and 521 can be adjusted using the inductance of the winding 341. This enables frequency deviations of the load impedances of the amplifiers 201 and 221 to be reduced.

Eighth Embodiment

Figure 12:
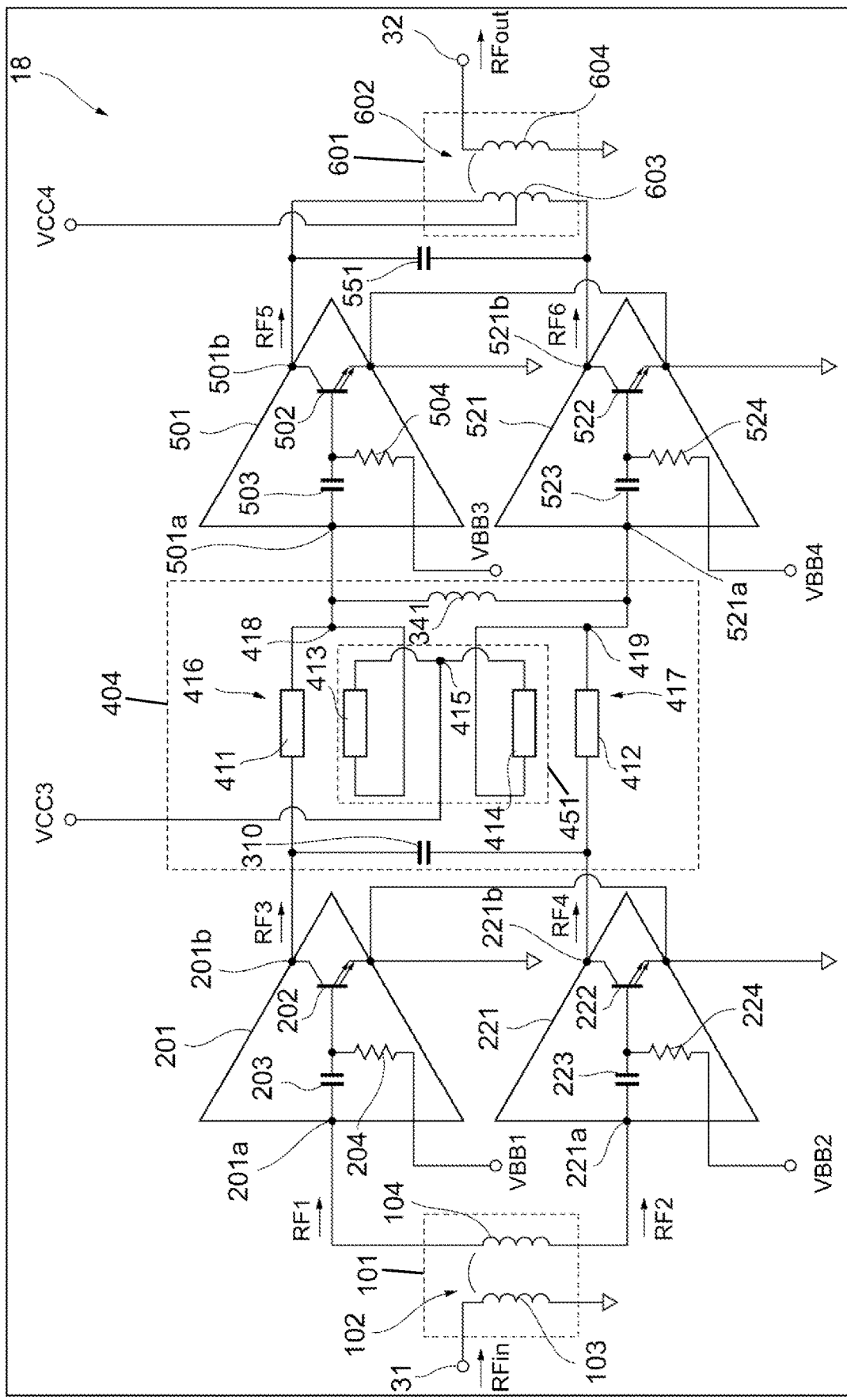
FIG. 12 is a circuit diagram of a power amplification circuit according to an Eighth Embodiment of the present disclosure.

A power amplification circuit 18 according to an Eighth Embodiment will be described. FIG. 12 is a circuit diagram of the power amplification circuit 18 according to the Eighth Embodiment of the present disclosure. As illustrated in FIG. 12, the power amplification circuit 18 according to the Eighth Embodiment differs from the power amplification circuit 12 according to the Second Embodiment in that the power amplification circuit 18 includes an interstage matching network 404 instead of the interstage matching network 401. Compared to the interstage matching network 401 illustrated in FIG. 6, the interstage matching network 404 further includes a winding 341 (third inductor).

The winding 341 has a first end that is connected to the node 418 and the input terminal 501a of the amplifier 501 and a second end that is connected to the node 419 and the input terminal 521a of the amplifier 521.

By providing the winding 341 in this way, changes in the imaginary parts of impedances caused by the capacitors 503 and 523 respectively included in the amplifiers 501 and 521 can be adjusted using the inductance of the winding 341. This enables frequency deviations of the load impedances of the amplifiers 201 and 221 to be reduced.

Reference Example

Figure 13:
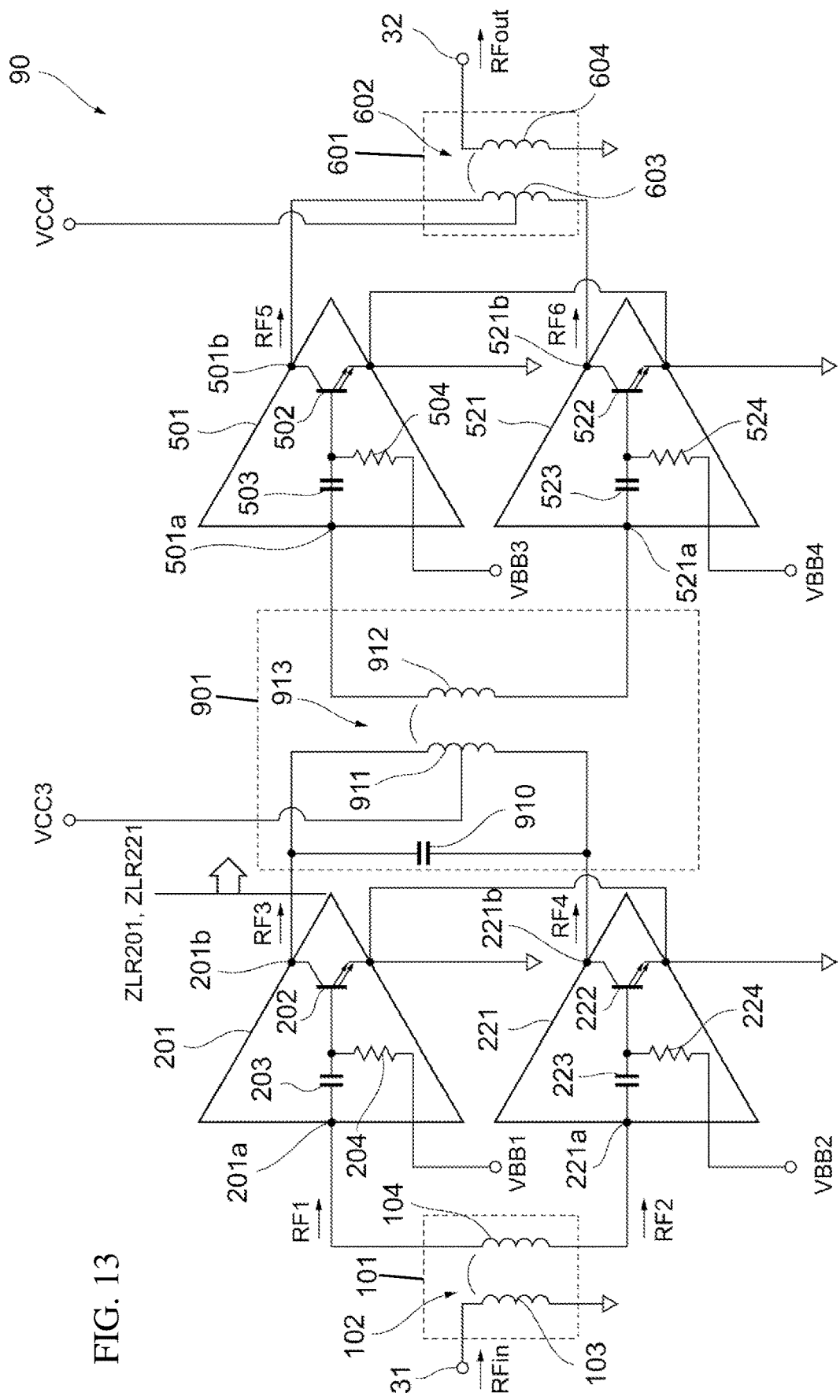
FIG. 13 is a circuit diagram of a power amplification circuit according to a reference example.

Next, a power amplification circuit 90 according to a reference example will be described. FIG. 13 is a circuit diagram of a power amplification circuit according to a reference example. As illustrated in FIG. 13, the power amplification circuit 90 according to the reference example differs from the power amplification circuit 11 according to the First Embodiment in that the power amplification circuit 90 includes an interstage matching network 901 instead of the interstage matching network 301 and the capacitor 551. Compared to the interstage matching network 301 illustrated in FIG. 1, the interstage matching network 901 includes a capacitor 910 and a transformer 913 instead of the capacitor 310 and the transformers 316 and 317. The transformer 913 includes a primary-side winding (inductor) 911 and a secondary-side winding (inductor) 912.

The capacitor 910 has a first end that is connected to the output terminal 201b of the amplifier 201 and a second end that is connected to the output terminal 221b of the amplifier 221. The primary-side winding 911 of the transformer 913 has a first end that is connected to the output terminal 201b of the amplifier 201 and the first end of the capacitor 910, a neutral point to which the power supply voltage VCC3 is supplied, and a second end that is connected to the output terminal 221b of the amplifier 221 and the second end of the capacitor 910.

The secondary-side winding 912 has a first end that is connected to the input terminal 501a of the amplifier 501 and a second end that is connected to the input terminal 521a of the amplifier 521, and the secondary-side winding 912 is electromagnetically coupled to the primary-side winding 911.

The primary-side winding 603 of the power combiner 601 has a first end that is connected to the output terminal 501b of the amplifier 501, a neutral point to which the power supply voltage VCC4 is supplied, and a second end that is connected to the output terminal 521b of the amplifier 521.

Simulation

Next, simulation of an impedance ZLR201 seen when looking the amplifier 501 from the output terminal 201b of the amplifier 201 will be described. In addition, since an impedance ZLR221 seen when looking at the amplifier 521 from the output terminal 221b of the amplifier 221 is substantially identical to the impedance ZLR201, the description of the impedance ZLR221 will be omitted here.

The inventors simulated frequency variations of the impedance ZLR201 while using the capacitance of the capacitor 910 and the inductance of the primary-side winding 911 and the inductance of the secondary-side winding 912 included in the interstage matching network 901 as parameters. The inventors optimized the parameters so that the impedance ZLR201 had a real constant value in a frequency range from 1.7 GHz to 2.7 GHz.

Figure 14:
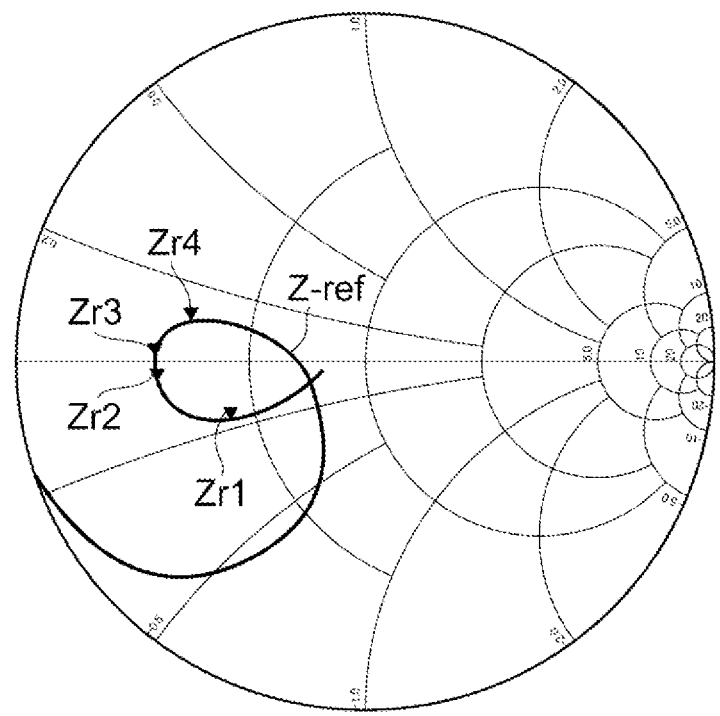
FIG. 14 is a diagram illustrating an example illustrating frequency variations of an impedance in the power amplification circuit according to the reference example.

FIG. 14 is a diagram illustrating an example illustrating frequency variations of the impedance ZLR201 in the power amplification circuit according to the reference example. In FIG. 14, a change curve Z-ref of the impedance ZLR201 calculated on the basis of the optimized parameters when the frequency is varied from 1.5 GHz to 6.7 GHz is illustrated on a Smith chart. The change curve Z-ref is a curve obtained when the impedance ZLR201 is divided by a characteristic impedance Z0 of 6Ω.

The symbols Zr1, Zr2, Zr3, and Zr4 located along the change curve Z-ref indicate the values of the impedance ZLR201 when the frequency is 1.7 GHz, 2.1 GHz, 2.3 GHz, and 2.7 GHz, respectively. Thus, the symbols Zr1, Zr2, Zr3, and Zr4 are distributed across a wider range on the Smith chart compared with the symbols Z1, Z2, Z3, and Z4 illustrated in FIG. 2. In other words, the interstage matching network 901 is less able to suppress frequency variations of the impedance ZLR201 in the frequency range from 1.7 GHz to 2.7 GHz compared with the interstage matching network 301 illustrated in FIG. 1. In other words, the interstage matching network 301 illustrated in FIG. 1 is better able to suppress frequency variations of the impedance ZL201 in the frequency range from 1.7 GHz to 2.7 GHz than the interstage matching network 901.

Figure 15:
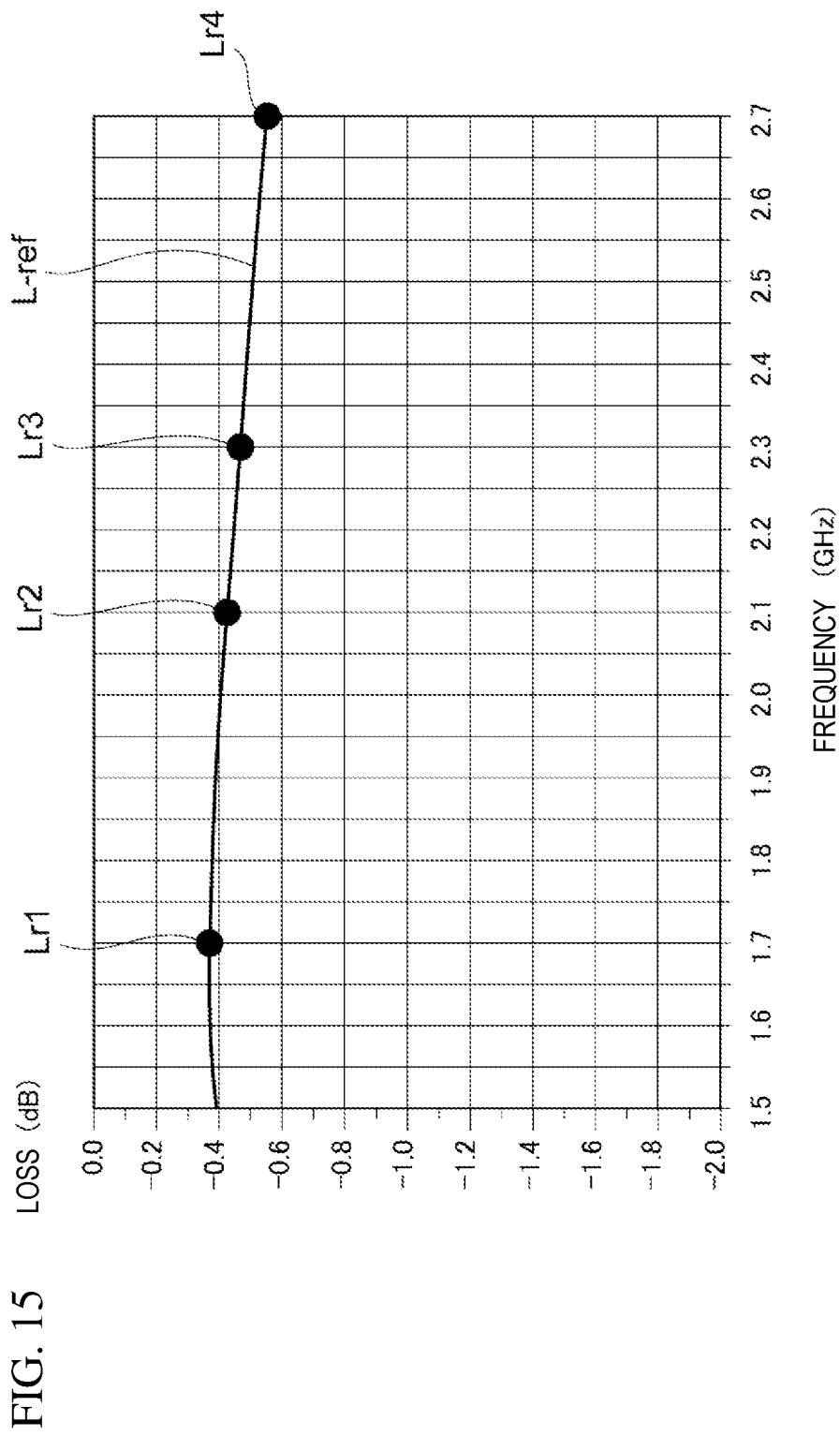
FIG. 15 is a diagram illustrating an example illustrating frequency variations of loss in the power amplification circuit according to the reference example.

In addition, the inventors also simulated loss that occurs from the output terminal 201b of the amplifier 201 to the input terminal 501a of the amplifier 501 in the power amplification circuit 90. FIG. 15 is a diagram illustrating an example illustrating frequency variations of loss in the power amplification circuit 90 according to the reference example. In FIG. 15, the horizontal axis represents frequency in units of "GHz" and the vertical axis represents loss in units of "dB".

FIG. 15 illustrates a loss curve L-ref calculated on the basis of the optimized parameters when the frequency is varied from 1.5 GHz to 2.7 GHz. Losses Lr1, Lr2, Lr3, and Lr4 along the loss curve L-ref are losses obtained when the frequency is 1.7 GHz, 2.1 GHz, 2.3 GHz, and 2.7 GHz, respectively.

Thus, in the power amplification circuit 90, the loss lies in a range from −0.56 dB to −0.37 dB in the frequency range from 1.7 GHz and 2.7 GHz and is larger than the loss in the power amplification circuit 11 (refer to FIG. 3). In the power amplification circuit 90, the loss is particularly large at a high frequency of 2.7 GHz.

In other words, the interstage matching network 301 illustrated in FIG. 1 is better able to suppress loss in the frequency range from 1.7 GHz to 2.7 GHz than the interstage matching network 901.

Ninth Embodiment

Figure 16:
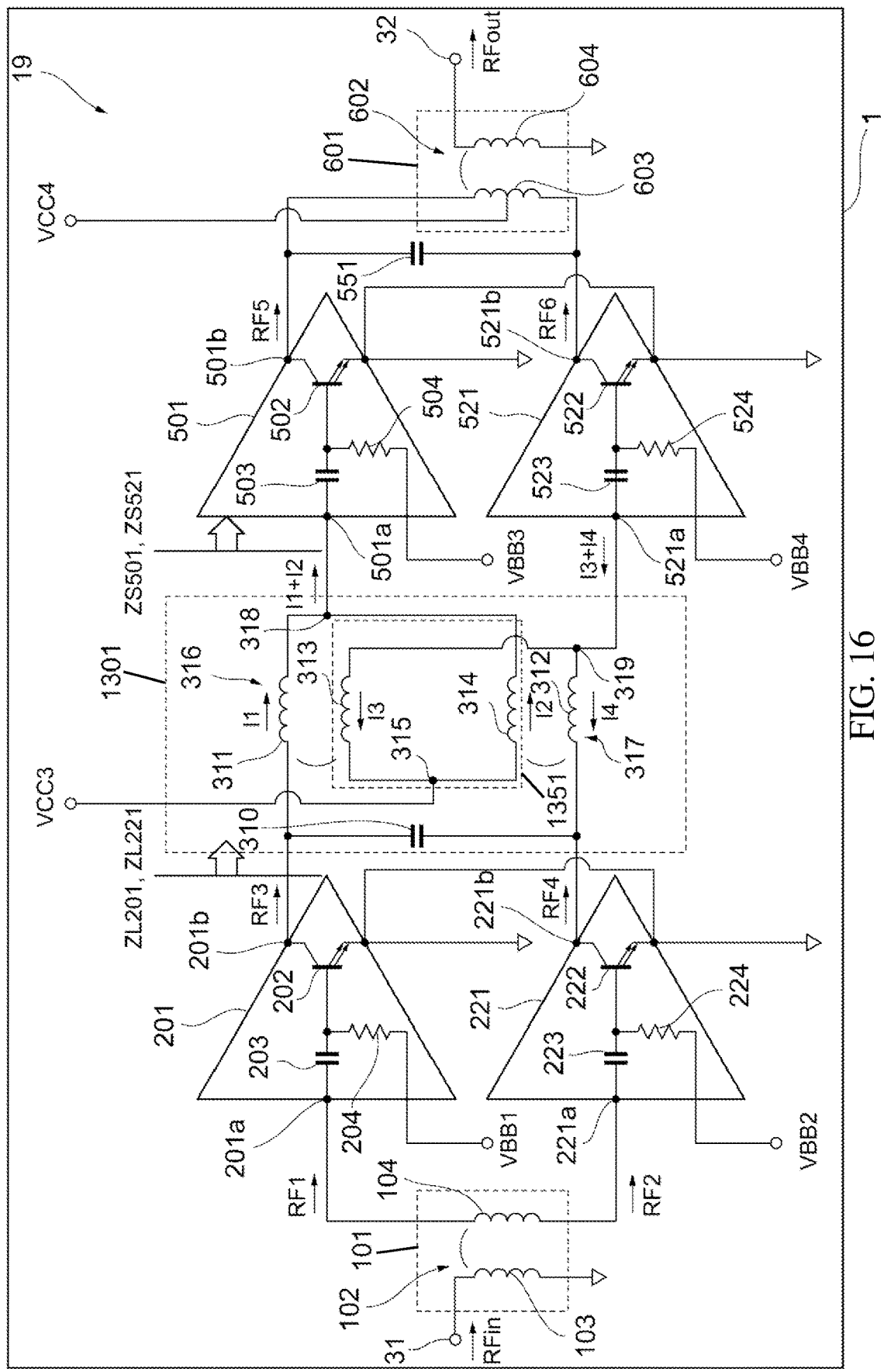
FIG. 16 is a circuit diagram of a power amplification circuit according to a Ninth Embodiment of the present disclosure.

A power amplification circuit 19 according to a Ninth Embodiment will be described. FIG. 16 is a circuit diagram of the power amplification circuit 19 according to the Ninth Embodiment of the present disclosure. As illustrated in FIG. 16, the power amplification circuit 19 according to the Ninth Embodiment differs from the power amplification circuit 11 according to the First Embodiment in that the power amplification circuit 19 includes an interstage matching network 1301 instead of the interstage matching network 301. Compared to the interstage matching network 301 illustrated in FIG. 1, the interstage matching network 1301 includes a current-induction wiring section 1351 instead of the current-induction wiring section 351.

A current-induction wiring section 1351 includes the power supply node 315 and the windings 313 and 314. The winding 313 of the current-induction wiring section 1351 has a first end that is connected to the power supply node 315 and a second end that is connected to the node 319, and is electromagnetically coupled to the winding 311. The winding 314 has a first end that is connected to the power supply node 315 and a second end that is connected to the node 318, and is electromagnetically coupled to the winding 312. The transformers 316 and 317 form a Guanella-type matching network. Guanella-type matching networks are, for example, disclosed in U.S. Pat. Nos. 5,808,518 and 2,470,307.

For example, when a current I1 flowing in the winding 311 from the first end to the second end of the winding 311 increases, a current I4 flowing in the winding 312 from the second end to the first end of the winding 312 increases. At this time, a current I3 is induced in the winding 313 in the direction from the second end to the first end of the winding 313 due to the electromagnetic coupling between the winding 313 and the winding 311. In addition, a current I2 is induced in the winding 314 in the direction from the first end to the second end of the winding 314 due to the electromagnetic coupling between the winding 314 and the winding 312.

The currents I1 and I2 flow into the node 318, and therefore a current (I1+I2) flows in a direction from the node 318 to the amplifier 501 according to Kirchhoff's First Law, as with the case of the power amplification circuit 11 (refer to FIG. 1). Furthermore, the currents I3 and I4 flow out from the node 319, and therefore a current (I3+I4) flows in a direction from the amplifier 521 to the node 319 according to Kirchhoff's First Law, as with the case of the power amplification circuit 11.

The size of the current I4 is substantially identical to that of the current I1. The size of the current I3 is substantially identical to that of the current I2. Therefore, in the situation where the interstage matching network 1301 of the power amplification circuit 19 does not include the capacitor 310, the above Formula (1) holds true as with the case of the power amplification circuit 11.

In other words, the impedances ZL201 and ZL221 can be adjusted to impedances corresponding to the output load impedance by appropriately setting the mutual inductance between the transformers 316 and 317 and changing the ratio between the size of the current I1 and the size of the current I3 and the ratio between the size of current I2 and the size of the current I4.

In addition, a configuration may be adopted in which the current-induction wiring section 1351 is provided instead of the current-induction wiring section 351 in the power amplification circuit 13 (refer to FIG. 7), the power amplification circuit 15 (refer to FIG. 9), or the power amplification circuit 17 (refer to FIG. 11).

Layout

Next, an example of the layout of the transformers 316 and 317 in a semiconductor device 1 according to the Ninth Embodiment will be described.

Figure 17:
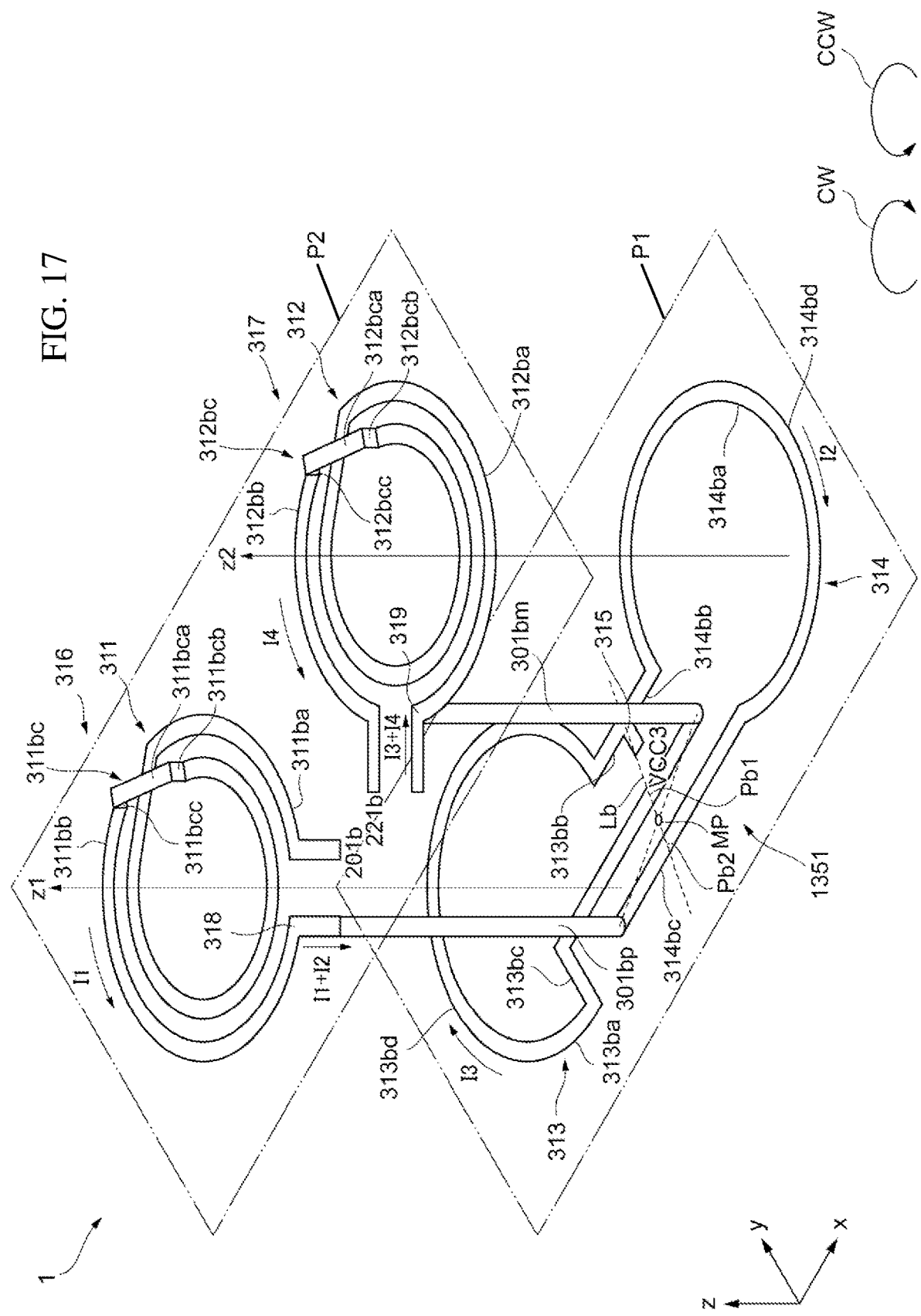
FIG. 17 is a perspective view schematically illustrating a First Example of the layout of transformers according to the Ninth Embodiment of the present disclosure.

FIG. 17 is a perspective view schematically illustrating a First Example of the layout of the transformers 316 and 317 according to the Ninth Embodiment of the present disclosure. In the First Example, the winding 311 of the transformer 316 and the winding 312 of the transformer 317 are mainly formed on the plane P2. The winding 311 includes winding portions 311$ba$ and 311$bb$ formed on the plane P2 and a connection portion 311$bc$. The connection portion 311$bc$ includes a crossing portion 311$bca$ formed on an upper plane (not illustrated) that is located above the plane P2 and interlayer vias 311$bcb$ and 311$bcc$. The winding portion 311$ba$ has a first end, which is connected to the output terminal 201$b$, and a second end, and is wound around the z1 axis in the counter clockwise direction ccw while moving closer to the z1 axis from the first end to the second end. The winding portion 311$bb$ has a first end, which is the node 318, and a second end, and is wound around the negative x-axis side of the winding portion 311$ba$ in the clockwise direction cw from the first end to the second end. The connection portion 311$bc$ connects the second end of the winding portion 311$ba$ and the second end of the winding portion 311$bb$ to each other in such a way that a short circuit does not occur at a part thereof that crosses the winding portion 311$ba$. In more detail, a short circuit between the crossing portion 311$bca$ and the winding portion 311$ba$ is prevented by forming the crossing portion 311$bca$ on an upper plane that is different from the plane P2 on which the winding portion 311$ba$ is formed. The two ends of the crossing portion 311$bca$ are connected to the second end of the winding portion 311$ba$ and the second end of the winding portion 311$bb$ through the interlayer vias 311$bcb$ and 311$bcc$, respectively. The winding portions 311$ba$ and 311$bb$ and the connection portion 311$bc$ are wound around the z1 axis through substantially two turns in their entirety.

The winding 312 is located on the positive x-axis side of the winding 311. Specifically, the winding 312 includes winding portions 312$ba$ and 312$bb$ formed on the plane P2 and a connection portion 312$bc$. The connection portion 312$bc$ includes a crossing portion 312$bca$ formed on an upper plane (not illustrated) and interlayer vias 312$bcb$ and 312$bcc$. The winding portion 312$ba$ has a first end, which is the node 319, and a second end, and is wound around the z2 axis in the counter clockwise direction ccw while moving closer to the z2 axis from the first end to the second end. The winding portion 312$bb$ has a first end, which is connected to the output terminal 221$b$, and a second end, and is wound around the negative x-axis side of the winding portion 312$ba$ in the clockwise direction cw from the first end to the second end. The connection portion 312$bc$ connects the second end of the winding portion 312$ba$ and the second end of the winding portion 312$bb$ to each other in such a way that a short circuit does not occur at a part thereof that crosses the winding portion 312$ba$. In more detail, a short circuit between the crossing portion 312$bca$ and the winding portion 312$ba$ is prevented by forming the crossing portion 312$bca$ on an upper plane that is different from the plane P2 on which the winding portion 312$ba$ is formed. The two ends of the crossing portion 312$bca$ are connected to the second end of the winding portion 312$ba$ and the second end of the winding portion 312$bb$ through the interlayer vias 312$bcb$ and 312$bcc$, respectively. The winding portions 312$ba$ and 312$bb$ and the connection portion 312$bc$ are wound around the z2 axis through substantially two turns in their entirety.

Figure 18:
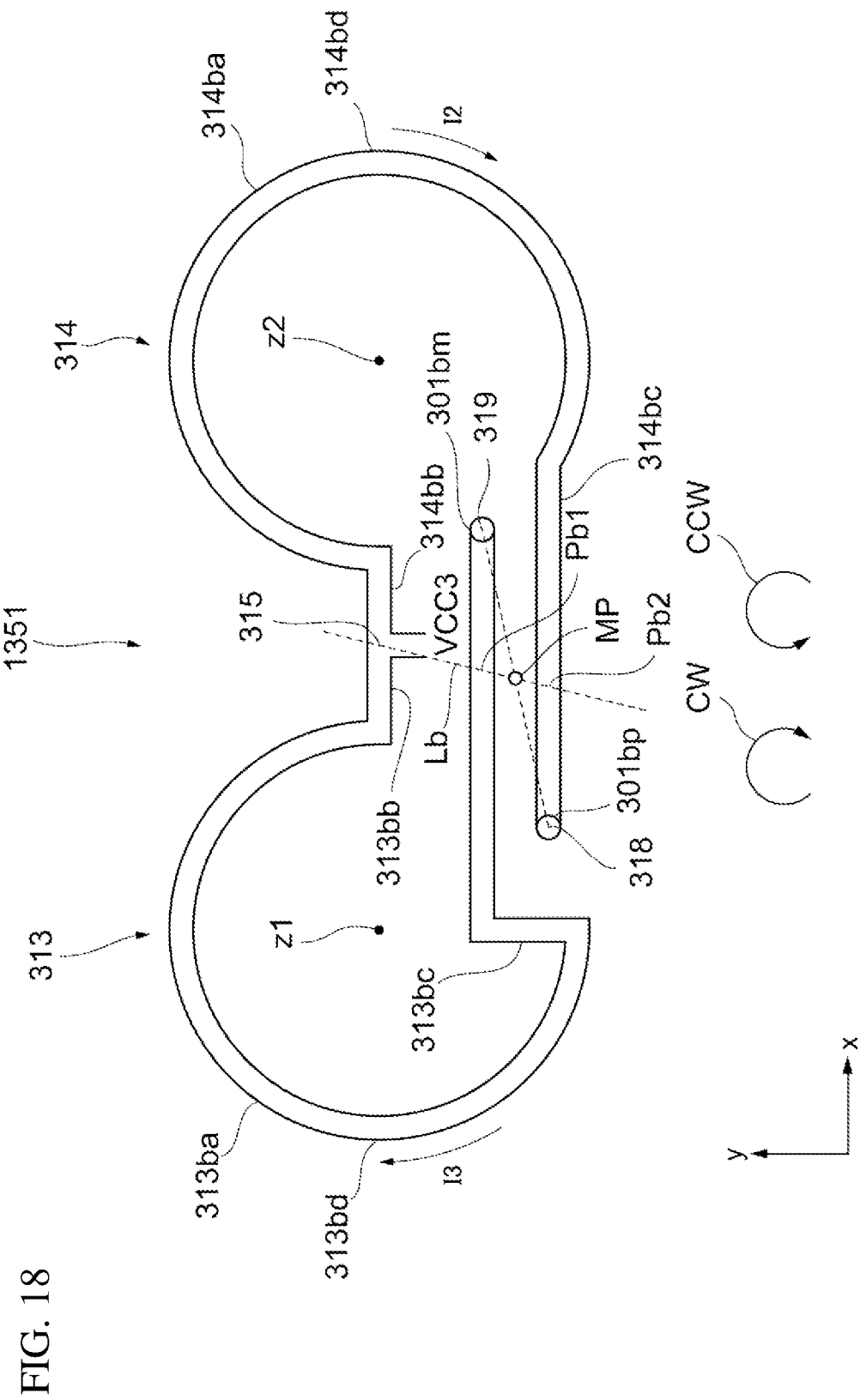
FIG. 18 is a plan view of windings illustrated in FIG. 17 from above.

FIG. 18 is a plan view of the windings 313 and 314 illustrated in FIG. 17 from above. As illustrated in FIGS. 17 and 18, the current-induction wiring section 1351 is formed on the plane P1. When the plane P1 is viewed in plan view, the windings 313 and 314 respectively include curved parts 313$bd$ and 314$bd$ that curve away from each other. Furthermore, when the plane P1 is viewed in plan view, a line Lb that passes through a midpoint MP between the nodes 318 and 319 and the power supply node 315 intersects the windings 313 and 314 at points other than at the power supply node 315.

Specifically, the winding 313 includes a winding portion 313$ba$ and connection portions 313$bb$ and 313$bc$, and is located below the winding 311. The winding portion 313$ba$ has a first end that is connected to the node 319 through the connection portion 313$bc$ and an interlayer via 301$bm$, and has a second end. The winding portion 313$ba$ is wound around the z1 axis in the clockwise direction cw from the first end to the second end through more than 180° and less than 360°. The winding portion 313$ba$ includes the curved part 313$bd$, which curves toward the negative x-axis side. The connection portion 313$bb$ extends substantially parallel to the x axis and connects the second end of the winding portion 313$ba$ and the power supply node 315 to each other.

The winding 314 includes a winding portion 314$ba$ and connection portions 314$bb$ and 314$bc$, and is located below the winding 312. The winding portion 314$ba$ has a first end that is connected to the node 318 through the connection portion 314$bc$ and an interlayer via 301$bp$, and has a second end. The winding portion 314$ba$ is wound around the z2 axis in the counter clockwise direction ccw from the first end to the second end through more than 180° and less than 360°. The winding portion 314$ba$ includes the curved part 314$bd$, which curves toward the positive x-axis side. The connection portion 314$bb$ connects the second end of the winding portion 314*ba* and the power supply node 315 to each other. When viewed together, the connection portions 313*bb* and 314*bb* substantially have the shape of a straight line that extends in the x axis direction.

The connection portion 313*bc* is substantially L-shaped when the plane P1 is viewed in plan view and intersects the line Lb at a point Pb1. The connection portion 314*bc* substantially has a straight-line shape that extends in the x axis direction when the plane P1 is viewed in plan view and intersects the line Lb at a point Pb2.

Next, a Second Example of the layout of the transformers 316 and 317 in the semiconductor device 1 according to the Ninth Embodiment will be described.

Figure 19:
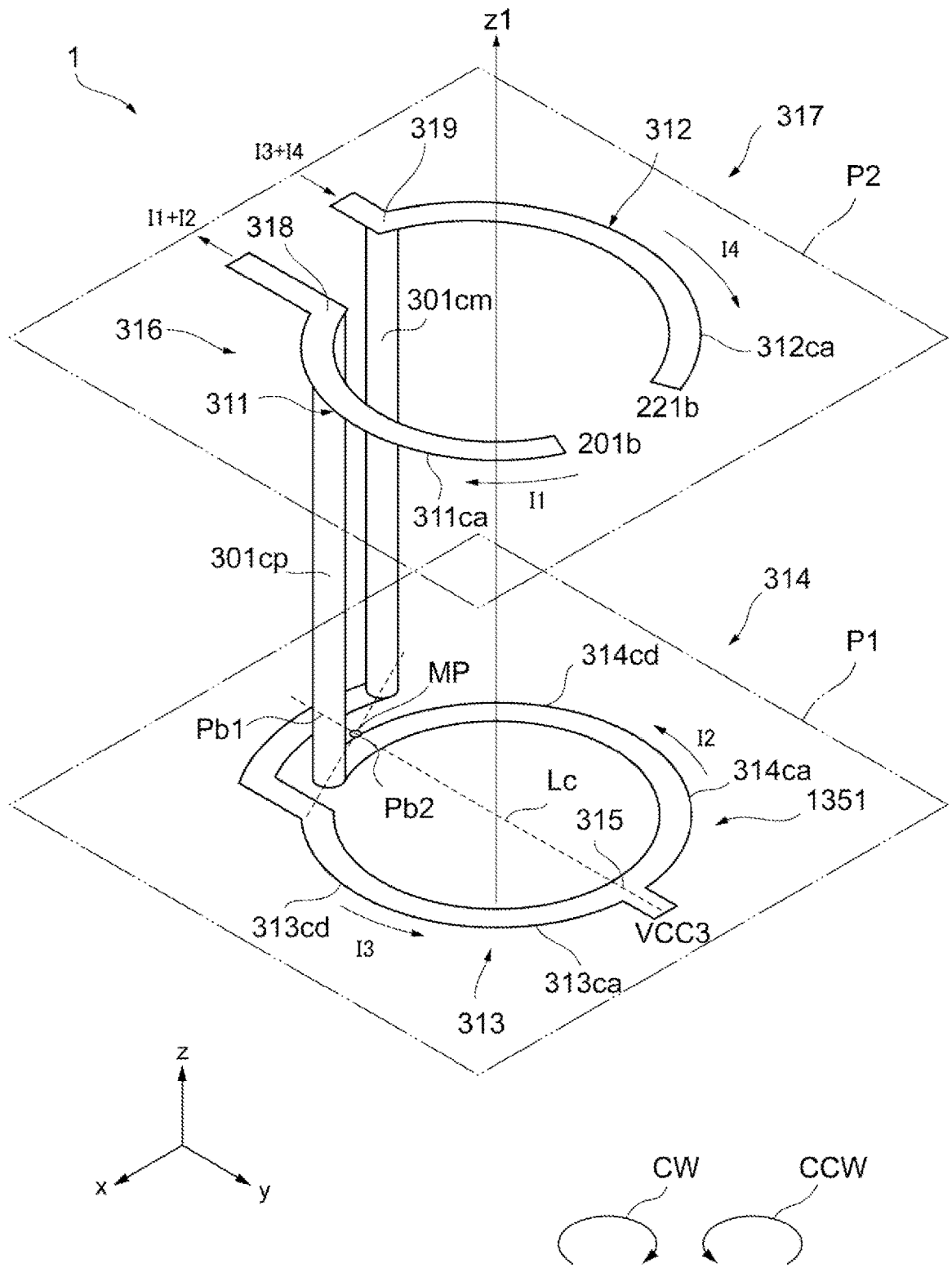
FIG. 19 is a perspective view schematically illustrating a Second Example of the layout of transformers according to the Ninth Embodiment of the present disclosure.

FIG. 19 is a perspective view schematically illustrating a Second Example of the layout of the transformers 316 and 317 according to the Ninth Embodiment of the present disclosure. As illustrated in FIG. 19, in the Second Example, the winding 311 of the transformer 316 includes a winding portion 311*ca* and is formed on the plane P2. The winding portion 311*ca* has a first end that is connected to the output terminal 201*b* and a second end that is the node 318, and is wound around the z1 axis in the clockwise direction cw though substantially 180° from the first end to the second end.

The winding 312 of the transformer 317 includes a winding portion 312*ca* and is formed on the plane P2. The winding portion 312*ca* is located on the negative x-axis side of the winding portion 311*ca*. The winding portion 312*ca* has a first end that is connected to the output terminal 221*b* and a second end that is the node 319, and is wound around the z1 axis in the counter clockwise direction ccw through substantially 180° from the first end to the second end. The winding portions 311*ca* and 312*ca* have a substantially ring-like shape on the whole.

Figure 20:
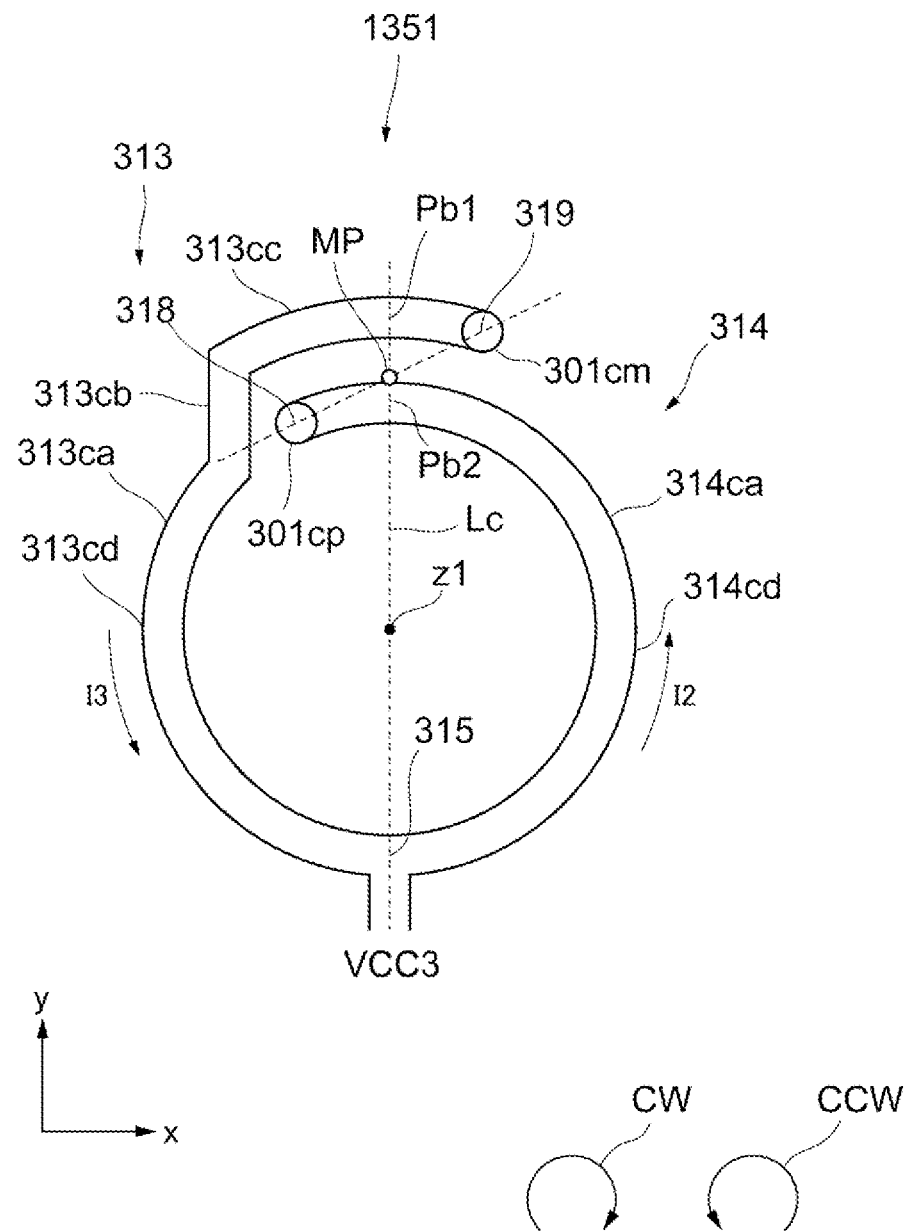
FIG. 20 is a plan view of windings illustrated in FIG. 19 from above.

FIG. 20 is a plan view of the windings 313 and 314 illustrated in FIG. 19 from above. As illustrated in FIGS. 19 and 20, the current-induction wiring section 1351 is formed on the plane P1. When the plane P1 is viewed in plan view, the windings 313 and 314 respectively include curved parts 313*cd* and 314*cd* that curve away from each other. Furthermore, when the plane P1 is viewed in plan view, a line Lc that passes through a midpoint MP between the nodes 318 and 319 and the power supply node 315 intersects the windings 313 and 314 at points other than at the power supply node 315.

Specifically, the winding 313 is located below the winding 311 and includes winding portions 313*ca* and 313*cc* and a connection portion 313*cb*. The winding portion 313*ca* has a first end that is the power supply node 315 and a second end, and is wound around the z1 axis in the clockwise direction cw through more than 90° and less than 180° from the first end to the second end. The winding portion 313*ca* includes the curved part 313*cd*, which curves toward the negative x-axis side.

The winding portion 313*cc* is located further away from the z1 axis than the winding portion 313*ca* and has a first end, which is connected to the node 319 through an interlayer via 301*cm*, and a second end. The winding portion 313*cc* is wound around the z1 axis in the counter clockwise direction ccw from the first end to the second end. The winding portion 313*cc* intersects the line Lc at the point Pb1.

The connection portion 313*cb* extends in a direction away from the z1 axis and connects the second end of the winding portion 313*ca* and the second end of the winding portion 313*cc* to each other. The winding portions 313*ca* and 313*cc* and the connection portion 313*cb* are wound around the z1 axis through more than 360° and less than 450° in total.

The winding 314 is located below the winding 312 and includes a winding portion 314*ca*. The winding portion 314*ca* is continuous with the first end of the winding portion 313*ca* and has a first end that is the power supply node 315 and a second end that is connected to the node 318 through an interlayer via 301*cp*. The winding portion 314*ca* is wound around the z1 axis in the counter clockwise direction ccw from the first end to the second end through more than 180° and less than 270°. The winding portion 314*ca* includes the curved part 314*cd*, which curves toward the positive x-axis side. The winding portions 313*ca* and 314*ca* have a substantially ring-like shape on the whole. The winding portion 314*ca* intersects the line Lc at the point Pb2.

Next, a Third Example of the layout of the transformers 316 and 317 in the semiconductor device 1 according to the Ninth Embodiment will be described.

Figure 21:
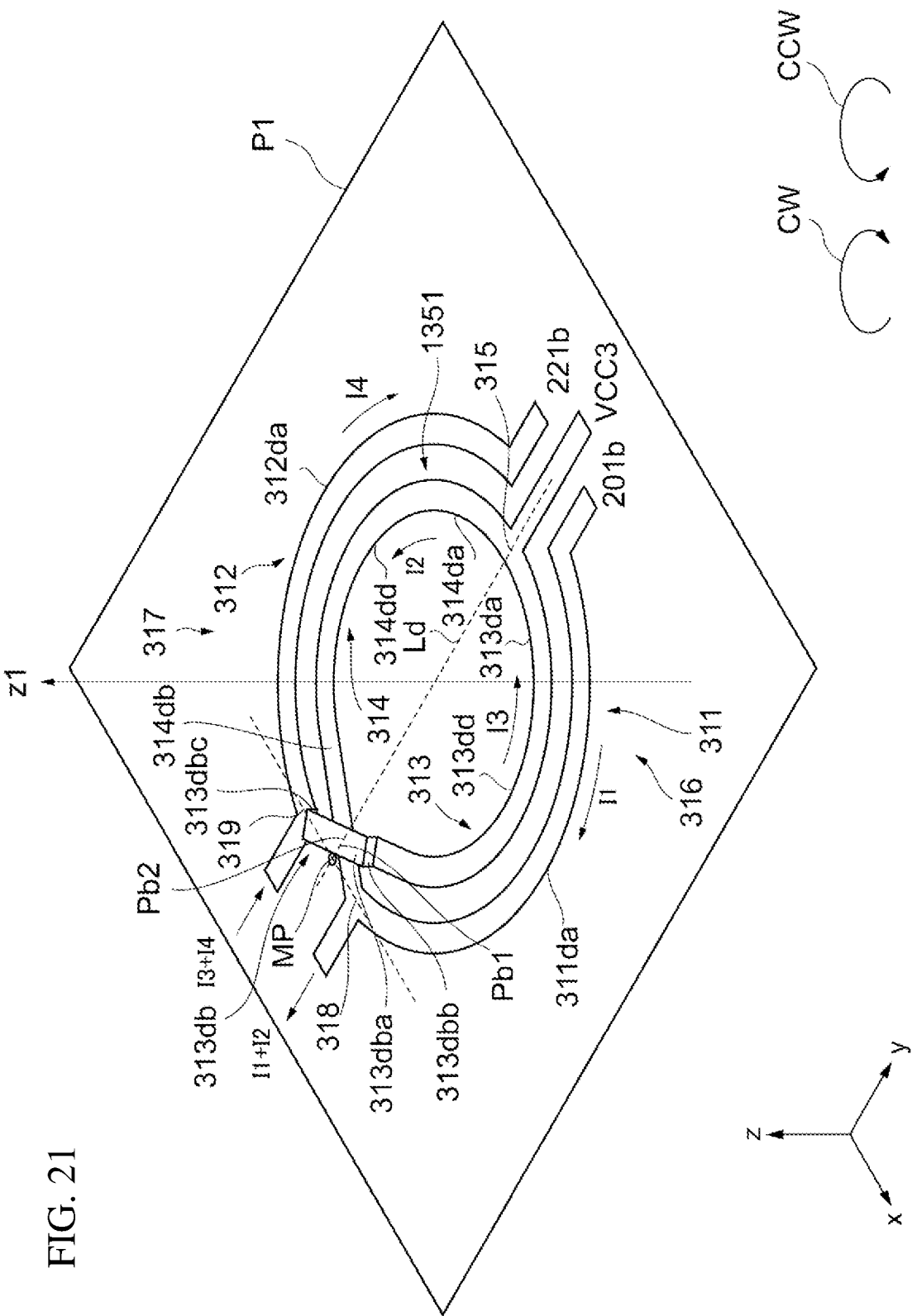
FIG. 21 is a perspective view schematically illustrating a Third Example of the layout of transformers according to the Ninth Embodiment of the present disclosure.
Figure 22:
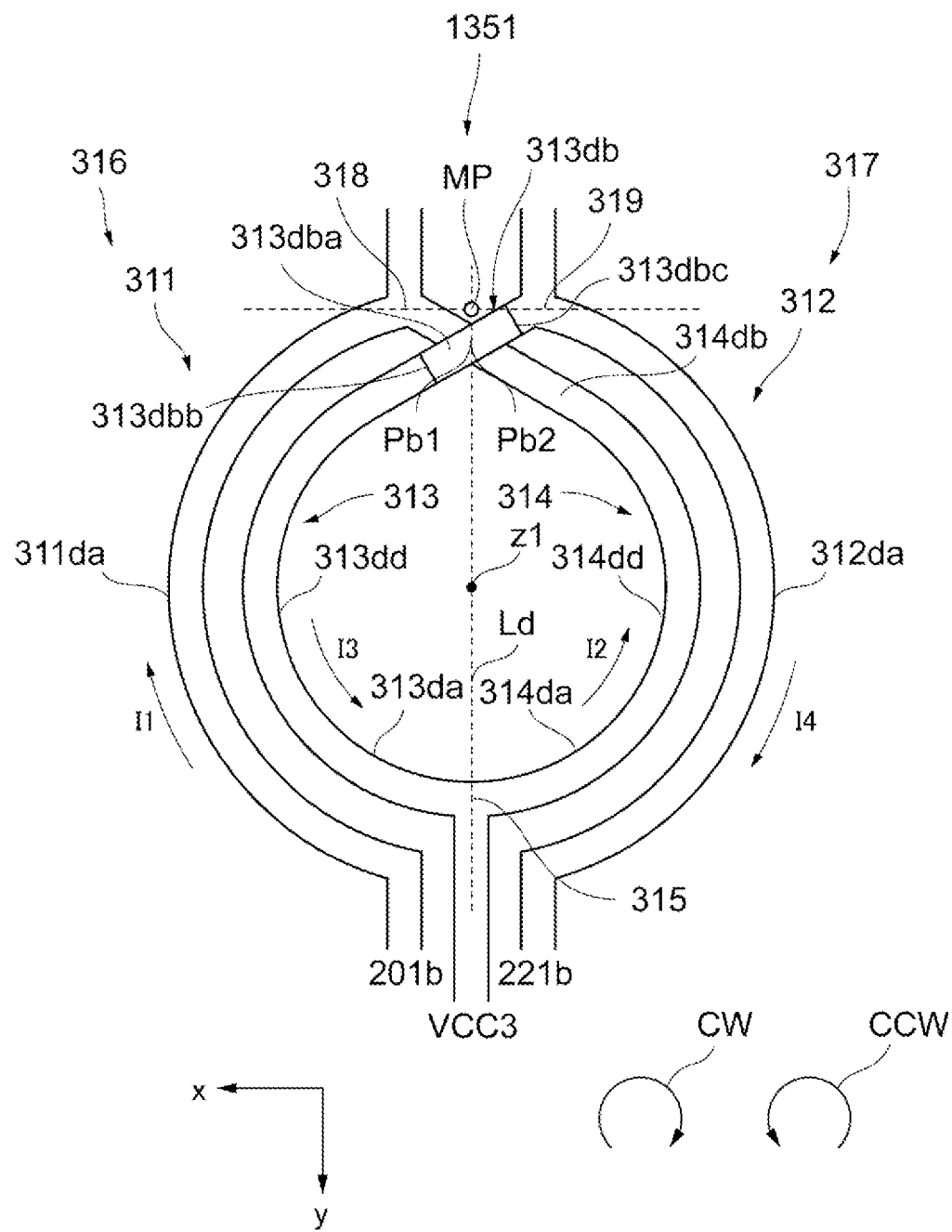
FIG. 22 is a plan view of transformers illustrated in FIG. 21 from above.

FIG. 21 is a perspective view schematically illustrating a Third Example of the layout of the transformers 316 and 317 according to the Ninth Embodiment of the present disclosure. FIG. 22 is a plan view of transformers 316 and 317 illustrated in FIG. 21 from above. As illustrated in FIGS. 21 and 22, in the Third Example, the windings 311 and 312 and the current-induction wiring section 1351 are mainly formed on the plane P1.

The winding 311 of the transformer 316 includes a winding portion 311*da* that is formed on the plane P1. The winding portion 311*da* includes a first end that is connected to the output terminal 201*b* and a second end that is the node 318, and is wound around the z1 axis in the clockwise direction cw though substantially 180° from the first end to the second end.

The winding 312 of the transformer 317 is located on the negative x-axis side of the winding 311 and includes a winding portion 312*da* that is formed on the plane P1. The winding portion 312*da* includes a first end that is connected to the output terminal 221*b* and a second end that is the node 319, and is wound around the z1 axis in the counter clockwise direction ccw through substantially 180° from the first end to the second end. The winding portions 311*da* and 312*da* have a substantially ring-like shape on the whole. When the plane P1 is viewed in plan view, the winding portion 311*da* is shaped so as to be substantially symmetrical with the winding portion 312*da* about a line Ld that passes through the midpoint MP between the nodes 318 and 319 and the power supply node 315.

When the plane P1 is viewed in plan view, the windings 313 and 314 respectively include curved parts 313*dd* and 314*dd* that curve away from each other. Furthermore, when the plane P1 is viewed in plan view, the line Ld intersects the windings 313 and 314 at points other than at the power supply node 315.

Specifically, the winding 314 is located on the positive x-axis side of the winding 312 and includes a winding portion 314*da* that is formed on the plane P1 and a connection portion 314*db* that is formed on the plane P1. The winding portion 314*da* has a first end that is the power supply node 315 and a second end, and is wound around the z1 axis in the counter clockwise direction ccw through more than 90° and less than 180° from the first end to the second end. The winding portion 314*da* includes the curved part 314*dd*, which curves toward the negative x-axis side. The connection portion 314*db* extends toward the positive x-axis side and the negative y-axis side and connects the second end of the winding portion 314*da* and the second end of the winding portion 311*da*, i.e., the node 318, to each other.

The winding 313 is located on the negative x-axis side of the winding 311 and includes a winding portion 313*da*, which is formed on the plane P1, and a connection portion 313db. The connection portion 313db includes a crossing portion 313dba, which is formed on an upper plane (not illustrated) located above the plane P1, and interlayer vias 313dbb and 313dbc. The winding portion 313da is continuous with the first end of the winding portion 314da and has a first end that is the power supply node 315 and a second end. The winding portion 313da is wound around the z1 axis in the clockwise direction cw from the first end to the second end through more than 90° and less than 180°. The winding portion 313da includes the curved part 313dd, which curves toward the positive x-axis side. When the plane P1 is viewed in plan view, the connection portion 313db extends toward the negative x-axis side and the negative y-axis side and connects the second end of the winding portion 313da and the second end of the winding portion 312da, i.e., the node 319, to each other in such a way that a short circuit does not occur at a part thereof that crosses the connection portion 314db. In more detail, a short circuit between the crossing portion 313dba and the connection portion 314db is prevented by forming the crossing portion 313dba on an upper plane that is different from the plane P1 on which the connection portion 314db is formed. The two ends of the crossing portion 313dba are connected to the second end of the winding portion 313da and the second end of the winding portion 312da through the interlayer vias 313dbb and 313dbc, respectively.

When the plane P1 is viewed in plan view, the winding portion 313da and the connection portion 313db have shapes that are substantially symmetrical with those of the winding portion 314da and the connection portion 314db with respect to the line Ld. When the plane P1 is viewed in plan view, the connection portion 313db intersects the line Ld at the point Pb1. When the plane P1 is viewed in plan view, the connection portion 314db intersects the line Lb at the point Pb2.

Tenth Embodiment

Figure 23:
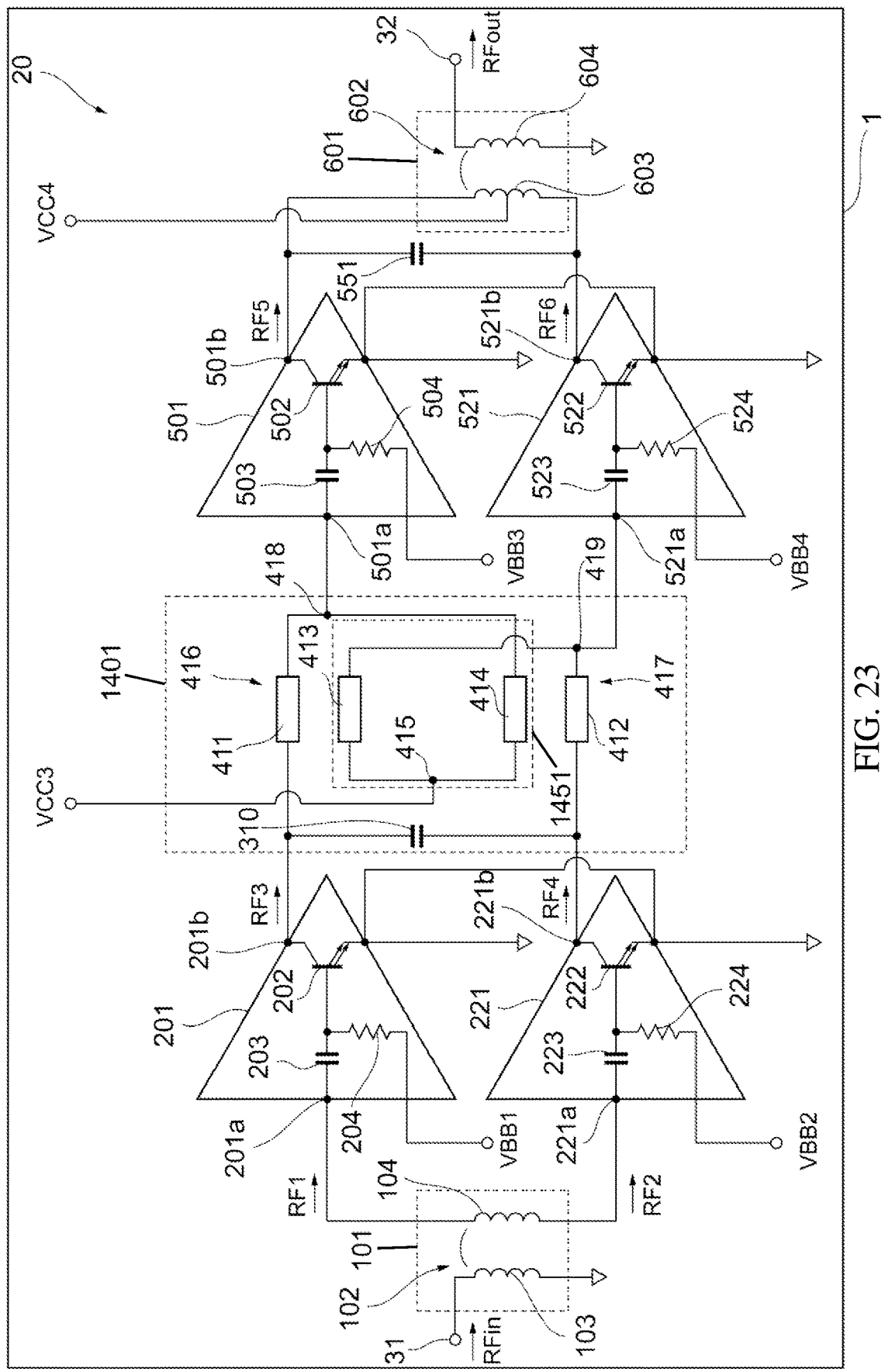
FIG. 23 is a circuit diagram of a power amplification circuit according to a Tenth Embodiment of the present disclosure.

A power amplification circuit 20 according to a Tenth Embodiment will be described. FIG. 23 is a circuit diagram of the power amplification circuit 20 according to the Tenth Embodiment of the present disclosure. As illustrated in FIG. 23, the power amplification circuit 20 according to the Tenth Embodiment differs from the power amplification circuit 12 according to the Second Embodiment in that the power amplification circuit 20 includes an interstage matching network 1401 instead of the interstage matching network 401. Compared to the interstage matching network 401 illustrated in FIG. 6, the interstage matching network 1401 includes a current-induction wiring section 1451 instead of the current-induction wiring section 451.

The current-induction wiring section 1451 includes the power supply node 415 and the transmission lines 413 and 414. The transmission line 413 of the current-induction wiring section 1451 has a first end that is connected to the power supply node 415 and a second end that is connected to the node 419, and is electromagnetically coupled to the transmission line 411. The transmission line 414 has a first end that is connected to the power supply node 415 and a second end that is connected to the node 418, and is electromagnetically coupled to the transmission line 412. The coupled lines 416 and 417 form a Guanella-type matching network.

In addition, a configuration may be adopted in which the current-induction wiring section 1451 is provided instead of the current-induction wiring section 451 in the power amplification circuit 14 (refer to FIG. 8), the power amplification circuit 16 (refer to FIG. 10), or the power amplification circuit 18 (refer to FIG. 12).

Eleventh Embodiment

Figure 24:
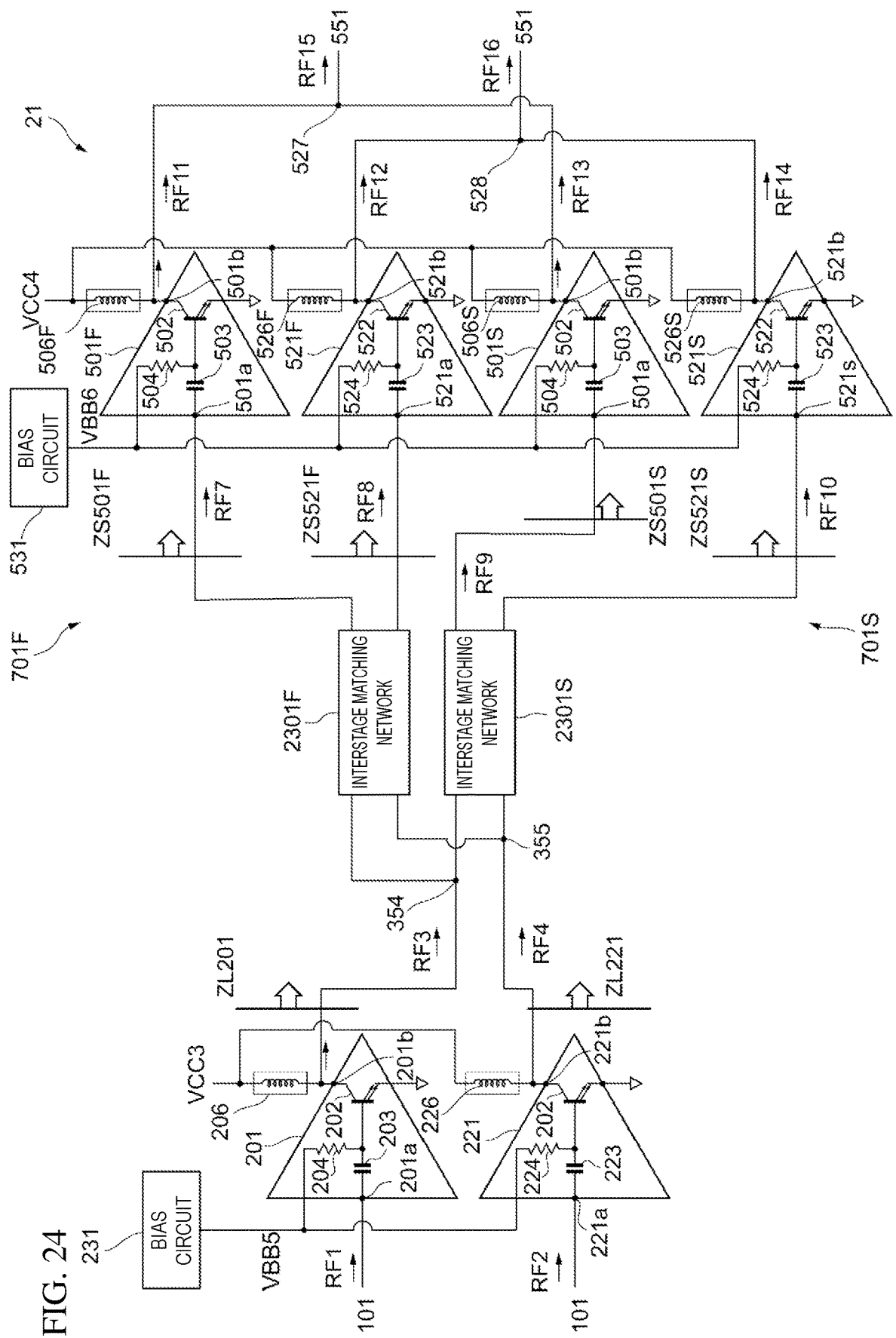
FIG. 24 is a circuit diagram of a power amplification circuit according to an Eleventh Embodiment of the present disclosure.
Figure 25:
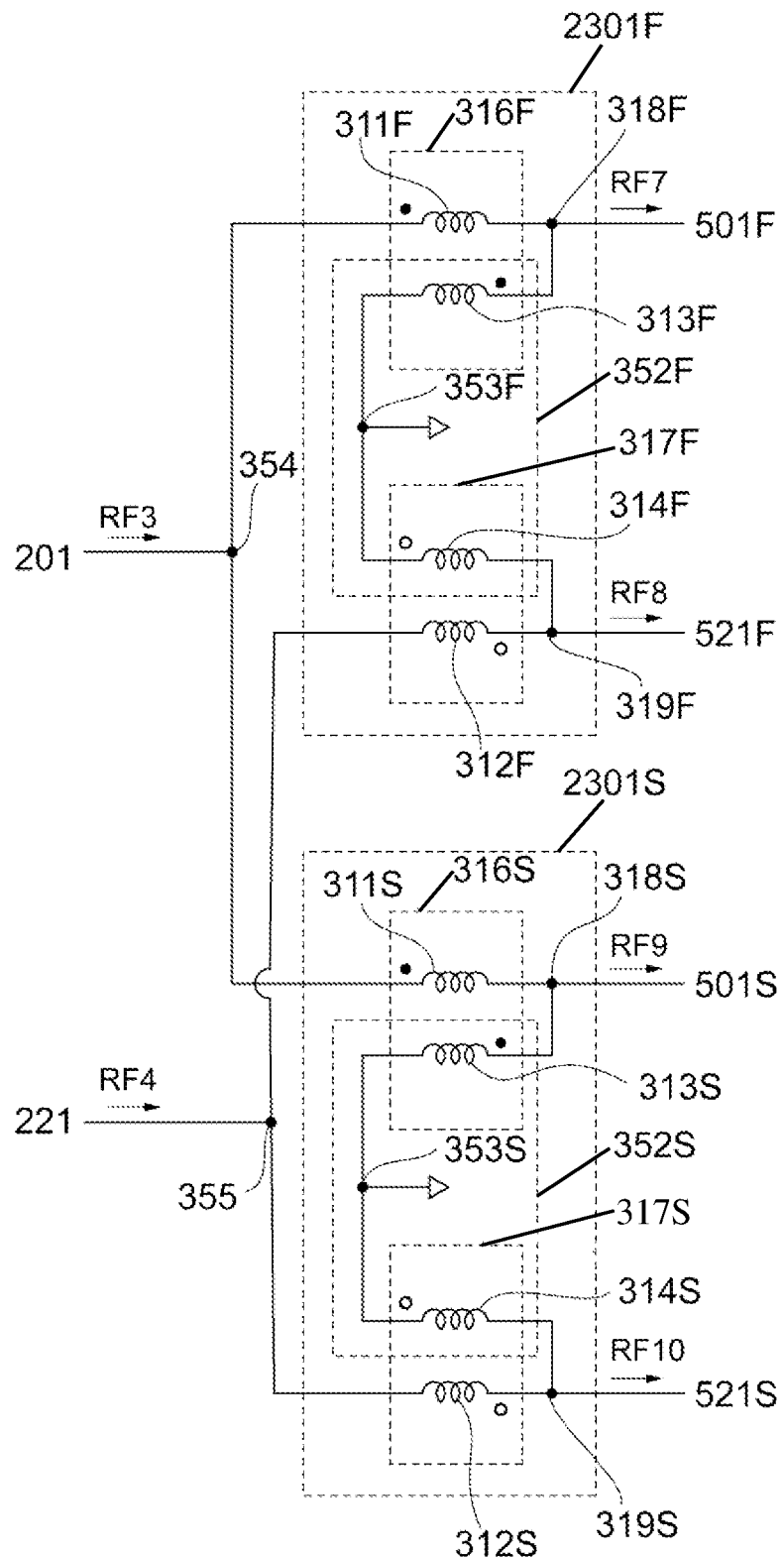
FIG. 25 is a circuit diagram of interstage matching networks according to the Eleventh Embodiment of the present disclosure.

A power amplification circuit 21 according to an Eleventh Embodiment will be described. FIG. 24 is a circuit diagram of the power amplification circuit 21 according to the Eleventh Embodiment of the present disclosure. FIG. 25 is a circuit diagram of interstage matching networks 2301F and 2301S according to the Eleventh Embodiment of the present disclosure. As illustrated in FIGS. 24 and 25, the power amplification circuit 21 according to the Eleventh Embodiment differs from the power amplification circuit 11 according to the First Embodiment in that the power amplification circuit 21 includes two sets of an interstage matching network and an output-stage differential pair.

Compared with the power amplification circuit 11 illustrated in FIG. 1, the power amplification circuit 21 includes a set 701F (first set) instead of the interstage matching network 301 and the amplifiers 501 and 521, and further includes a set 701S (second set), bias circuits 231 and 531, and inductors 206 and 226. The set 701F includes an interstage matching network 2301F, inductors 506F and 526F, and amplifiers 501F and 521F. The set 701S includes an interstage matching network 2301S, inductors 506S and 526S, an amplifier 501S, and an amplifier 521S.

The power supply voltage VCC3 of the amplifier 201 is supplied to the output terminal 201b of the amplifier 201 via the inductor 206. The power supply voltage VCC3 of the amplifier 221 is supplied to the output terminal 221b of the amplifier 221 via the inductor 226. The bias circuit 231 supplies a bias voltage VBB5 to the base of the transistor 202 and the base of the transistor 222 via the resistance elements 204 and 224.

The interstage matching network 2301F includes transformers 316F and 317F and supplies amplified signals RF7 and RF8 to the amplifiers 501F and 521F (refer to FIG. 25) respectively when the amplified signals RF3 and RF4 are respectively supplied from the amplifiers 201 and 221.

In the transformer 316F of the interstage matching network 2301F, a winding 311F has a first end that is connected to the output terminal 201b of the amplifier 201 via a node 354 and a second end that is connected to a node 318F. A winding 313F has a first end that is connected to a ground node 353F (low impedance node) that is grounded and a second end that is connected to the node 318F, and is electromagnetically coupled to the winding 311F.

In the transformer 317F of the interstage matching network 2301F, a winding 312F has a first end that is connected to the output terminal 221b of the amplifier 221 via a node 355 and a second end that is connected to a node 319F. A winding 314F has a first end that is connected to the ground node 353F and a second end that is connected to the node 319F, and is electromagnetically coupled to the winding 312F.

A current-induction wiring section 352F is formed by the ground node 353F and the windings 313F and 314F.

The interstage matching network 2301S has the same configuration as the interstage matching network 2301F, and when the amplified signals RF3 and RF4 are supplied thereto from the amplifiers 201 and 221, the interstage matching network 2301S outputs amplified signals RF9 and RF10 to the amplifiers 501S and 521S, respectively (refer to FIG. 25).

A transformer 316S of the interstage matching network 2301S has the same configuration as the transformer 316F. In the transformer 316S, a first end of a winding 311S is connected to the output terminal 201b of the amplifier 201 via the node 354. A transformer 317S of the interstage matching network 2301S has the same configuration as the transformer 317F. In the transformer 317S, a first end of a winding 312S is connected to the output terminal 221b of the amplifier 221 via the node 355.

The amplifier 501F has substantially the same configuration as the amplifier 501 (refer to FIG. 1), and when the amplified signal RF7, which has passed through the interstage matching network 2301F, is supplied to the input terminal 501a, the amplifier 501F outputs an amplified signal RF11, which is generated by amplification of the amplified signal RF7, from the output terminal 501b (refer to FIG. 24).

The input terminal 501a of the amplifier 501F is connected to the node 318F of the interstage matching network 2301F. The output terminal 501b of the amplifier 501F is connected to the first end of the capacitor 551 (refer to FIG. 1) via a node 527. The power supply voltage VCC4 of the amplifier 501F is supplied to the output terminal 501b of the amplifier 501F via the inductor 506F. A bias voltage VBB6 is supplied from the bias circuit 531 via the resistance element 504 to the base of the transistor 502 of the amplifier 501F.

The amplifier 521F has substantially the same configuration as the amplifier 521 (refer to FIG. 1), and when the amplified signal RF8, which has passed through the interstage matching network 2301F, is supplied to the input terminal 521a, the amplifier 521F outputs an amplified signal RF12, which is generated by amplification of the amplified signal RF8, from the output terminal 521b.

The input terminal 521a of the amplifier 521F is connected to the node 319F of the interstage matching network 2301F. The output terminal 521b of the amplifier 521F is connected to the second end of the capacitor 551 (refer to FIG. 1) via a node 528. The power supply voltage VCC4 of the amplifier 521F is supplied to the output terminal 521b of the amplifier 521F via the inductor 526F. A bias voltage VBB6 is supplied from the bias circuit 531 via the resistance element 524 to the base of the transistor 522 of the amplifier 521F.

The amplifier 501S is, for example, the same as the amplifier 501F, and when the amplified signal RF9, which has passed through the interstage matching network 2301S, is supplied to the input terminal 501a, the amplifier 501S outputs an amplified signal RF13, which is generated by amplification of the amplified signal RF9, from the output terminal 501b.

The input terminal 501a of the amplifier 501S is connected to a node 318S of the interstage matching network 2301S. The output terminal 501b of the amplifier 501S is connected to the first end of the capacitor 551 (refer to FIG. 1) via the node 527. The power supply voltage VCC4 of the amplifier 501S is supplied to the output terminal 501b of the amplifier 501S via the inductor 506S. The bias voltage VBB6 is supplied from the bias circuit 531 via the resistance element 504 to the base of the transistor 502 of the amplifier 501S.

The amplifier 521S is, for example, the same as the amplifier 521F, and when the amplified signal RF10, which has passed through the interstage matching network 2301S, is supplied to the input terminal 521a, the amplifier 521S outputs an amplified signal RF14, which is generated by amplification of the amplified signal RF10, from the output terminal 521b.

The input terminal 521a of the amplifier 521S is connected to a node 319S of the interstage matching network 2301S. The output terminal 521b of the amplifier 521S is connected to the second end of the capacitor 551 (refer to FIG. 1) via the node 528. The power supply voltage VCC4 of the amplifier 521S is supplied to the output terminal 521b of the amplifier 521S via the inductor 526S. The bias voltage VBB6 is supplied from the bias circuit 531 via the resistance element 524 to the base of the transistor 522 of the amplifier 521S.

Operational Effects

For example, if the output of the power amplification circuit 11 (refer to FIG. 1) is to be increased, the amplifier 501 and the amplifier 521 are configured so as to have smaller input impedances. Specifically, the impedances ZS501 and ZS521 of the power amplification circuit 11 are made smaller.

However, when the impedances ZS501 and ZS521 are small, the frequency range across which the impedances between the amplifiers 201 and 221 and the amplifiers 501 and 521 can be well matched by the interstage matching network 301 may become narrower.

On the other hand, in the power amplification circuit 21 illustrated in FIGS. 24 and 25, even if impedances ZS501F and ZS501S are made around twice as large as the impedance ZS501, and impedances ZS521F and ZS521S are made around twice as large as the impedance ZS521, the same output can be obtained as with the power amplification circuit 11 illustrated in FIG. 1.

Here, the impedance ZS501F is the impedance seen when looking at the output terminal 32 from the input terminal 501a of the amplifier 501F. The impedance ZS521F is the impedance seen when looking at the output terminal 32 from the input terminal 521a of the amplifier 521F. The impedance ZS501S is the impedance seen when looking at the output terminal 32 from the input terminal 501a of the amplifier 501S. The impedance ZS521S is the impedance seen when looking at the output terminal 32 from the input terminal 521a of the amplifier 521S.

In other words, with the configuration including the pairs 701S and 701F, the input impedance of each of the amplifiers 501F, 501S, 521F, and 521S can be increased when the output of the power amplification circuit 21 is to be made the same as that of the power amplification circuit 11 (refer to FIG. 1). This allows the impedances between the amplifiers 201 and 221 and the amplifiers 501F, 501S, 521F, and 521S to be well matched across a wide frequency range by the interstage matching networks 2301F and 2301S.

Layout

Figure 26:
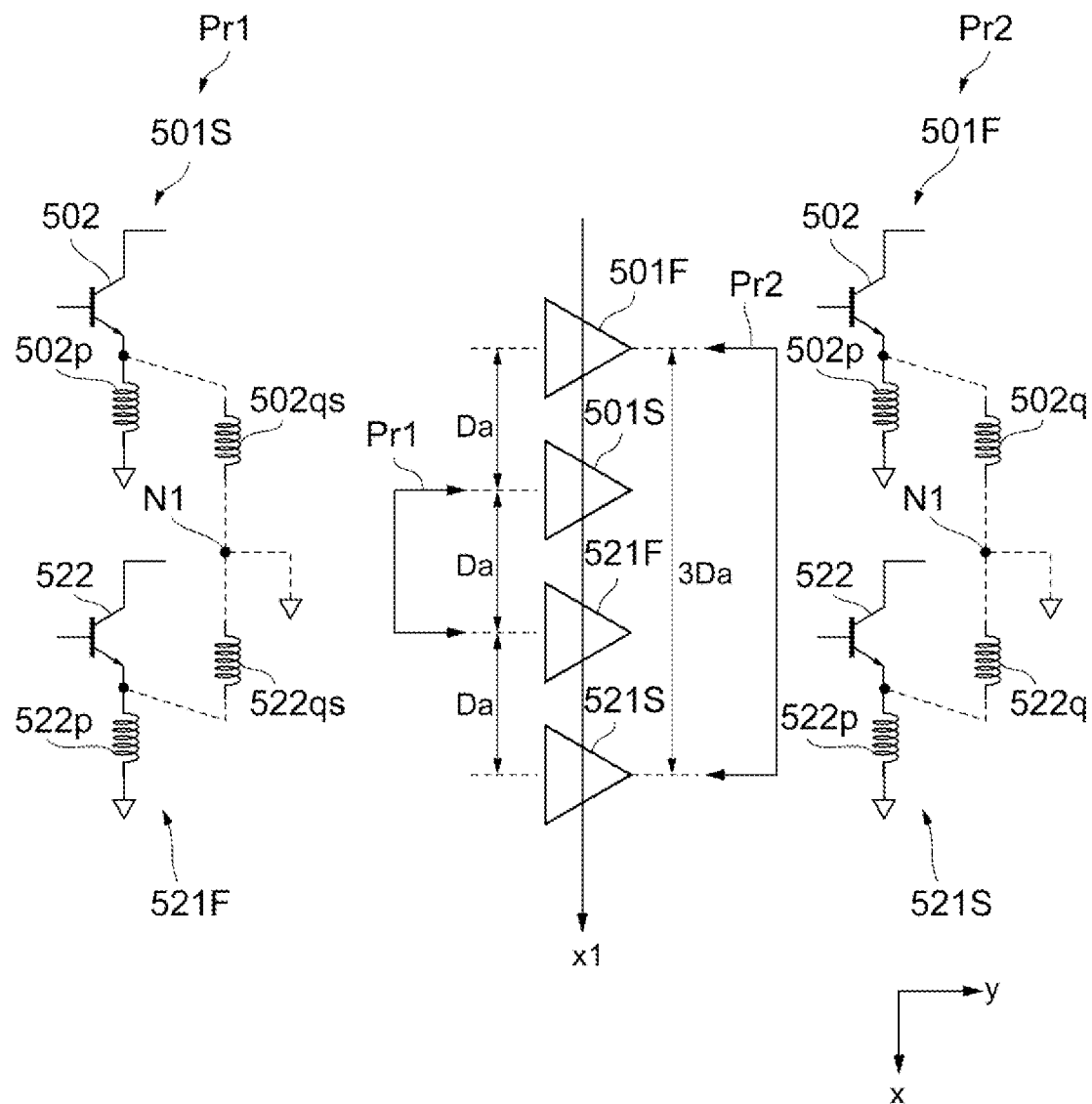
FIG. 26 is a diagram illustrating a First Example of the layout of power-stage amplifiers according to the Eleventh Embodiment of the present disclosure.

FIG. 26 is a diagram illustrating a First Example of the layout of power-stage amplifiers according to the Eleventh Embodiment of the present disclosure. As illustrated in FIG. 26, the amplifiers 501F, 501S, 521F, and 521S are provided on a plane of the semiconductor device 1 that is substantially parallel to the xy plane (for example, plane P1 or P2).

In FIG. 26, the amplifiers 501F, 501S, 521F, and 521S are provided in this order with, for example, a uniform spacing therebetween along an x1 axis that is substantially parallel to the x axis. Here, the distance between the amplifiers is Da. Although the emitters of the transistors of the amplifiers 501F, 501S, 521F and 521S are ideally grounded without going through parasitic inductors (refer to FIG. 24), in reality, these emitters are grounded through parasitic inductors.

Specifically, as illustrated in the equivalent circuits of the amplifiers, the emitters of the transistors 502 of the amplifier 501F and the amplifier 501S are, for example, grounded through parasitic inductors 502p. The emitters of the transistors 522 of the amplifier 521S and the amplifier 521F are, for example, grounded through parasitic inductors 522p having substantially the same inductances as the parasitic inductors 502p.

Focusing on a differential pair Pr1 consisting of the amplifiers 501S and 521F, the emitter of the transistor 502 of the amplifier 501S is connected to a ground node N1, which is connected to a virtual ground, via a parasitic inductor 502qs. The emitter of the transistor 522 of the amplifier 521F is connected to the ground node N1 via a parasitic inductor 522qs.

In the differential pair Pr1, since the distance Da between the amplifier 501S and the amplifier 521F is small, the inductances of the parasitic inductors 502qs and 522qs are sufficiently small. In other words, the parasitic inductances at the emitter of the transistor 502 of the amplifier 501S and the emitter of the transistor 522 of amplifier 521F are reduced.

On the other hand, focusing on a differential pair Pr2 consisting of the amplifiers 501F and 521S, the emitter of the transistor 502 of the amplifier 501F is connected to the ground node N1 via a parasitic inductor 502q. The emitter of the transistor 522 of the amplifier 521S is connected to the ground node N1 via a parasitic inductor 522q.

In the differential pair Pr2, the distance between the amplifier 501F and the amplifier 521S is 3 Da, which is 3×Da, and therefore, the inductances of the parasitic inductors 502q and 522q are, for example, larger than the inductances of the parasitic inductors 502qs and 522qs. Therefore, in the differential pair Pr2, the effect of increased gain and output resulting from two differential pairs being provided in the power stage may be weakened by the large inductances of the parasitic inductors 502q and 522q.

Figure 27:
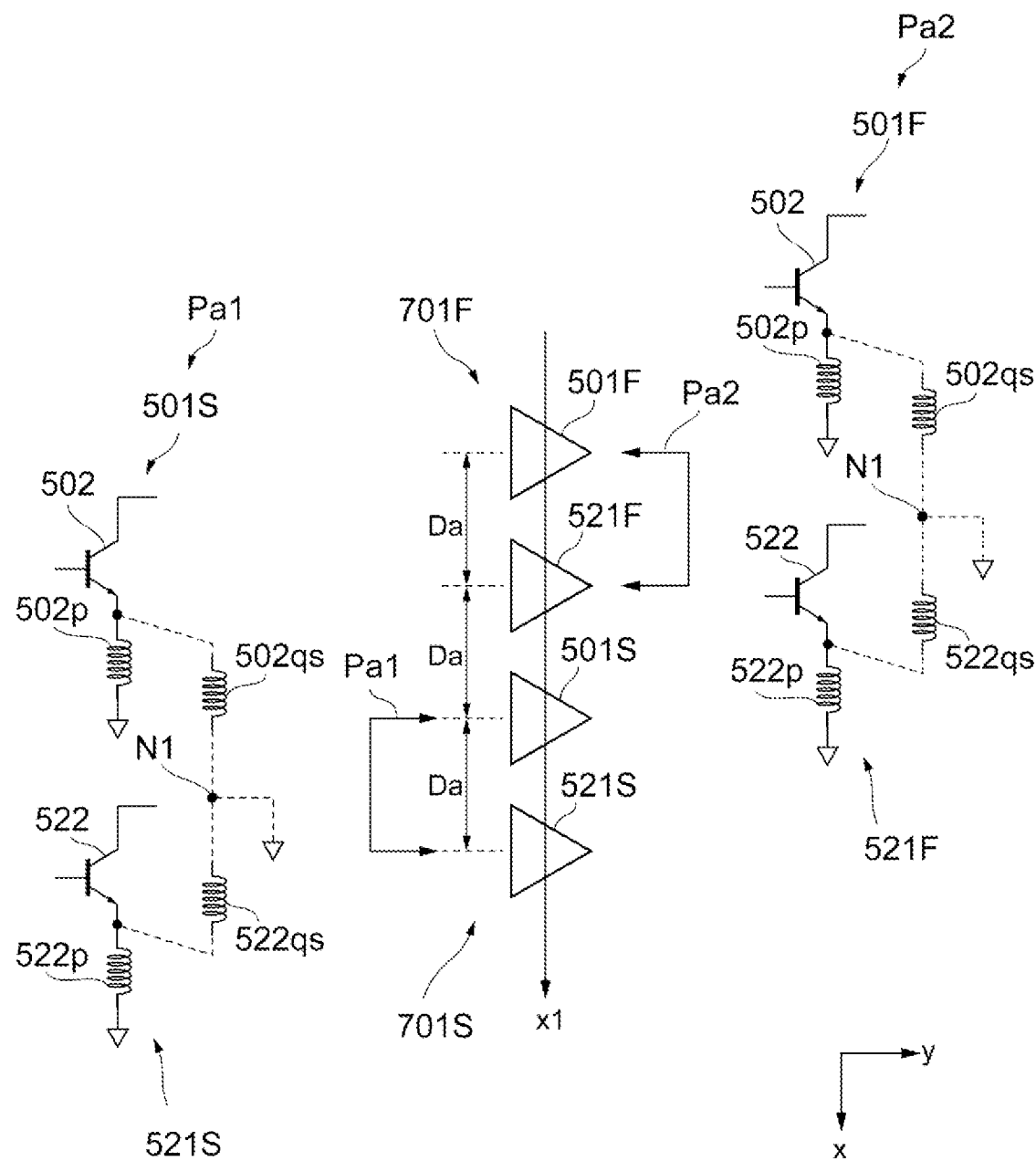
FIG. 27 is a diagram illustrating a Second Example of the layout of power-stage amplifiers according to the Eleventh Embodiment of the present disclosure.

FIG. 27 is a diagram illustrating an example of the layout of power-stage amplifiers according to the Eleventh Embodiment of the present disclosure. As illustrated in FIG. 27, the amplifiers 501F, 521F, 501S, and 521S are provided on a plane of the semiconductor device 1 that is substantially parallel to the xy plane (for example, plane P1 or P2).

In FIG. 27, the amplifiers 501F, 521F, 501S, and 521S are arrayed along the x1 axis in this order with a substantially uniform spacing therebetween, for example. Here, the distance between the amplifiers is Da. Although the emitters of the transistors of the amplifiers 501F, 521F, 501S, and 521S are ideally grounded without going through parasitic inductors (refer to FIG. 1), in reality, these emitters are grounded through parasitic inductors.

Specifically, the emitters of the transistors 502 of the amplifiers 501F and 501S are grounded via parasitic inductors 502p as with the case illustrated in FIG. 26. The emitters of the transistors 522 of the amplifiers 521F and 521S are grounded via parasitic inductors 522p as with the case illustrated in FIG. 26.

Focusing on a differential pair Pa1 consisting of the amplifiers 501S and 521F, the emitter of the transistor 502 of the amplifier 501S is connected to a ground node N1 via a parasitic inductor 502qs. The emitter of the transistor 522 of the amplifier 521F is connected to the ground node N1 via a parasitic inductor 522qs.

Focusing on a differential pair Pa2 consisting of the amplifiers 501F and 521F, the emitter of the transistor 502 of the amplifier 501F is connected to the ground node N1 via a parasitic inductor 502qs, as with the differential pair Pa1.

In addition, the emitter of the transistor 522 of the amplifier 521F is connected to the ground node N1 via a parasitic inductor 522qs.

Since the distance between the amplifiers is Da in both the differential pairs Pa1 and Pa2, the inductances of the parasitic inductors 502qs and 522qs are sufficiently small. In other words, the parasitic inductances at the emitters of the amplifiers 501F, 521F, 501S, and 521S are reduced. This allows the effect of the increased gain and output resulting from two differential pairs being provided in the power stage to be fully realized.

Furthermore, since the wirings between the interstage matching networks 2301F and 2301S and the amplifiers 501F, 521F, 501S, and 521S can be provided without the wirings crossing over each other, providing these wirings in a symmetrical manner can be simplified. This makes it possible to make the positive input/output characteristics and the negative input/output characteristics be more and more identical in terms of gain and phase, and therefore the power amplification circuit 21 can be brought closer to being an ideal differential amplification circuit and the deterioration of distortion characteristics can be suppressed.

Twelfth Embodiment

Figure 28:
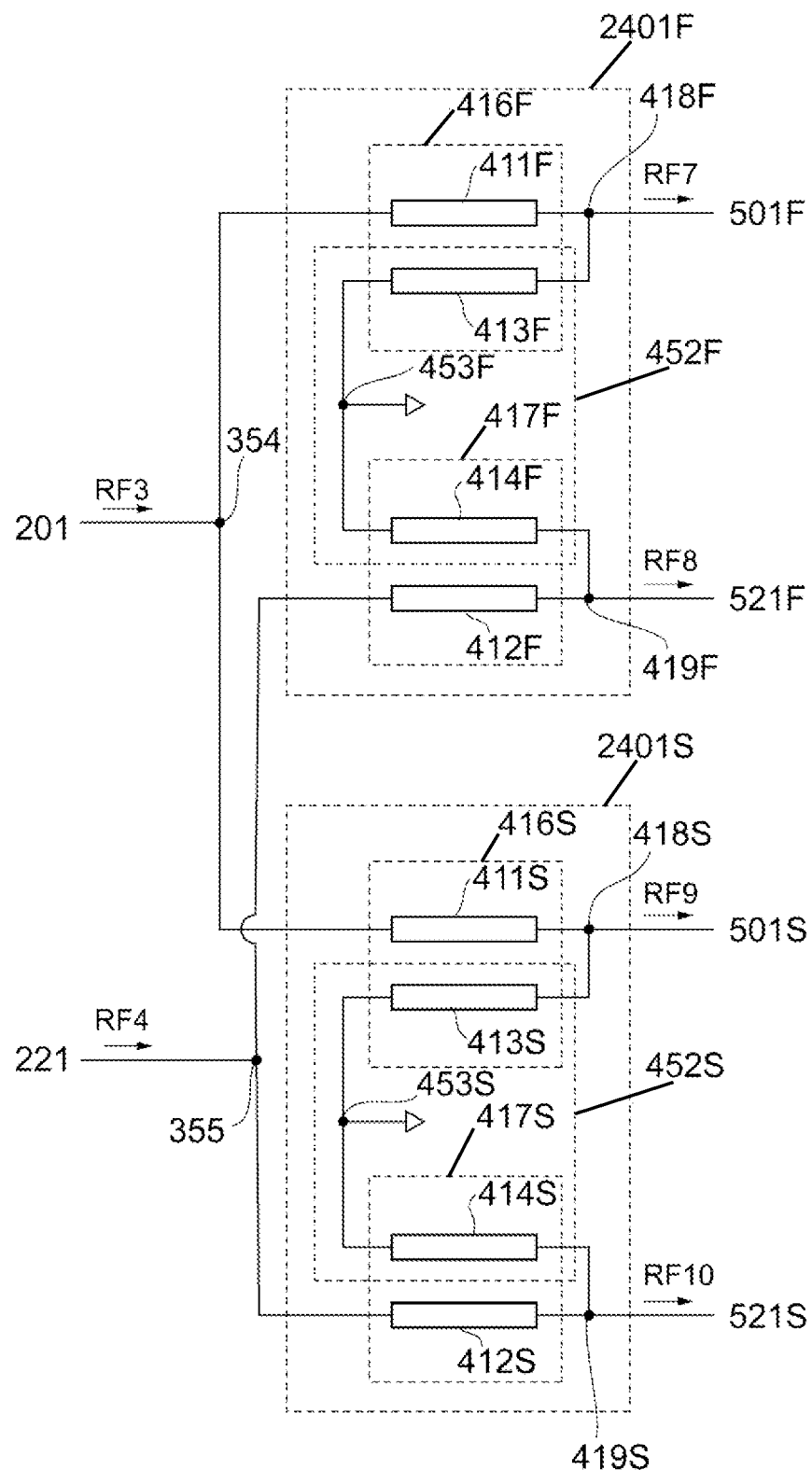
FIG. 28 is a circuit diagram of interstage matching networks according to a Twelfth Embodiment of the present disclosure.

An interstage matching network according to a Twelfth Embodiment will be described. FIG. 28 is a circuit diagram of interstage matching networks 2401F and 2401S according to the Twelfth Embodiment of the present disclosure. As illustrated in FIG. 28, the interstage matching networks 2401F and 2401S according to the Twelfth Embodiment differ from the interstage matching networks 2301F and 2301S according to the Eleventh Embodiment in that the interstage matching networks 2401F and 2401S are formed of transmission lines rather than windings.

The interstage matching network 2401F includes coupled lines 416F and 417F and supplies amplified signals RF7 and RF8 to the amplifiers 501F and 521F, respectively, when the amplified signals RF3 and RF4 are supplied thereto from the amplifiers 201 and 221.

In the coupled lines 416F of the interstage matching network 2401F, a transmission line 411F has a first end that is connected to the output terminal 201b of the amplifier 201 via a node 354 and a second end that is connected to a node 418F. A transmission line 413F has a first end that is connected to a ground node 453F (low impedance node) that is grounded and a second end that is connected to the node 418F, and is electromagnetically coupled to the winding 411F.

In the coupled lines 417F of the interstage matching network 2401F, a transmission line 412F has a first end that is connected to the output terminal 221b of the amplifier 221 via a node 355 and a second end that is connected to a node 419F. A transmission line 414F has a first end that is connected to the ground node 453F and a second end that is connected to the node 419F, and is electromagnetically coupled to the winding 412F.

The nodes 418F and 419F of the interstage matching network 2401F are respectively connected to the input terminal 501a of the amplifier 501F and the input terminal 521a of the amplifier 521F.

A current-induction wiring section 452F is formed by the ground node 453F and the transmission lines 413F and 414F.

The interstage matching network 2401S has the same configuration as the interstage matching network 2401F, and when the amplified signals RF3 and RF4 are supplied thereto from the amplifiers 201 and 221, the interstage matching network 2401S outputs amplified signals RF9 and RF10 to the amplifiers 501S and 521S, respectively.

Coupled lines 416S of the interstage matching network 2401S have the same configuration as the coupled lines 416F. In the coupled lines 416S, a first end of a transmission line 411S is connected to the output terminal 201b of the amplifier 201 via the node 354. Coupled lines 417S of the interstage matching network 2401S have the same configuration as the coupled lines 417F. In the coupled lines 417S, a first end of a transmission line 412S is connected to the output terminal 221b of the amplifier 221 via the node 355.

Nodes 418S and 419S of the interstage matching network 2401S are respectively connected to the input terminal 501a of the amplifier 501S and the input terminal 521a of the amplifier 521S.

Thirteenth Embodiment

Figure 29:
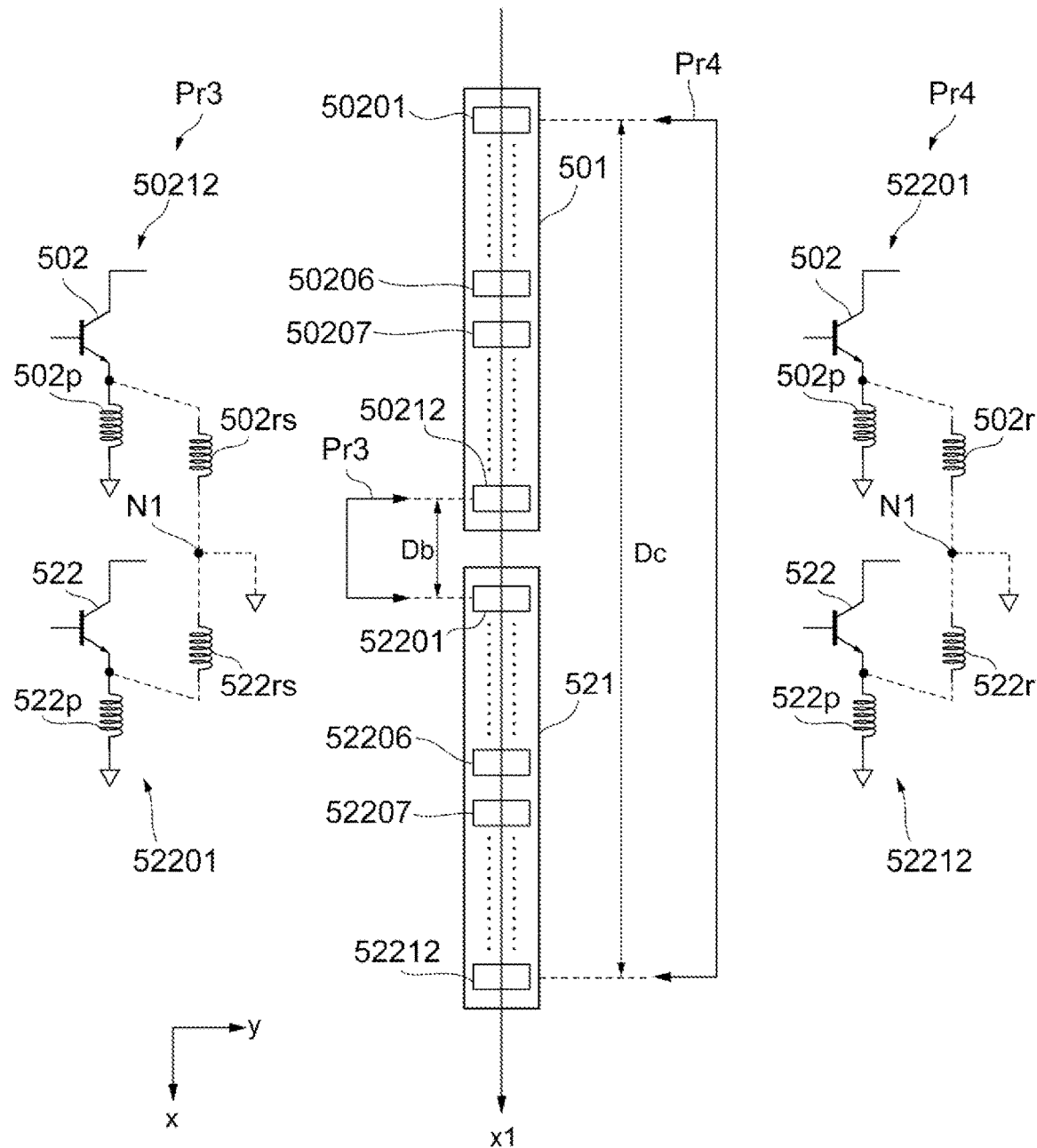
FIG. 29 is a diagram illustrating an example of the layout of power-stage amplifiers according to a Thirteenth Embodiment of the present disclosure.

A power-stage differential pair according to a Thirteenth Embodiment will be described. FIG. 29 is a diagram illustrating an example of the layout of power-stage amplifiers according to the Thirteenth Embodiment of the present disclosure. As illustrated in FIG. 29, amplifiers 501 and 521 according to the Thirteenth Embodiment differ from the amplifiers 501 and 521 according to the First Embodiment in that the amplifiers 501 and 521 according to the Thirteenth Embodiment include a plurality of transistor cells.

The amplifiers 501 and 521 are provided on a plane of the semiconductor device 1 that is substantially parallel to the xy plane (for example, plane P1 or P2). The amplifiers 501 and 521 are arrayed in this order along the x1 axis.

The amplifier 501 includes transistor cells 50201 to 50212. Each of the transistor cells 50201 to 50212 is a finger that includes, for example, the transistor 502, the capacitor 503, and the resistance element 504 (refer to FIG. 1). The transistor cells 50201 to 50212 are arrayed along the x1 axis in this order with substantially uniform spacing therebetween, for example. In other words, in the amplifier 501, the transistor cell 50201 is located furthest toward the negative side of the x1 axis, and the transistor cell 50212 is located furthest toward the positive side of the x1 axis.

The amplifier 521 includes transistor cells 52201 to 52212. Each of the transistor cells 52201 to 52212 is a finger that includes, for example, the transistor 522, the capacitor 523, and the resistance element 524 (refer to FIG. 1). The transistor cells 52201 to 52212 are arrayed along the x1 axis in this order with substantially uniform spacing therebetween, for example. In other words, in the amplifier 521, the transistor cell 52201 is located furthest toward the negative side of the x1 axis, and the transistor cell 52212 is located furthest toward the positive side of the x1 axis.

The distance between the transistor cell 50212 and the transistor cell 52201 is Db. The distance between the transistor cell 50201 and the transistor cell 52212 is Dc, which is larger than Db.

Although the emitters of the transistors of the transistor cells 50201 to 50212 and 52201 to 52212 are ideally grounded without going through parasitic inductors (refer to FIG. 1), in reality, these emitters are grounded through parasitic inductors.

Specifically, as illustrated in the equivalent circuits of the amplifiers, the emitters of the transistors 502 of the transistor cells 50201 to 50212 are, for example, grounded via parasitic inductors 502p, as with the case illustrated in FIG. 26. The emitters of the transistors 522 of the transistor cells 52201 to 52212 are, for example, grounded via parasitic inductors 522p, as with the case illustrated in FIG. 26.

Focusing on a differential pair Pr3 consisting of the transistor cells 50212 and 52201, the emitter of the transistor 502 of the transistor cell 50212 is connected to the ground node N1 via a parasitic inductor 502rs. The emitter of the transistor 522 of the transistor cell 52201 is connected to the ground node N1 via a parasitic inductor 522rs.

In the differential pair Pr3, since the distance Db between the transistor cells is small, the inductances of the parasitic inductors 502rs and 522rs are sufficiently small. In other words, the parasitic inductances at the emitter of the transistor 502 of the transistor cell 50212 and the emitter of the transistor 522 of the transistor cell 52201 are reduced.

Focusing on a differential pair Pr4 consisting of the transistor cells 50201 and 52212, the emitter of the transistor 502 of the transistor cell 50201 is connected to the ground node N1 via a parasitic inductor 502r. In addition, the emitter of the transistor 522 of the transistor cell 52212 is connected to the ground node N1 via a parasitic inductor 522r.

In the differential pair Pr4, since the distance Dc between the transistor cells is larger than the distance Db, the inductances of the parasitic inductors 502r and 522r are, for example, larger than the inductances of the parasitic inductor 502rs and 522rs. Therefore, in the differential pair Pr4, the effect of increased gain and output resulting from two differential pairs being provided in the power stage may be weakened by the large inductances of the parasitic inductors 502r and 522r.

Although a configuration has been described in which the number of transistor cells included in the amplifier 501 and the number of transistor cells included in the amplifier 521 are identical, the present disclosure is not limited to this configuration. The number of transistor cells included in the amplifier 501 and the number of transistor cells included in the amplifier 521 may be different from each other.

Fourteenth Embodiment

Figure 30:
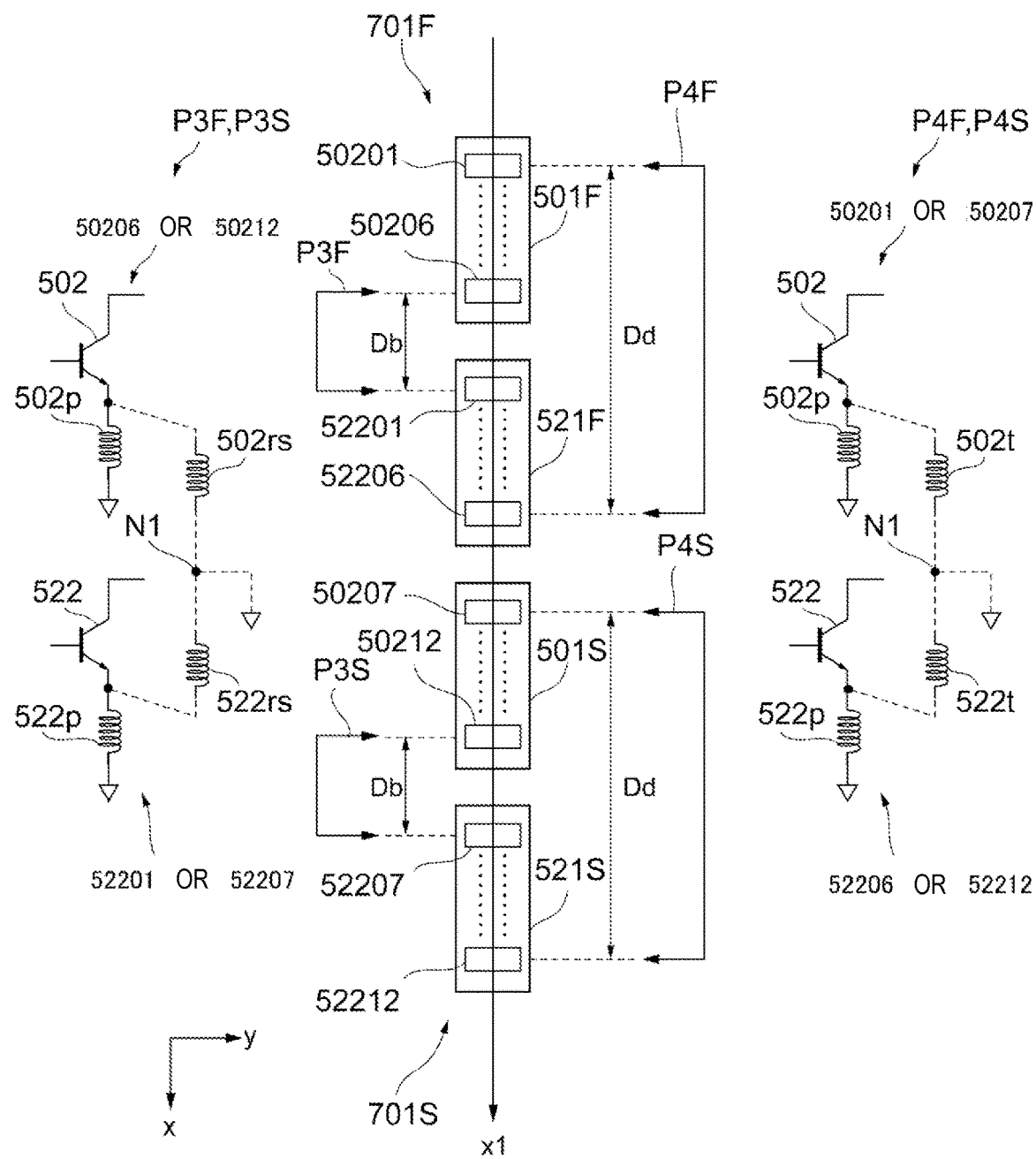
FIG. 30 is a diagram illustrating an example of the layout of power-stage amplifiers according to a Fourteenth Embodiment of the present disclosure.
Figure 31:
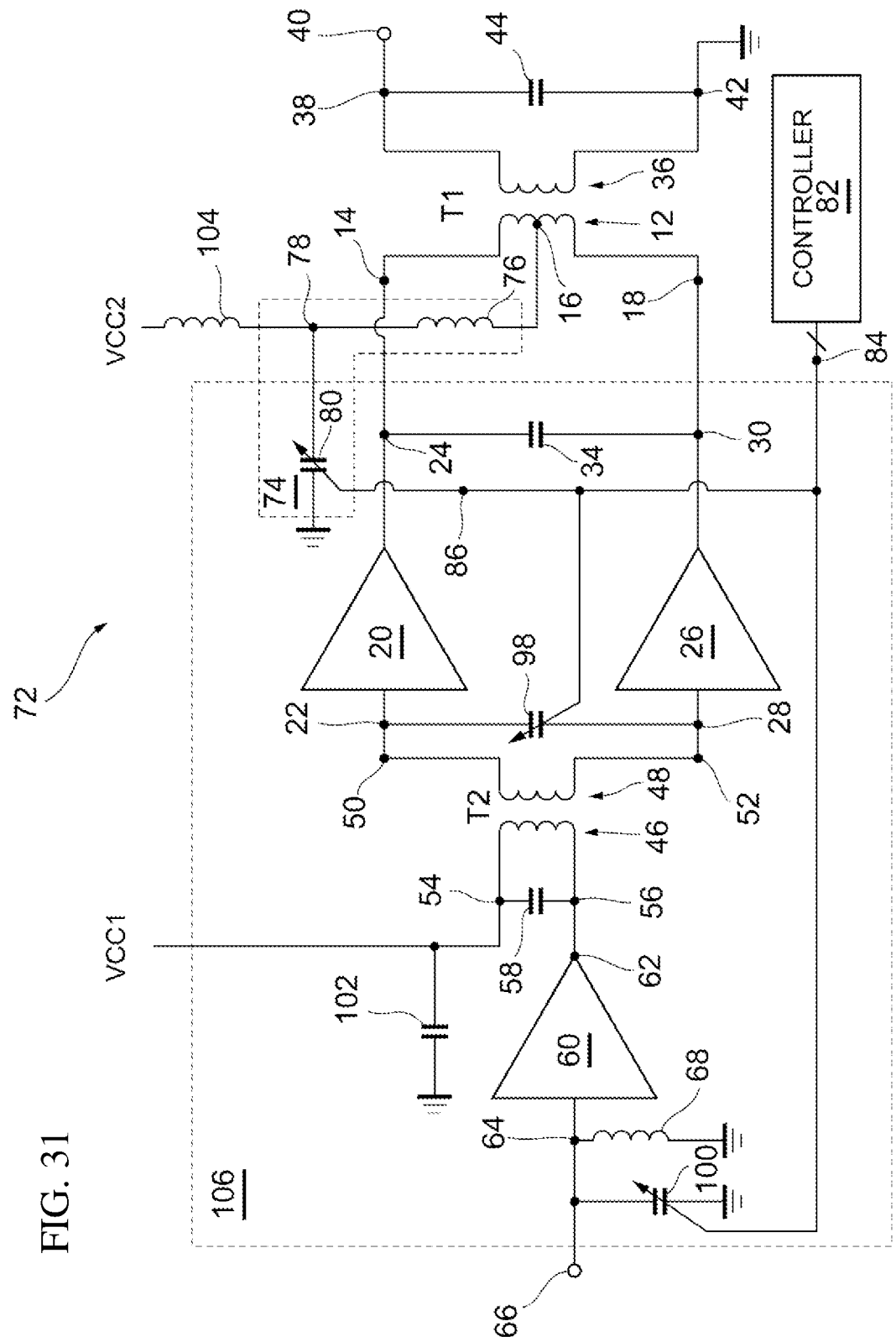
FIG. 31 is a diagram illustrating the general configuration of a differential amplification circuit.

A power-stage differential pair according to a Fourteenth Embodiment will be described. FIG. 30 is a diagram illustrating an example of the layout of power-stage amplifiers according to the Fourteenth Embodiment of the present disclosure. As illustrated in FIG. 30, the amplifiers 501F, 501S, 521F, and 521S according to the Fourteenth Embodiment differ from the amplifiers 501F, 501S, 521F, and 521S according to the Eleventh Embodiment in that the amplifiers 501F, 501S, 521F, and 521S according to the Fourteenth Embodiment include a plurality of transistor cells.

The amplifiers 501F, 501S, 521F, and 521S are provided on a plane of the semiconductor device 1 that is substantially parallel to the xy plane (for example, plane P1 or P2). The amplifiers 501F, 501S, 521F, and 521S are arrayed along the x1 axis as with the case illustrated in FIG. 27.

The amplifier 501F includes transistor cells 50201 to 50206. The amplifier 501S includes transistor cells 50207 to 50212. The transistor cells 50201 to 50212 have the same configuration as the transistor cells 50201 to 50212 of the amplifier 501 illustrated in FIG. 29.

The transistor cells 50201 to 50206 are arrayed along the x1 axis in this order with substantially uniform spacing therebetween, for example. In other words, in the amplifier 501F, the transistor cell 50201 is located furthest toward the negative side of the x1 axis, and the transistor cell 50206 is located furthest toward the positive side of the x1 axis.

The transistor cells 50207 to 50212 are arrayed along the x1 axis in this order with substantially uniform spacing therebetween, for example. In other words, in the amplifier 501S, the transistor cell 50207 is located furthest toward the negative side of the x1 axis, and the transistor cell 50212 is located furthest toward the positive side of the x1 axis.

The amplifier 521F includes transistor cells 52201 to 52206. The amplifier 521S includes transistor cells 52207 to 52212. The transistor cells 52201 to 52212 have the same configuration as the transistor cells 52201 to 52212 of the amplifier 521 illustrated in FIG. 29.

The transistor cells 52201 to 52206 are arrayed along the x1 axis in this order with substantially uniform spacing therebetween, for example. In other words, in the amplifier 521F, the transistor cell 52201 is located furthest toward the negative side of the x1 axis, and the transistor cell 52207 is located furthest toward the positive side of the x1 axis.

The transistor cells 52207 to 52212 are arrayed along the x1 axis in this order with substantially uniform spacing therebetween, for example. In other words, in the amplifier 521S, the transistor cell 52207 is located furthest toward the negative side of the x1 axis, and the transistor cell 52212 is located furthest toward the positive side of the x1 axis.

Here, the distance between the transistor cells 50206 and 52201 and the distance between the transistor cells 50212 and 52207 are, for example, Db, which is the same as the distance between the transistor cells 50212 and 52201 illustrated in FIG. 29. The distance between the transistor cells 50201 and 52206 and the distance between the transistor cells 52207 and 52212 are, for example, Dd, which is shorter than the distance Dc between the transistor cells 50201 and 52212 illustrated in FIG. 29.

The emitters of the transistors 502 of the transistor cells 50201 to 50212 are, for example, grounded via parasitic inductors 502p, as with the case illustrated in FIG. 29. The emitters of the transistors 522 of the transistor cells 52201 to 52212 are, for example, grounded via parasitic inductors 522p, as with the case illustrated in FIG. 29.

Focusing on a differential pair P3F consisting of the transistor cells 50206 and 52201, the distance between the transistor cells of the differential pair P3F is Db and therefore the differential pair P3F has the same configuration as the differential pair Pr3 illustrated in FIG. 29.

Specifically, the emitter of the transistor 502 of the transistor cell 50206 is connected to the ground node N1 via a parasitic inductor 502rs. The emitter of the transistor 522 of the transistor cell 52201 is connected to the ground node N1 via a parasitic inductor 522rs.

Similarly, focusing on a differential pair P3S consisting of the transistor cells 50212 and 52207, the differential pair P3S has the same configuration as the differential pair P3F.

Specifically, the emitter of the transistor 502 of the transistor cell 50212 is connected to the ground node N1 via a parasitic inductor 502rs. The emitter of the transistor 522 of the transistor cell 52207 is connected to the ground node N1 via a parasitic inductor 522rs.

On the other hand, focusing on a differential pair P4F consisting of the transistor cells 50201 and 52206, the emitter of the transistor 502 of the transistor cell 50201 is connected to the ground node N1 via a parasitic inductor 502t. The emitter of the transistor 522 of the transistor cell 52206 is connected to the ground node N1 via a parasitic inductor 522t.

Similarly, focusing on a differential pair P4S consisting of the transistor cells 50207 and 52212, the emitter of the transistor 502 of the transistor cell 50207 is connected to the ground node N1 via a parasitic inductor 502t. The emitter of the transistor 522 of the transistor cell 52212 is connected to the ground node N1 via a parasitic inductor 522t.

In the differential pairs P4F and P4S, since a distance Dd between the transistor cells is shorter than the distance Dc between the transistor cells in the differential pair Pr4, the inductance of the parasitic inductor 502t is smaller than the inductance of the parasitic inductor 502r. Similarly, the inductance of the parasitic inductor 522t is smaller than the inductance of the parasitic inductor 522r. In other words, in the differential pairs P4F and P4S, the parasitic inductances at the emitters of the transistors are reduced. This allows the effect of the increased gain and output resulting from a plurality of transistor cells being provided in each amplifier of the power stage to be fully realized.

Furthermore, since the wirings between the interstage matching networks 2301F and 2301S and the transistor cells of the amplifiers 501F, 521F, 501S, and 521S can be provided without crossing over each other, providing these wirings in a symmetrical manner can be simplified. This makes it possible to make the positive input/output characteristics and the negative input/output characteristics be more and more identical in terms of gain and phase, and therefore the power amplification circuit 21 can be brought closer to being an ideal differential amplification circuit and the deterioration of distortion characteristics can be suppressed.

A configuration has been described in which each of the amplifiers 501F, 521F, 501S, and 521S includes six transistor cells, but the amplifiers are not limited to this configuration. Each of the amplifiers 501F, 521F, 501S, and 521S may instead include 2 to 5 or 7 or more transistor cells.

Furthermore, a configuration has been described in which the same number of transistor cells are included in the amplifiers 501F, 521F, 501S, and 521S, but the amplifiers are not limited to this configuration. There may be different numbers of transistor cells included in the amplifiers 501F, 521F, 501S, and 521S.

Furthermore, a configuration has been described for the power amplification circuit 11 of this embodiment in which the interstage matching network 301 includes the capacitor 310, but the interstage matching network 301 does not have to include the capacitor 310. This also applies to the power amplification circuits 12, 13, 14, 15, 16, 17, and 18.

Furthermore, the power amplification circuit 21 of this embodiment has been described as including a first set consisting of the amplifiers 501F and 521F and the interstage matching network 2301F, and a second set consisting of the amplifiers 501S and 521S and the interstage matching network 2301S, but the power amplification circuit 21 is not limited to this configuration. The power amplification circuit 21 may include three or more sets each consisting of the amplifiers 501F and 521F and the interstage matching network 2301F.

Exemplary embodiments of the present disclosure have been described above. A power amplification circuit includes: the amplifier 201 that is inputted with the signal RF1, which is split from the input signal RFin, and that has the output terminal 201b that outputs the amplified signal RF3 obtained by amplifying the signal RF1; the amplifier 221 that is inputted with the signal RF2, which is split from the input signal RFin and has a different phase from the signal RF1, and that has the output terminal 221b that outputs the amplified signal RF4 obtained by amplifying the signal RF2; the amplifier 501 that has the input terminal 501a to which the amplified signal RF3 is inputted and that amplifies the amplified signal RF3 and outputs the amplified signal RF5; the amplifier 521 that has the input terminal 521a to which the amplified signal RF4 is inputted and that amplifies the amplified signal RF4 and outputs the amplified signal RF6; and an interstage matching network that allows the amplified signals RF3 and RF4 to pass between the amplifiers 201 and 221 and the amplifiers 501 and 521. The interstage matching network includes a first wiring having a first end that is connected to the output terminal 201b of the amplifier 201 and a second end that is connected to the input terminal 501a of the amplifier 501, a second wiring having a first end that is connected to the output terminal 221b of the amplifier 221 and a second end that is connected to the input terminal 521a of the amplifier 521, and a current-induction wiring section. The current-induction wiring section includes a low impedance node, a third wiring that is connected to the low impedance node and is electromagnetically coupled to the first wiring, and a fourth wiring that is connected to the low impedance node and is electromagnetically coupled to the second wiring, and the current-induction wiring section is connected between the second end of the first wiring and the second end of the second wiring.

With this configuration, the impedance ZL201 seen when looking at the amplifier 501 from the output terminal 201b of the amplifier 201 can be adjusted to an impedance corresponding to the output load impedance of the amplifier 201 by appropriately setting the mutual inductance of the transformers 316 and 317 or the mutual inductance of the coupled lines 416 and 417 and changing the ratio between the size of the current I1 flowing from the first end to the second end of the first wiring and the size of the current induced in the third wiring and the ratio of the size of the current I4 flowing from the second end to the first end of the second wiring and the size of the current induced in the fourth wiring. This enables the impedance between the differential pairs to be matched. In addition, for example, in the case where the inductances of the first wiring, the second wiring, the third wiring, and the fourth wiring are large, the first wiring, the second wiring, the third wiring, and the fourth wiring are able to match the impedance between the differential pairs across a wide frequency range. Therefore, a power amplification circuit and a semiconductor device can be provided that amplify signals over a wide frequency range while suppressing the power loss in a configuration in which an interstage matching network is provided between input-side amplifiers and output-side amplifiers.

In addition, in the power amplification circuits 11, 12, 13, 14, 15, 16, 17, and 18, the low impedance node is connected to the second end of the first wiring via the third wiring and is connected to the second end of the second wiring via the fourth wiring.

With this configuration, Ruthroff-type interstage matching networks 301 and 401 can be realized in which a combined current (I1+I2) made up of the current I1 flowing from the first end to the second end of the first wiring and the current I2 induced in the third wiring is supplied to the amplifier 501, and a current (I3+I4) supplied from the amplifier 521 is split into the current I4 flowing from the second end to the first end of the second wiring and the current I3 induced in the fourth wiring. In addition, the first wiring, the second wiring, the third wiring, and the fourth wiring can be provided without having any cross over parts on the side near the power-stage differential pair in the Ruthroff-type interstage matching networks 301 and 401. As a result, providing wiring from the interstage matching network 301 or 401 to the power-stage differential pair in a symmetrical manner can be simplified, and therefore a well-balanced differential amplification circuit in which positive-side input/output characteristics and negative-side input/output characteristics are balanced with each other can be realized.

In addition, in the power amplification circuits 19 and 20, the low impedance node is connected to the second end of the second wiring via the third wiring and is connected to the second end of the first wiring via the fourth wiring.

With this configuration, Guanella-type interstage matching networks 1301 and 1401 can be realized in which a combined current (I1+I2) made up of the current I1 flowing from the first end to the second end of the first wiring and the current I2 induced in the fourth wiring is supplied to the amplifier 501, and a current (I3+I4) supplied from the amplifier 521 is split into the current I4 flowing from the second end to the first end of the second wiring and the current I3 induced in the third wiring.

Furthermore, the power amplification circuit 21 includes a first set consisting of the amplifiers 501F and 521F and the interstage matching network 2301F, and a second set consisting of the amplifiers 501S and 521S and the interstage matching network 2301S.

With this configuration, for example, when the output of the power amplification circuit 21 is to be made substantially the same as the output of the power amplification circuit 11 including the amplifiers 501 and 521 and the interstage matching network 301 or 401, the input impedances of the amplifiers 501F, 501S, 521F, and 521S can be increased. This allows the impedances between the amplifiers 201 and 221 and the amplifiers 501F, 501S, 521F, and 521S to be well matched across a wide frequency range by the interstage matching networks 2301F and 2301S.

In addition, in the power amplification circuits 11, 12, 13, 14, 15, 16, 17, 18, 19, 20, and 21, the amplifiers 501, 501F, and 501S include a plurality of transistors 502.

With this configuration, for example, the input impedances of the amplifiers 501, 501F, and 501S can be reduced by providing the plurality of transistors 502 in parallel, and therefore the output of the power amplification circuits can be increased.

In addition, in the power amplification circuits 11, 12, 13, 14, 15, 16, 17, 18, 19, 20, and 21, the amplifiers 521, 521F, and 521S include a plurality of transistors 522.

With this configuration, for example, the input impedances of the amplifiers 521, 521F, and 521S can be reduced by providing the plurality of transistors 522 in parallel, and therefore the output of the power amplification circuits can be increased.

Furthermore, in the power amplification circuits 11, 12, 13, 14, 15, 16, 17, and 18, the interstage matching networks 301, 302, 303, 304, 401, 402, 403, and 404 further include the capacitor 310 having a first end that is connected to the output terminal 201b of the amplifier 201 and a second end that is connected to the output terminal 221b of the amplifier 221.

With this configuration, for example, in the case where the inductances of the first wiring, the second wiring, the third wiring, and the fourth wiring are small and the frequency range across which the impedance between the differential pairs can be well matched using just the first wiring, the second wiring, the third wiring, and the fourth wiring is narrow, the frequency range can be widened using the capacitor 310.

Furthermore, in the power amplification circuits 13 and 14, the interstage matching networks 302 and 402 further include the winding 321 having a first end and a second end and the winding 322 having a first end and a second end. The second end of the first wiring and the first end of the second wiring are connected to the first end of the winding 321, and the second end of the winding 321 is connected to the input terminal 501a of the amplifier 501. The second end of the third wiring and the first end of the fourth wiring are connected to the first end of the winding 322, and the second end of the winding 322 is connected to the input terminal 521a of the amplifier 521.

With this configuration, since it is possible to increase the number of stages in the interstage matching networks, the number of constants that may be changed when designing the interstage matching networks 302 and 402 can be increased. This enables easy adjustment of the interstage matching networks 302 and 402.

Furthermore, in the power amplification circuits 15 and 16, the interstage matching networks 303 and 403 further include the capacitor 331 having a first end that is connected to the input terminal 501a of the amplifier 501 and a second end that is connected to the input terminal 521a of the amplifier 521.

With this configuration, since it is possible to increase the number of stages in the interstage matching networks, the number of constants that may be changed when designing the interstage matching networks 303 and 403 can be increased. This enables easy adjustment of the interstage matching networks 303 and 403.

Furthermore, in the power amplification circuits 17 and 18, the interstage matching networks 304 and 404 further include the winding 341 having a first end that is connected to the input terminal 501a of the amplifier 501 and a second end that is connected to the input terminal 521a of the amplifier 521.

With this configuration, it is possible to increase the number of stages in the interstage matching networks and therefore the number of constants that may be changed when designing the interstage matching networks 304 and 404 can be increased. This enables easy adjustment of the interstage matching networks 304 and 404.

In addition, in the power amplification circuits 11, 13, 15, and 17, the first wiring, the second wiring, the third wiring, and the fourth wiring are the windings 311, 312, 313, and 314, respectively.

With this configuration, the first wiring, the second wiring, the third wiring, and the fourth wiring can be reduced in size by reducing their wiring widths and large inductances can be secured.

In addition, in the power amplification circuits 12, 14, 16, and 18, the first wiring, the second wiring, the third wiring, and the fourth wiring are the transmission lines 411, 412, 413, and 414, respectively.

With this configuration, the impedance between differential pairs can be adjusted across a wider frequency range.

Furthermore, in the semiconductor device 1, the current-induction wiring sections 351 and 1351 are formed along the plane P1. When the plane P1 is viewed in plan view, the windings 313 and 314 respectively include curved parts that curve away from each other.

Thus, the windings 313 and 314 can be formed in a compact manner by using a configuration in which the current-induction wiring sections 351 and 1351 are formed on the plane P1. Furthermore, magnetic fields can be efficiently generated by the windings 313 and 314 by using a configuration in which the windings 313 and 314 have curved parts as described above. In other words, the transformers 316 and 317, in which there is good electromagnetic coupling between the windings, can be formed in a compact size in the interstage matching network 301 and the interstage matching network 1301.

Furthermore, in the semiconductor device 1, the winding 313 is connected between the node 318, which is connected to the second end of the winding 311 and the input terminal 501a of the amplifier 501, and the low impedance node. The winding 314 is connected between the node 319, which is connected to the second end of the winding 312 and the input terminal 521a of the amplifier 521, and the low impedance node. When the plane P1 is viewed in plan view, the line La that passes through the midpoint MP between the node 318 and the node 319, and the low impedance node does not intersect the winding 313 or 314 except for at the low impedance node.

With this configuration, the windings 313 and 314 can be disposed in a symmetrical or close to symmetrical manner, and therefore a situation in which the positive-side input/output characteristics and the negative-side input/output characteristics are unbalanced, resulting in the differential amplification circuit being unbalanced can be suppressed.

Furthermore, in the semiconductor device 1, when the plane P1 is viewed in plan view, the windings 313 and 314 are substantially symmetrical with respect to the line La.

With this configuration, it is possible to simplify providing the windings 311 and 312 in a substantially symmetrical manner and providing wirings from the interstage matching network 301 to the power stage differential pair in a substantially symmetrical manner. In other words, providing wirings from the driver-stage differential pair to the power-stage differential pair in a substantially symmetrical manner can be simplified. This makes it possible to realize a well-balanced differential amplification circuit in which the positive-side input/output characteristics and the negative input/output characteristics are balanced.

Furthermore, in the semiconductor device 1, the winding 313 is connected between the node 319, which is connected to the second end of the winding 312 and the input terminal 521a of the amplifier 521, and the low impedance node. The winding 314 is connected between the node 318, which is connected to the second end of the winding 311 and the input terminal 501a of the amplifier 501, and the low impedance node. When the plane P1 is viewed in plan view, the lines Lb, Lc, and Ld that pass through the midpoint MP between the node 318 and the node 319, and the low impedance node intersect the windings 313 and 314 at points other than at the low impedance node.

With this configuration, it is possible to realize the arrangement of the windings 313 and 314 of the Guanella-type interstage matching networks 1301 and 1401.

Furthermore, in the semiconductor device 1, the amplifiers 501F and 521F of the set 701F and the amplifiers 501S and 521S of the set 701S are provided in this order along the x1 axis.

According to this configuration, it is possible to easily realize a configuration in which wirings from the interstage matching network 2301F to the amplifiers 501F and 521F and wirings from the interstage matching network 2301S to the amplifiers 501S and 521S are provided in a substantially symmetrical manner with substantially the same lengths without having parts that cross over each other.

The purpose of the embodiments described above is to enable easy understanding of the present disclosure and the embodiments are not to be interpreted as limiting the present disclosure. The present disclosure can be modified or improved without departing from the gist of the disclosure and equivalents to the present disclosure are also included in the present disclosure. In other words, appropriate design changes made to the embodiments by one skilled in the art are included in the scope of the present disclosure so long as the changes have the characteristics of the present disclosure. For example, the elements included in the embodiments and the arrangements, materials, conditions, shapes, sizes and so forth of the elements are not limited to those exemplified in the embodiments and can be changed as appropriate. In addition, each embodiment is merely an illustrative example and it goes without saying that parts of the configurations illustrated in different embodiments can be substituted for each other or combined with each other and these new configurations are also included in the scope of the present disclosure so long as the configurations have the characteristics of the present disclosure. While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification circuit comprising:
   a first amplifier that is input with a first signal and that is configured to output a first amplified signal from an output terminal of the first amplifier, the first signal being split from an input signal, and the first amplified signal being obtained by amplifying the first signal;
   a second amplifier that is input with a second signal and that is configured to output a second amplified signal from an output terminal of the second amplifier, the second signal being split from the input signal and having a different phase than the first signal, and the second amplified signal being obtained by amplifying the second signal;
   a third amplifier comprising an input terminal to which the first amplified signal is input, and that is configured to amplify the first amplified signal and to output a third amplified signal;
   a fourth amplifier comprising an input terminal to which the second amplified signal is input, and that is configured to amplify the second amplified signal and to output a fourth amplified signal; and
   a matching network configured to pass the first amplified signal and the second amplified signal between the first and second amplifiers and the third and fourth amplifiers,
   wherein the matching network comprises:
      a first wiring having a first end connected to the output terminal of the first amplifier and a second end connected to the input terminal of the third amplifier;
      a second wiring having a first end connected to the output terminal of the second amplifier and a second end connected to the input terminal of the fourth amplifier; and
      a current-induction wiring section,
   wherein the current-induction wiring section comprises a low impedance node, a third wiring that is connected to the low impedance node and that is electromagnetically coupled to the first wiring, and a fourth wiring that is connected to the low impedance node and that is electromagnetically coupled to the second wiring, and
   wherein the current-induction wiring section is connected between the second end of the first wiring and the second end of the second wiring.

2. The power amplification circuit according to claim 1, wherein the low impedance node is connected to the second end of the first wiring via the third wiring, and is connected to the second end of the second wiring via the fourth wiring.

3. The power amplification circuit according to claim 1, wherein the low impedance node is connected to the second end of the second wiring via the third wiring, and is connected to the second end of the first wiring via the fourth wiring.

4. The power amplification circuit according to claim 1, comprising:
   at least two sets of the third amplifier, the fourth amplifier, and the matching network.

5. The power amplification circuit according to claim 1, wherein the third amplifier comprises a plurality of amplifying elements.

6. The power amplification circuit according to claim 1, wherein the fourth amplifier comprises a plurality of amplifying elements.

7. The power amplification circuit according to claim 1, wherein the matching network further comprises a first capacitor having a first end connected to the output terminal of the first amplifier, and a second end connected to the output terminal of the second amplifier.

8. The power amplification circuit according to claim 1,
   wherein the matching network further comprises a first inductor and a second inductor,
   wherein the second end of the first wiring is connected to a first end of the first inductor,
   wherein a second end of the first inductor is connected to the input terminal of the third amplifier,
   wherein the second end of the third wiring is connected to a first end of the second inductor, and
   wherein a second end of the second inductor is connected to the input terminal of the fourth amplifier.

9. The power amplification circuit according to claim 1, wherein the matching network further comprises a second capacitor having a first end connected to the input terminal of the third amplifier, and a second end connected to the input terminal of the fourth amplifier.

10. The power amplification circuit according to claim 1, wherein the matching network further comprises a third inductor having a first end connected to the input terminal of the third amplifier, and a second end connected to the input terminal of the fourth amplifier.

11. The power amplification circuit according to claim 1, wherein the first wiring, the second wiring, the third wiring, and the fourth wiring are windings.

12. The power amplification circuit according to claim 1, wherein the first wiring, the second wiring, the third wiring, and the fourth wiring are transmission lines.

13. A semiconductor device comprising:
   the power amplification circuit according to claim 1,
   wherein the current-induction wiring section is on a plane, and
   wherein when the plane is viewed in plan view, the third wiring and the fourth wiring include portions that curve away from each other.

14. The semiconductor device according to claim 13,
   wherein the third wiring is connected between the low impedance node and a first node, the first node being connected to the second end of the first wiring and to the input terminal of the third amplifier,
   wherein the fourth wiring is connected between the low impedance node and a second node, the second node being connected to the second end of the second wiring and to the input terminal of the fourth amplifier, and
   wherein when the plane is viewed in plan view, a line that passes through the low impedance node and that passes through a midpoint between the first and second nodes only intersects the third wiring and the fourth wiring at the low impedance node.

15. The semiconductor device according to claim 14, wherein when the plane is viewed in plan view, the third wiring and the fourth wiring are substantially symmetrical with respect to the line.

16. The semiconductor device according to claim 13,
wherein the third wiring is connected between the low impedance node and a first node, the first node being connected to the second end of the second wiring and to the input terminal of the fourth amplifier,
wherein the fourth wiring is connected between the low impedance node and a second node, the second node being connected to the second end of the first wiring and to the input terminal of the third amplifier, and
wherein when the plane is viewed in plan view, a line that passes through the low impedance node and that passes through a midpoint between the first and second nodes intersects the third wiring and the fourth wiring at points other than the low impedance node.

17. The semiconductor device according to claim 14,
wherein the power amplification circuit comprises a first set and a second set of the third amplifier, the fourth amplifier, and the matching network, and
wherein, along a straight line, the fourth amplifier of the first set is adjacent to the third amplifier of the first set, the third amplifier of the second set is adjacent to the fourth amplifier of the first set, and the fourth amplifier of the second set is adjacent to the third amplifier of the second set.

* * * * *